(12) United States Patent
Song et al.

(10) Patent No.: US 9,799,607 B2
(45) Date of Patent: *Oct. 24, 2017

(54) SEMICONDUCTOR DEVICE AND METHOD OF MANUFACTURING THE SAME

(71) Applicant: Samsung Electronics Co., Ltd., Suwon-si (KR)

(72) Inventors: Hyun-Seung Song, Incheon (KR); Hyeonuk Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/358,217

(22) Filed: Nov. 22, 2016

(65) Prior Publication Data

US 2017/0077034 A1    Mar. 16, 2017

Related U.S. Application Data

(63) Continuation of application No. 14/625,015, filed on Feb. 18, 2015, now Pat. No. 9,536,835.

(30) Foreign Application Priority Data

Jul. 1, 2014  (KR) .................. 10-2014-0081959

(51) Int. Cl.
    *H01L 21/82*    (2006.01)
    *H01L 27/02*    (2006.01)
    (Continued)

(52) U.S. Cl.
    CPC .... *H01L 23/535* (2013.01); *H01L 21/823475* (2013.01); *H01L 21/823871* (2013.01);
    (Continued)

(58) Field of Classification Search
    CPC ............. H01L 2924/0002; H01L 29/41; H01L 29/417; H01L 29/4172; H01L 29/41725;
    (Continued)

(56) References Cited

U.S. PATENT DOCUMENTS 6,426,890 B1   7/2002  Jasinski et al.
8,183,114 B2   5/2012  Tsuboi et al.
(Continued)

FOREIGN PATENT DOCUMENTS

KR   2008082426   9/2008
KR   2010027392   3/2010

OTHER PUBLICATIONS

"Semiconductor Device and Method of Fabricating the Same" Specification, Drawings, and Prosecution History, of U.S. Appl. No. 14/625,015, filed Feb. 18, 2015, by Hyun-Seung Song, et al.

*Primary Examiner* — Monica D Harrison
(74) *Attorney, Agent, or Firm* — Onello & Mello, LLP.

(57) ABSTRACT

A semiconductor device includes a first gate electrode provided in a jumper region of a substrate and extending in a first direction, first source/drain regions provided at both sides of the first gate electrode, and a connecting contact electrically connecting the first gate electrode and the first source/drain regions to each other. The connecting contact includes first sub-contacts disposed at both sides of the first gate electrode and connected to the first source/drain regions, and a second sub-contact extending in a second direction intersecting the first direction. The second sub-contact is connected to the first sub-contacts and is in contact with a top surface of the first gate electrode. In the first direction, each of the first sub-contacts has a first width and the second sub-contact has a second width smaller than the first width.

20 Claims, 45 Drawing Sheets

(51) Int. Cl.
  *H01L 23/535* (2006.01)
  *H01L 27/088* (2006.01)
  *H01L 21/8234* (2006.01)
  *H01L 21/8238* (2006.01)
  *H01L 27/092* (2006.01)
  *H01L 29/417* (2006.01)

(52) U.S. Cl.
  CPC ........ *H01L 27/0207* (2013.01); *H01L 27/088* (2013.01); *H01L 27/092* (2013.01); *H01L 29/41725* (2013.01); *H01L 2924/0002* (2013.01)

(58) Field of Classification Search
  CPC ..... H01L 27/02; H01L 27/02; H01L 27/0207; H01L 27/08; H01L 27/088; H01L 27/09; H01L 27/092; H01L 23/53; H01L 23/535; H01L 21/82; H01L 21/823; H01L 21/8234; H01L 21/8238; H01L 21/82347; H01L 21/823475; H01L 21/82387; H01L 21/823871
  USPC .......................................................... 257/288
  See application file for complete search history.

(56) References Cited

U.S. PATENT DOCUMENTS

| | | |
|---|---|---|
| 8,207,594 B2 | 6/2012 | Shin et al. |
| 8,405,216 B2 | 3/2013 | Liaw |
| 8,441,076 B2 | 5/2013 | Otsuki et al. |
| 8,569,841 B2 | 10/2013 | Becker et al. |
| 8,799,844 B2 | 8/2014 | Cho et al. |
| 9,536,835 B2 * | 1/2017 | Song .................... H01L 27/088 |
| 2005/0275043 A1 | 12/2005 | Huang et al. |
| 2012/0098073 A1 * | 4/2012 | Yu ..................... H01L 21/76802 257/413 |
| 2012/0112819 A1 | 5/2012 | Greenberg et al. |
| 2013/0299905 A1 | 11/2013 | Lee |

* cited by examiner

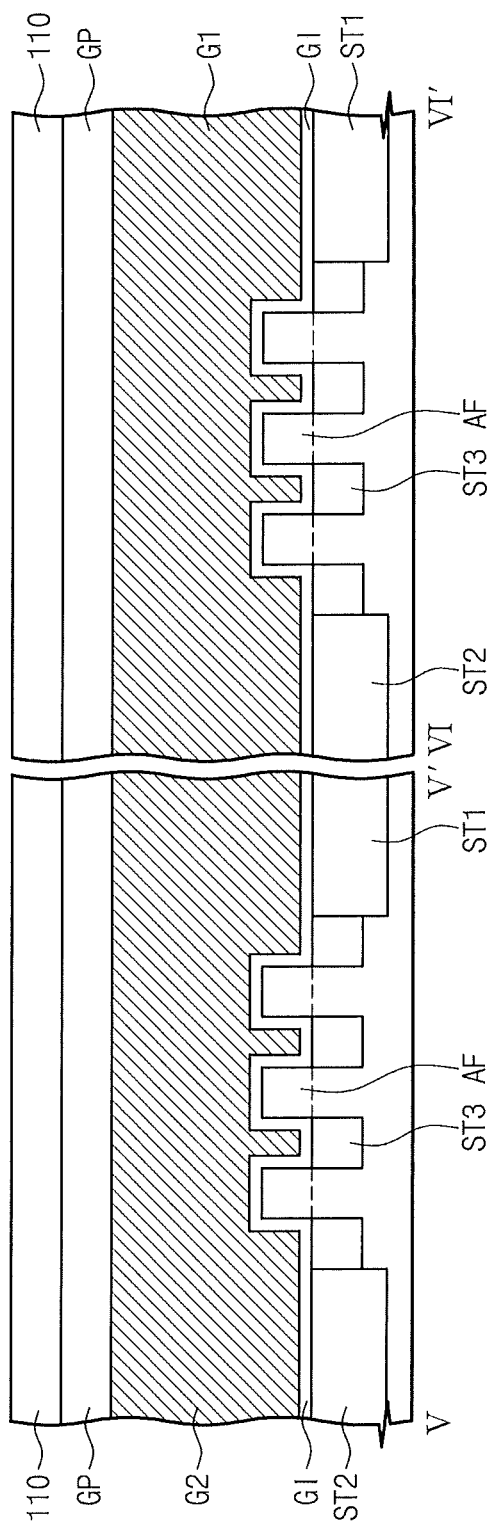

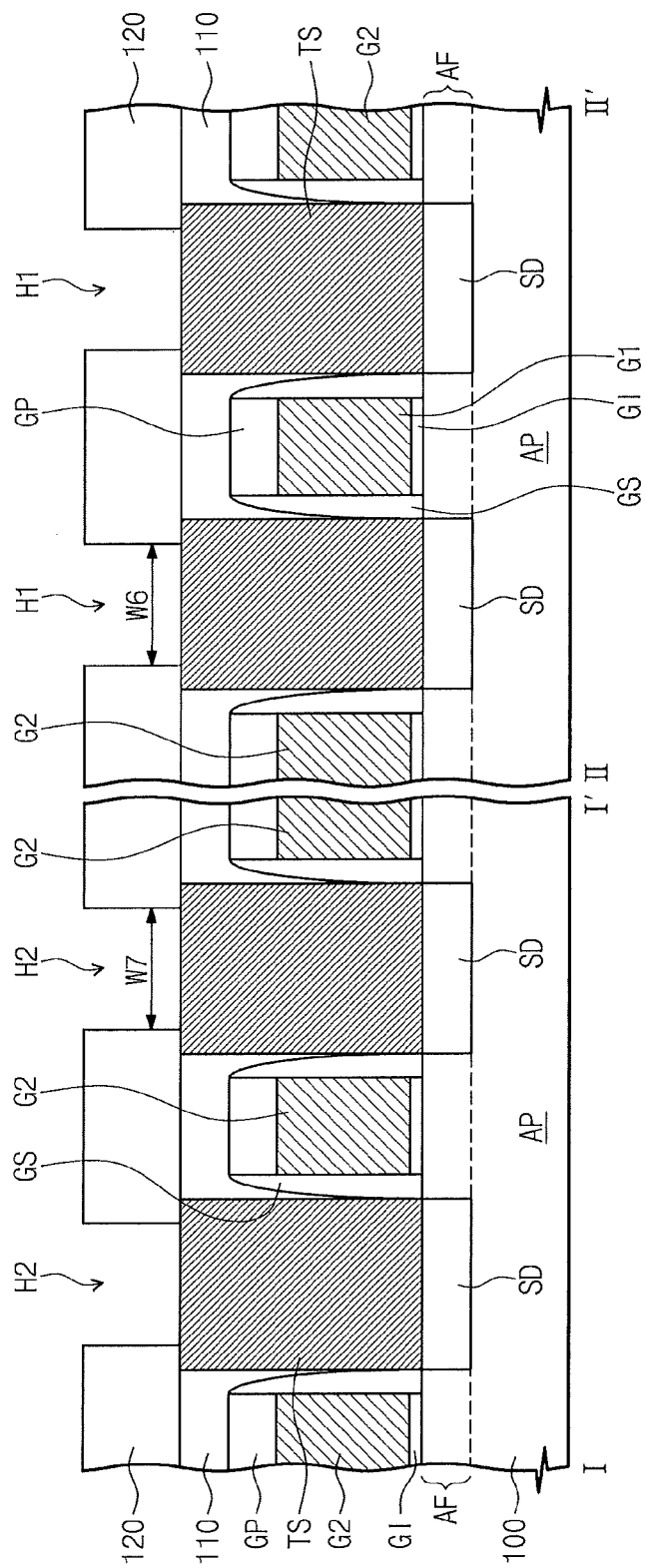

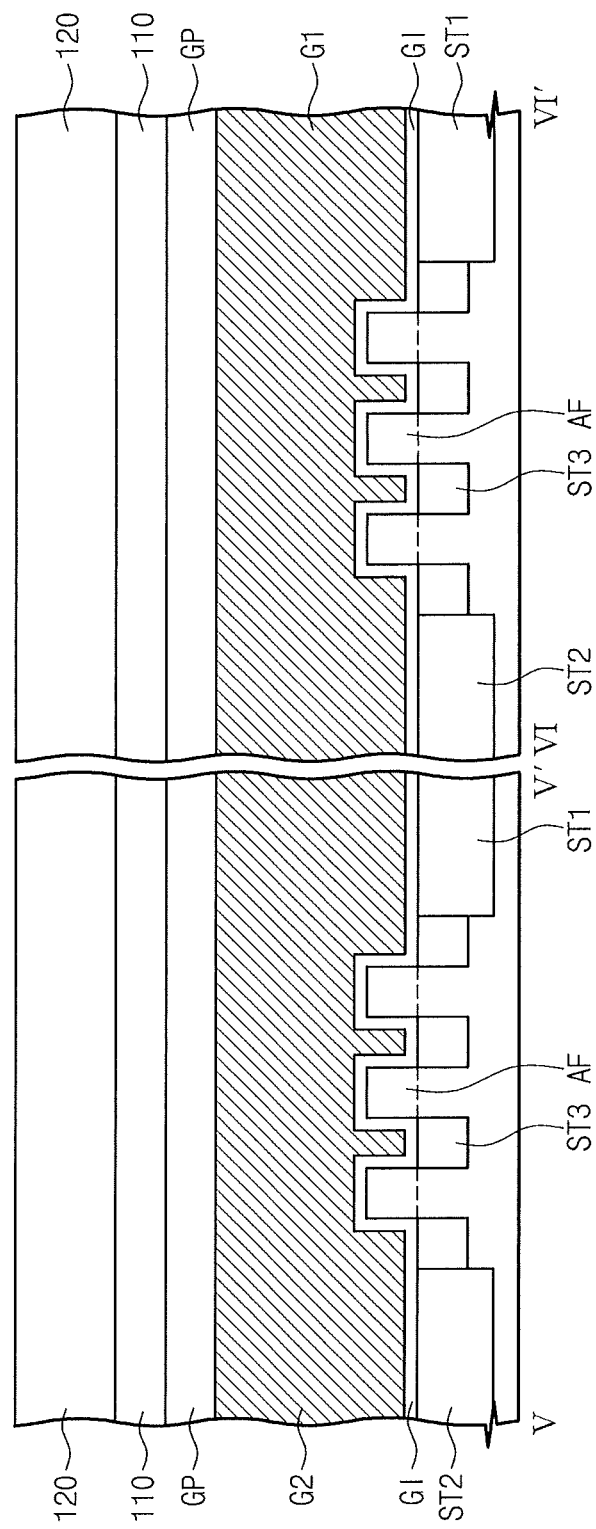

SEMICONDUCTOR DEVICE AND METHOD OF MANUFACTURING THE SAME

CROSS-REFERENCE TO RELATED APPLICATION

This U.S. Continuation patent application claims priority to U.S. Non-Provisional patent application Ser. No. 14/625,015, filed on Feb. 18, 2015, which claims priority to Korean Patent Application No. 10-2014-0081959, filed on Jul. 1, 2014, in the Korean Intellectual Property Office, and all the benefits accruing therefrom under 35 U.S.C. 119, the contents of which in its entirety are herein incorporated by reference.

BACKGROUND

The inventive concepts relate to semiconductor devices and methods of manufacturing the same and, more particularly, to semiconductor devices including a plurality of logic cells and methods of manufacturing the same.

Semiconductor devices are widely used in electronic-related technologies because of their small sizes, multi-functions, and low manufacturing costs. Semiconductor devices may be categorized as any one of semiconductor memory devices storing logical data, semiconductor logic devices processing logical data, and hybrid semiconductor devices having both the function of a semiconductor memory device and a function of the semiconductor logic device. There is an ongoing and increasing demand for semiconductor devices with improved characteristics, in particular, due to the continuing development of the electronic industry. For example, high-reliable, high-speed, and/or multi-functional semiconductor devices have been in increasing demand. To satisfy these demands, structures of semiconductor devices have been increasingly complex and highly integrated.

SUMMARY

Embodiments of the inventive concepts may provide semiconductor devices with excellent reliability and methods of manufacturing the same.

Embodiments of the inventive concepts may also provide semiconductor devices capable of being easily manufactured and methods of manufacturing the same.

In one aspect, a semiconductor device may include: a substrate including a circuit region and a jumper region; a first gate electrode at the jumper region of the substrate, the first electrode extending in a first direction; a first source/drain region at each side of the first gate electrode; and a connecting contact that electrically connects the first gate electrode and the first source/drain regions to each other. The connecting contact may comprise a first sub-contacts at each side of the first gate electrode, the first sub-contacts connected to the first source/drain regions; and a second sub-contact extending in a second direction, the second sub-contact intersecting the first direction when viewed from a plan view, the second sub-contact connected to the first sub-contacts, the second sub-contact in contact with a top surface of the first gate electrode. Each of the first sub-contacts may have a first width in the first direction. The second sub-contact may have a second width in the first direction. The second width may be smaller than the first width.

In some embodiments, the first sub-contacts include top surfaces that are at the same level as a top surface of the second sub-contact.

In some embodiments, the first sub-contacts and the second sub-contact may include the same material and may be connected to each other to form a united body.

In some embodiments, each of the first sub-contacts may be spaced apart from the first gate electrode by a predetermined distance.

In some embodiments, when viewed from a plan view, each of the first sub-contacts may have a bar shape extending in the first direction and the second sub-contact may have a bar shape extending in the second direction.

In some embodiments, the semiconductor device may further include: connecting conductive patterns at both sides of the first gate electrode. The first sub-contacts may be electrically connected to the first source/drain regions through the connecting conductive patterns.

In some embodiments, the connecting conductive patterns may include a material different from that of the first sub-contacts.

In some embodiments, the connecting conductive patterns may include a metal silicide.

In some embodiments, the semiconductor device may further include: a second gate electrode at the circuit region of the substrate, the second gate electrode extending in the first direction; second source/drain regions at each side of the second gate electrode; and source/drain contacts at each side of the second gate electrode and connected to the second source/drain regions. The source/drain contacts may include the same material as the first sub-contacts.

In some embodiments, top surfaces of the source/drain contacts may be at a same level as top surfaces of the first sub-contacts.

In some embodiments, the semiconductor device may further include: connecting conductive patterns at each side of each of the first gate electrode and the second gate electrode. The first sub-contacts may be electrically connected to the first source/drain regions through the connecting conductive patterns at each side of the first gate electrode. The source/drain contacts may be electrically connected to the second source/drain regions through the connecting conductive patterns at each side of the second gate electrode.

In some embodiments, the connecting conductive patterns may include a material different from that of the source/drain contacts.

In some embodiments, the semiconductor device may further include: a gate contact in contact with a top surface of the second gate electrode. The gate contact may be spaced apart from the source/drain contacts and may include the same material as the second sub-contact.

In some embodiments, a top surface of the gate contact may be disposed at a same level as a top surface of the second sub-contact.

In some embodiments, the top surface of the gate contact may be at a same level as top surfaces of the source/drain contacts and top surfaces of the first sub-contacts.

In some embodiments, each of the first sub-contacts and the source/drain contacts may have a bar shape extending in the first direction, and each of the second sub-contact and the gate contact may have a bar shape extending in the second direction.

In some embodiments, each of the first sub-contacts may have a first width in the second direction, each of the source/drain contacts may have a second width in the second direction, and the first width may be substantially equal to the second width.

In some embodiments, the second sub-contact may have a first width in the first direction, the gate contact may have a second width in the first direction, and the first width may be substantially equal to the second width.

In some embodiments, the first sub-contacts may be in contact with the first source/drain regions.

In some embodiments, the first gate electrode may include a plurality of first gate electrodes at the jumper region. The plurality of first gate electrodes may be defined as a first gate electrode group. The plurality of first gate electrodes may be arranged along the second direction. The connecting contact may electrically connect the plurality of first gate electrodes to the first source/drain regions at both sides of each of the first gate electrodes. The first sub-contacts may be disposed at both sides of the first gate electrode group. The second sub-contact may be in contact with top surfaces of the first gate electrodes.

In some embodiments, at least one of the first sub-contacts may be between the first gate electrodes.

In some embodiments, the first sub-contacts may be connected to each end of the second sub-contact. The second sub-contact may include extensions extending from the ends of the second-sub contact in the first direction. The extensions may overlap with the first sub-contacts, respectively.

In another aspect, a method of manufacturing a semiconductor device may include: forming a first gate electrode and a second gate electrode on a substrate, the first and second gate electrodes extending in a first direction and arranged in a second direction intersecting the first direction; forming an interlayer insulating layer that covers the first gate electrode and the second gate electrode; forming first sub-contact holes by patterning the interlayer insulating layer at each side of the first gate electrode; forming source/drain contact holes by patterning the interlayer insulating layer disposed at each side of the second gate electrode; forming a second sub-contact hole by patterning the interlayer insulating layer, the second sub-contact hole exposing a top surface of the first gate electrode and connected to the first sub-contact holes; and forming a gate contact hole by patterning the interlayer insulating layer, the gate contact hole exposing a top surface of the second gate electrode and spaced apart from the source/drain contact holes. The first sub-contact holes and the source/drain contact holes may be formed at the same time. The second sub-contact hole and the gate contact hole may be formed at the same time.

In some embodiments, the method may further include: forming source/drain regions at each side of each of the first and second gate electrodes; and forming connecting conductive patterns connected to the source/drain regions at each side of each of the first and second gate electrodes. The first sub-contact holes and the source/drain contact holes may expose top surfaces of the connecting conductive patterns.

In some embodiments, forming the second sub-contact hole and the gate contact hole may include: forming a mask layer that fills the first sub-contact holes and the source/drain contact holes on the substrate; and patterning the mask layer and the interlayer insulating layer to expose the top surface of the first gate electrode and the top surface of the second gate electrode.

In some embodiments, the method may further include: forming a conductive layer that fills the first and second sub-contact holes, the source/drain contact holes, and the gate contact hole on the substrate; and planarizing the conductive layer to form first and second sub-contacts, source/drain contacts, and a gate contact in the first and second sub-contact holes, the source/drain contact holes, and the gate contact hole, respectively.

In some embodiments, the method may further include: forming source/drain regions at each side of each of the first and second gate electrodes. The first sub-contact holes and the source/drain contact holes may expose the source/drain regions.

In some embodiments, the first gate electrode may include a plurality of first gate electrodes, and the plurality of first gate electrodes may be defined as a first gate electrode group. The plurality of the first gate electrodes may be arranged in the second direction. The first sub-contact holes may be disposed at both sides of the first gate electrode group, and the second sub-contact hole may expose top surfaces of the plurality of first gate electrodes.

In some embodiments, at least one of the first sub-contact holes may be disposed between the first gate electrodes.

In some embodiments, each of the first sub-contact holes may extend in the first direction, and the second sub-contact hole may extend in the second direction. The first sub-contact holes may be connected to each end of the second sub-contact hole, respectively, and the second sub-contact hole may extend from the ends in the first direction.

In some embodiments, the first gate electrode may be disposed in a jumper region and the second gate electrode may be disposed in a circuit region.

In another aspect, a semiconductor device may comprise a substrate; a jumper region at the substrate; a first gate electrode at the jumper region, the first electrode extending in a first direction; a first source/drain region at each side of the first gate electrode; and a connecting contact that electrically connects the first gate electrode and the first source/drain regions to each other at the jumper region. The connecting contact may comprise a first sub-contact at each side of the first gate electrode and parallel to the first gate electrode in the first direction. The first sub-contacts may be connected to the first source/drain regions. The connecting contact may further comprise a second sub-contact extending in a second direction orthogonal to the first direction. The second sub-contact may be connected to the first sub-contacts. The second sub-contact may be in contact with a top surface of the first gate electrode. Each of the first sub-contacts may have a first width in the first direction. The second sub-contact may have a second width in the first direction. The second width may be smaller than the first width.

In some embodiments, each of the first sub-contacts may have a bar shape that extends in the first direction. The second sub-contact may have a bar shape that extends in the second direction.

In some embodiments, the semiconductor device may further comprise connecting conductive patterns at each side of the first gate electrode. The first sub-contacts may be electrically connected to the first source/drain regions through the connecting conductive patterns.

In some embodiments, the semiconductor device may further comprise a circuit region at the substrate; a second gate electrode at the circuit region, the second gate electrode extending in the first direction; second source/drain regions at each side of the second gate electrode; and source/drain contacts at each side of the second gate electrode and connected to the second source/drain regions.

In some embodiments, the semiconductor device may further comprise a gate contact in contact with a top surface of the second gate electrode, wherein the gate contact is spaced apart from the source/drain contacts.

In some embodiments, the first gate electrode may include a plurality of first gate electrodes at the jumper region, the plurality of first gate electrodes may be defined as a first gate electrode group, the plurality of first gate electrodes may be arranged along the second direction, the connecting contact electrically may connect the plurality of first gate electrodes to the first source/drain regions at both sides of each of the first gate electrodes, the first sub-contacts may be disposed at both sides of the first gate electrode group, and the second sub-contact may be in contact with top surfaces of the first gate electrodes.

BRIEF DESCRIPTION OF THE DRAWINGS

The inventive concepts will become more apparent in view of the attached drawings and accompanying detailed description.

FIGS. 6A to 8A are cross-sectional views corresponding to lines I-I' and II-II' of FIG. 2 that illustrate a method of manufacturing a semiconductor device according to an embodiment of the inventive concepts;

FIGS. 6B to 8B are cross-sectional views corresponding to lines III-III' and IV-IV' of FIG. 2 that illustrate a method of manufacturing a semiconductor device according to an embodiment of the inventive concepts;

FIGS. 6C to 8C are cross-sectional views corresponding to lines V-V' and VI-VI' of FIG. 2 that illustrate a method of manufacturing a semiconductor device according to an embodiment of the inventive concepts;

DETAILED DESCRIPTION OF THE EMBODIMENTS

Figure 1:
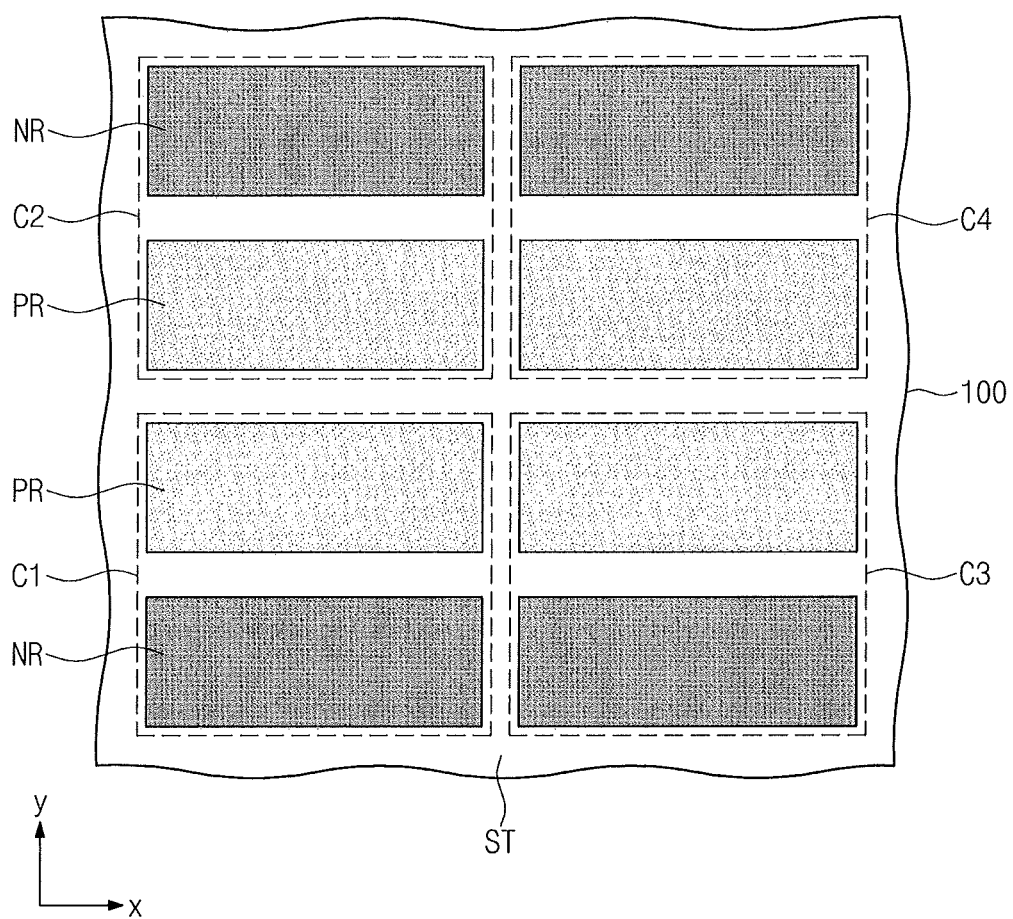
FIG. 1 is a plan view illustrating a semiconductor device according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a plan view illustrating a semiconductor device according to example embodiments of the inventive concepts.

The semiconductor device according to example embodiments of the inventive concepts may include a plurality of logic cells C1, C2, C3, and C4 that are provided on a substrate 100. Each of the logic cells C1, C2, C3, and C4 may include a plurality of transistors. In some embodiments, the second logic cell C2 may be spaced apart from the first logic cell C1 in a first direction (hereinafter, referred to as a y-direction). The third logic cell C3 may be spaced apart from the first logic cell C1 in a second direction (hereinafter, referred to as an x-direction) that intersects the y-direction. The fourth logic cell C4 may be spaced apart from the second logic cell C2 in the x-direction, and spaced apart from the third logic cell C3 in the y-direction. Each of the logic cells C1, C2, C3, and C4 may include active regions isolated from each other by a device isolation layer ST. Each of the logic cells C1, C2, C3, and C4 may include a P-type metal-oxide-semiconductor field effect transistor (PMOSFET) region PR and an N-type MOSFET (NMOSFET) region NR that are isolated from each other by the device isolation layer ST.

In some embodiments, the PMOSFET region PR and the NMOSFET region NR may be spaced apart from each other in the y-direction by a predetermined distance. The PMOSFET region PR of the first logic cell C1 may be adjacent to the PMOSFET region PR of the second logic cell C2 in the y-direction. In the present specification, a logic cell may be defined as a unit for performing a single logical operation. For example, the logic cell may be configured to perform a boolean logic function such as INVERTER, AND, OR, NAND etc. or a storage function such as FLIP FLOP. In FIG. 1, four logic cells are illustrated. However, the inventive concepts are not limited thereto.

Figure 2:
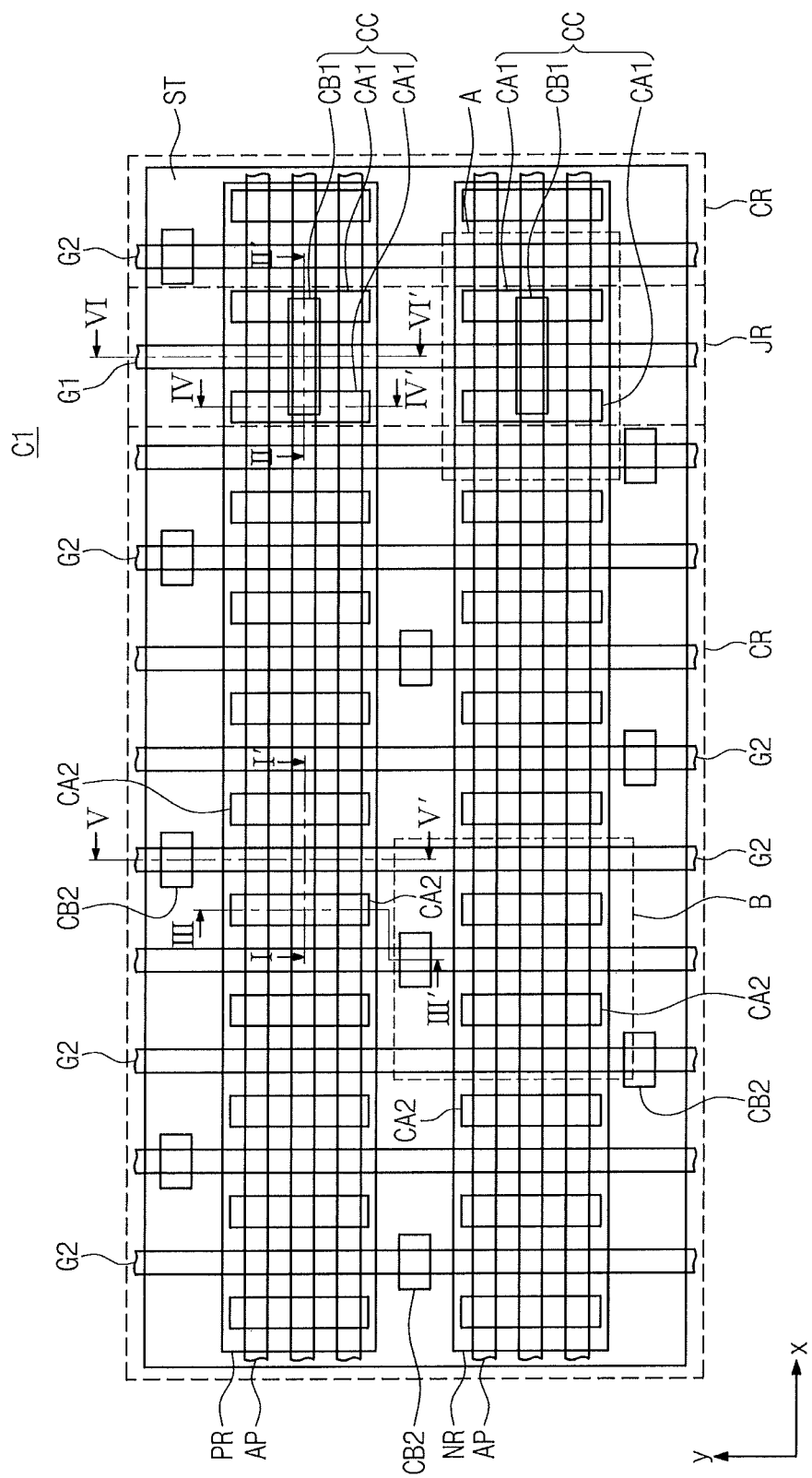
FIG. 2 is a plan view of a first logic cell of FIG. 1 that illustrates a semiconductor device according to an embodiment of the inventive concepts.
Figure 3A:
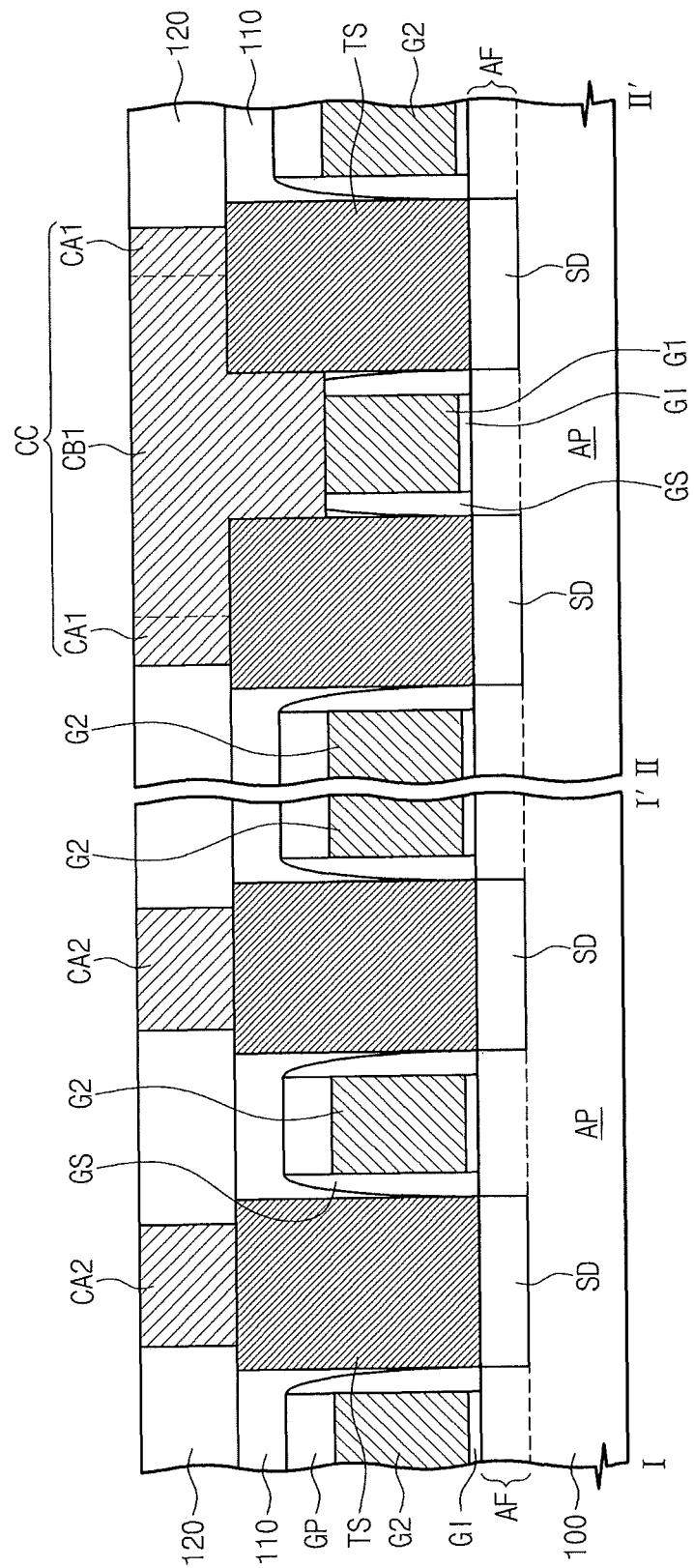
FIG. 3A is a cross-sectional view taken along lines I-I' and II-II' of FIG. 2.
Figure 3B:
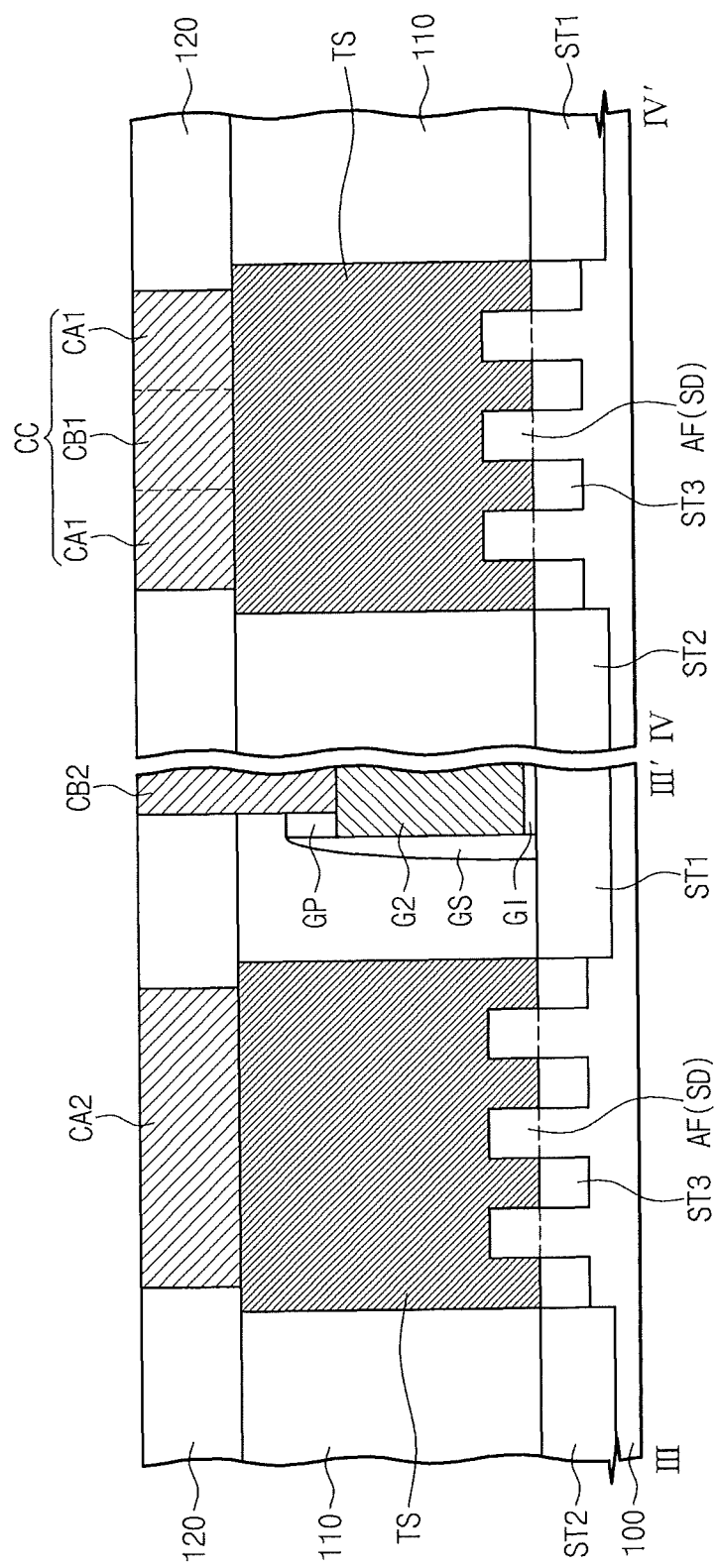
FIG. 3B is a cross-sectional view taken along lines III-III' and IV-IV' of FIG. 2.
Figure 3C:
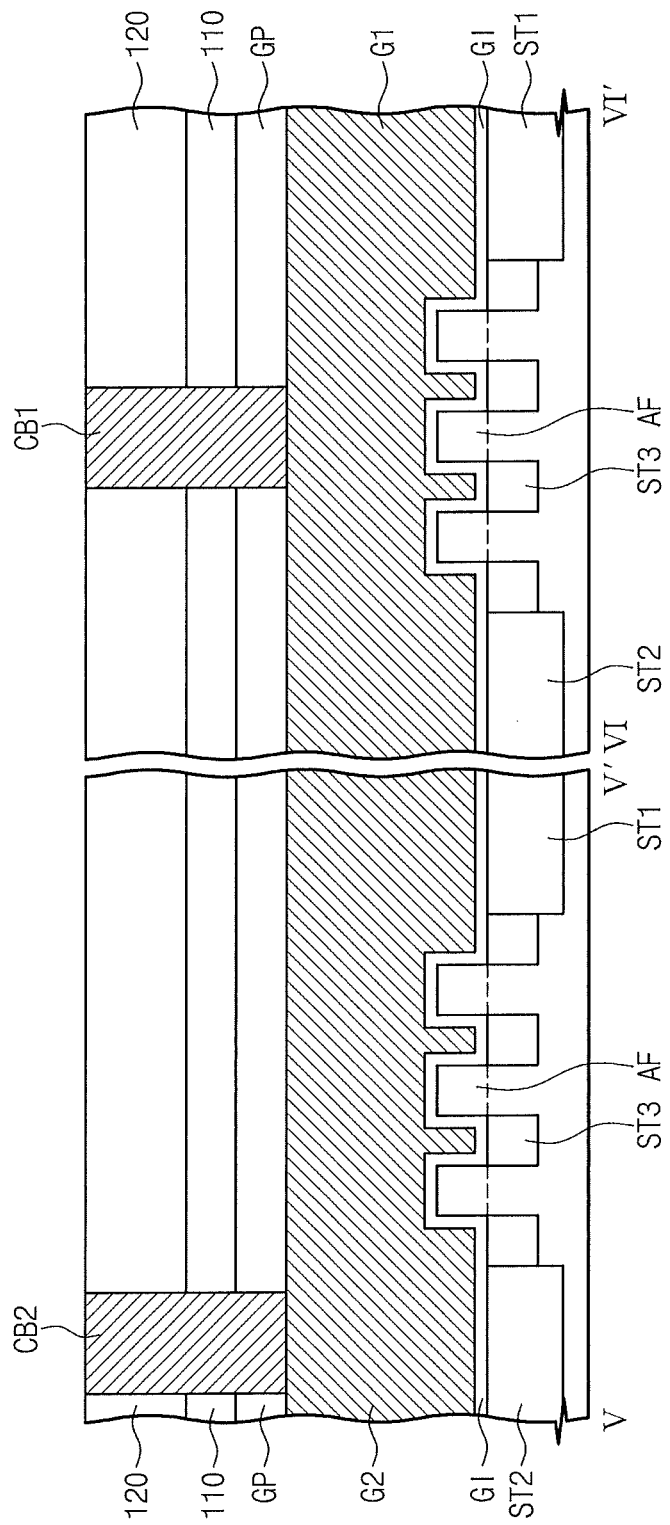
FIG. 3C is a cross-sectional view taken along lines V-V' and VI-VI' of FIG. 2.
Figure 4:
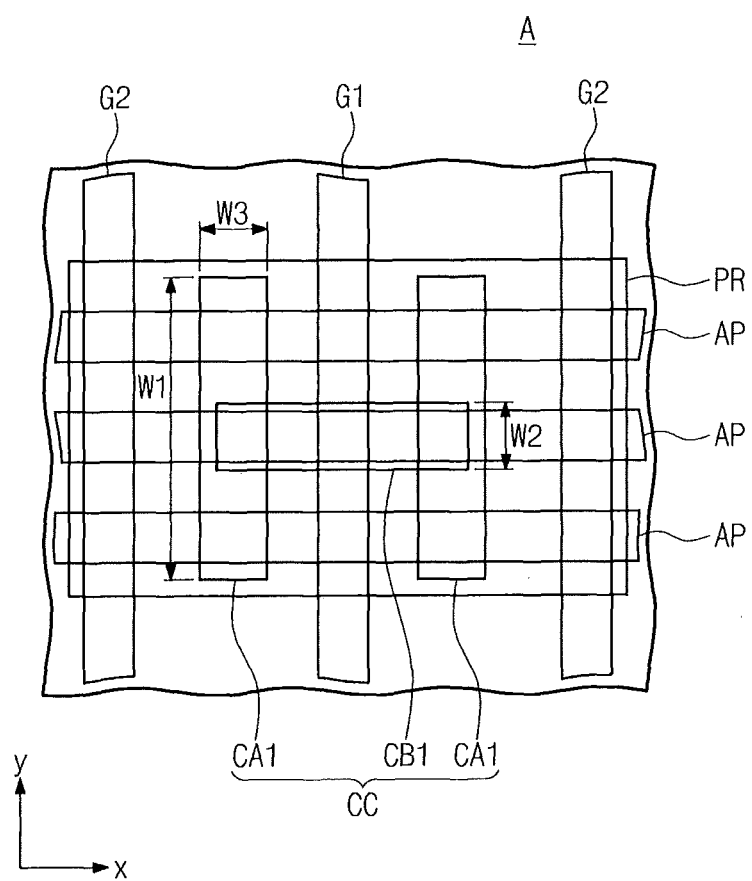
FIG. 4 is an enlarged view of a portion 'A' of FIG. 2 illustrating an embodiment of a connecting contact of a first logic cell.
Figure 5:
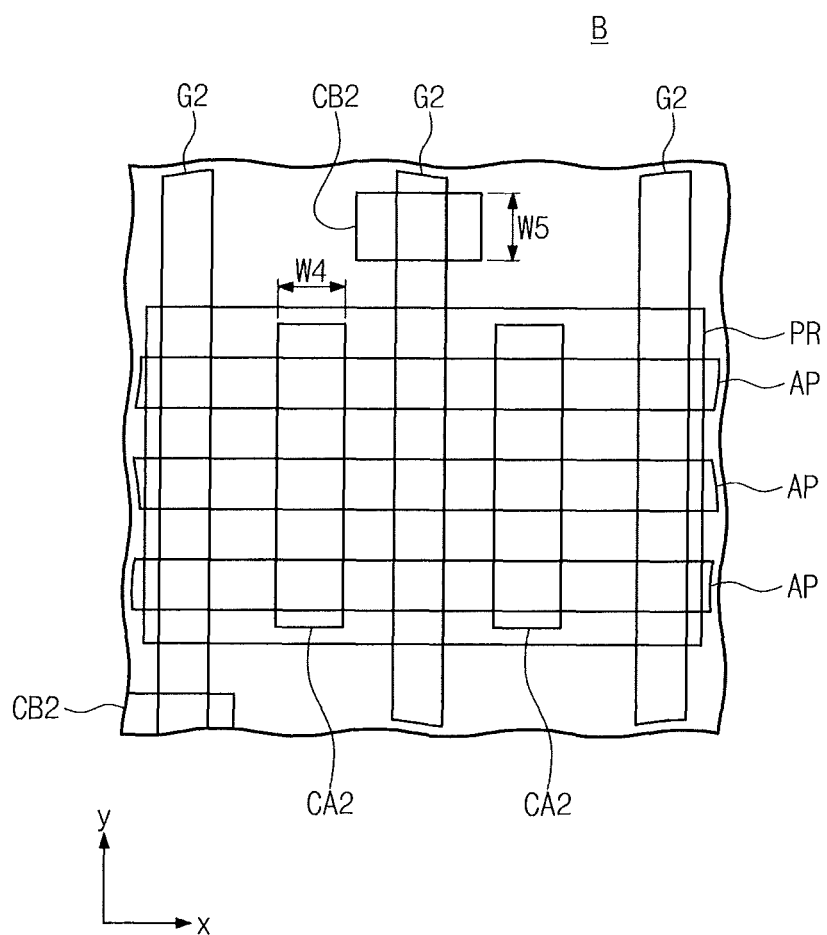
FIG. 5 is an enlarged view of a portion 'B' of FIG. 2 illustrating an embodiment of a source/drain contacts and a gate contact of a first logic cell.
Figure 6A:
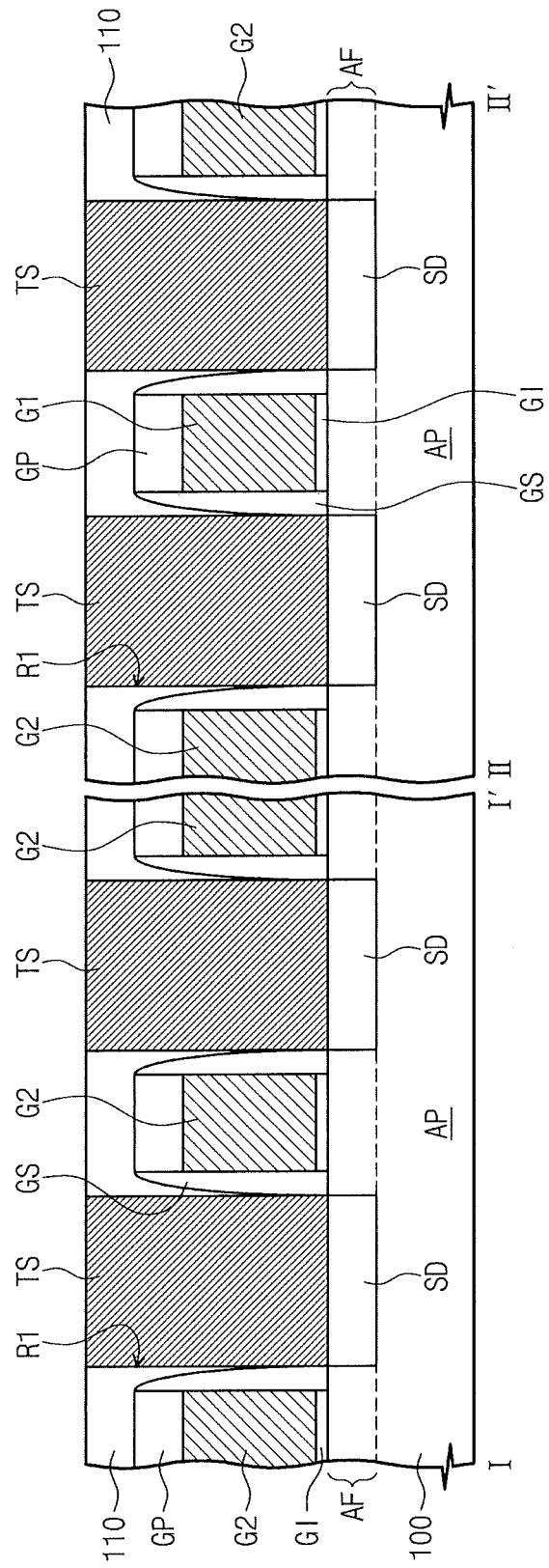
Figure 6B:
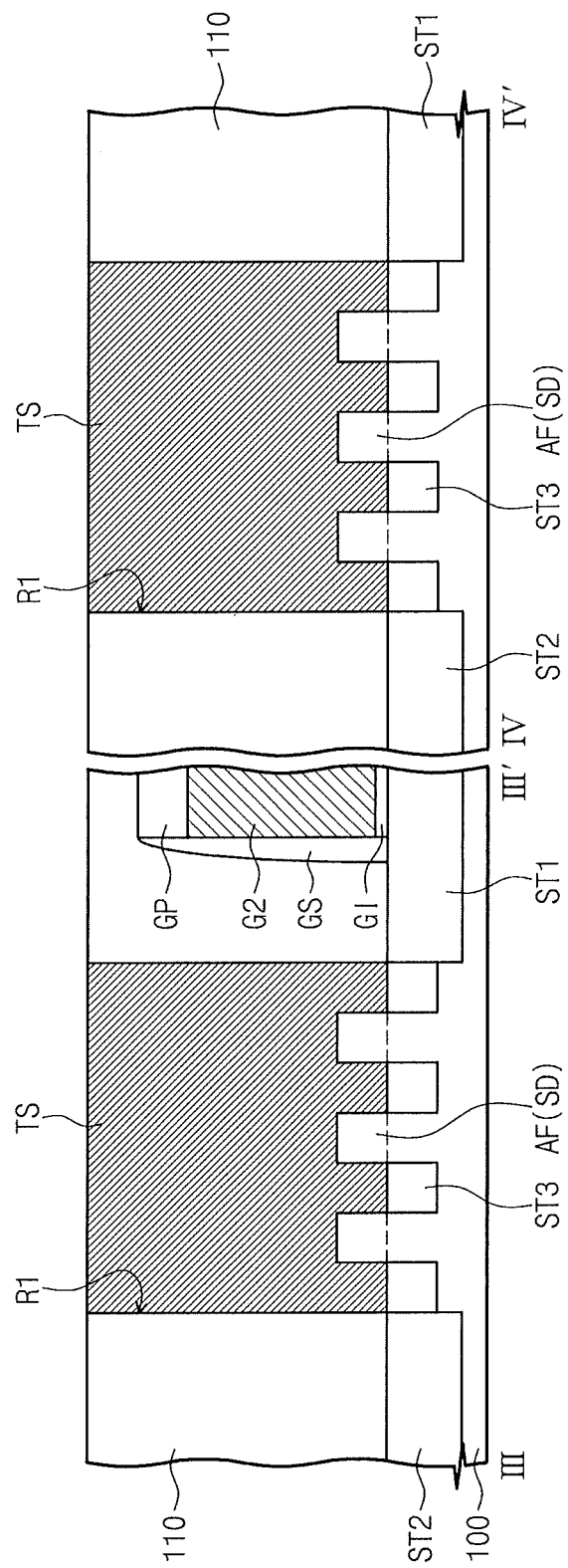

FIG. 2 is a plan view of a first logic cell C1 of FIG. 1 illustrating a semiconductor device according to an embodiment of the inventive concepts. FIG. 3A is a cross-sectional view taken along lines I-I' and II-II' of FIG. 2, FIG. 3B is a cross-sectional view taken along lines III-III' and IV-IV' of FIG. 2, and FIG. 3C is a cross-sectional view taken along lines V-V' and VI-VI' of FIG. 2. FIG. 4 is an enlarged view of a portion 'A' of FIG. 2 illustrating an embodiment of a connecting contact CC of a first logic cell C1. FIG. 5 is an enlarged view of a portion 'B' of FIG. 2 illustrating an embodiment of source/drain contacts CA2 and a gate contact CB2 of a first logic cell. Hereinafter, various embodiments of the inventive concepts will be described with reference to the first logic cell C1 of FIG. 1. However, structures of other logic cells may be the same as or may correspond to that of the first logic cell C1.

Referring to FIGS. 1, 2, 3A, 3B, and 3C, the first logic cell C1 may include the PMOSFET region PR and the NMOSFET region NR, which are isolated from each other by the device isolation layer ST. The first logic cell C1 may be isolated from neighboring logic cells C2, C3, and C4 by the device isolation layer ST. The device isolation layer ST may include a first device isolation layer ST1 that isolates the PMOSFET region PR and the NMOSFET region NR from each other and a second device isolation layer ST2 that isolates the first logic cell C1 from the neighboring logic cells C2, C3, and C4. The first device isolation layer ST1 and the second device isolation layer ST2 may form a united body. In other words, the first device isolation layer ST1 and the second device isolation layer ST2 may correspond to portions of one insulating layer, respectively. The device isolation layer ST may be formed in an upper portion of the substrate 100. In some embodiments, the substrate 100 may be a silicon substrate, a germanium substrate, or a silicon-on-insulator (SOI) substrate. In some embodiments, the device isolation layer ST may include a silicon oxide layer.

According to an embodiment, the PMOSFET region PR and the NMOSFET region NR may be spaced apart from each other in the y-direction by a predetermined distance. The first device isolation layer ST1 may be positioned between the therebetween. Each of the PMOSFET region PR and the NMOSFET region NR is illustrated as one region. Alternatively, each of the PMOSFET region PR and the NMOSFET region NR may include a plurality of regions that are isolated from each other by the first device isolation layer ST1.

The first logic cell C1 may include a plurality of active patterns AP at the substrate 100. The active patterns AP may extend in the x-direction. The active patterns AP may be arranged along the y-direction. In some embodiments, third device isolation layers ST3 extend in the x-direction, and may be disposed at both sides of each active pattern AP. In some embodiments, each active pattern AP may have an upper portion (hereinafter, referred to as 'an active fin AF') that is exposed by the third device isolation layers ST3. However, the inventive concepts are not limited thereto. In other embodiments, not shown at FIG. 3B, top surfaces of the active patterns AP may be substantially coplanar with top surfaces of the third device isolation layers ST3.

Each of, or one or more of, the first, second, and third device isolation layers ST1, ST2, and ST3 may have a depth that extends in a direction perpendicular to the top surface of the substrate 100. In some embodiments, the depth of the third device isolation layers ST3 may be shallower than those of the first and second device isolation layers ST1 and ST2. In this case, the third device isolation layers ST3 may be formed by a process different from a process for forming the first and second device isolation layers ST1 and ST2. In other embodiments, the first, second, and third device isolation layers ST1, ST2, and ST3 may be formed at the same time or at similar times, and the depths of the first, second, and third device isolation layers ST1, ST2, and ST3 may be substantially equal to each other.

The active patterns AP may be disposed at each of the PMOSFET region PR and the NMOSFET region NR. As illustrated in FIG. 2, three active patterns AP may be disposed on each of the PMOSFET region PR and the NMOSFET region NR. However, the inventive concepts are not limited thereto.

The first logic cell C1 may include a circuit region CR and a jumper region JR. Logic circuits may be disposed in the circuit region CR. One or more jumpers that connect the logic circuits to each other may be disposed in the jumper region JR. Each of the circuit region CR and the jumper region JP may include one or both of the PMOSFET region PR and the NMOSFET region NR. In some embodiments, the PMOSFET region PR and the NMOSFET region NR may extend from the circuit region CR to the jumper region JR.

Gate electrodes G1 and G2 may be provided on the active patterns AP. The gate electrodes G1 and G2 may extend in the y-direction and may intersect the active patterns AP. The gate electrodes G1 and G2 may include a first gate electrode G1 at the jumper region JR and a second gate electrode G2 at the circuit region CR. The first gate electrode G1 and the second gate electrode G2 may be spaced apart from each other in the x-direction by a predetermined distance.

Each of the gate electrodes G1 and G2 may extend in the y-direction to cross over the PMOSFET region PR and the NMOSFET region NR, respectively. A gate dielectric pattern G1 may be under each of the gate electrodes G1 and G2. A capping pattern GP may be on each of the gate electrodes G1 and G2. Gate spacers GS may be on both sidewalls of each of the gate electrodes G1 and G2. The gate electrodes G1 and G2 may include at least one of a doped semiconductor, a metal, and a conductive material. The gate dielectric pattern G1 may include at least one of a silicon oxide layer, a silicon oxynitride layer, and a high-k dielectric layer having a dielectric constant is higher than that of a silicon oxide layer. Each of the capping pattern GP and the gate spacer GS may include at least one of a silicon oxide layer, a silicon nitride layer, and a silicon oxynitride layer.

Source/drain regions SD may be provided at the active patterns AP at both sides of each gate electrode G1 and G2. As illustrated in FIG. 3A, the source/drain regions SD may be positioned in the active fins AF. Alternatively, the source/drain regions SD may extend downwardly between the third device isolation layers ST3. The source/drain regions SD of the PMOSFET region PR may be P-type dopant regions. The source/drain regions SD of the NMOSFET region NR may be N-type dopant regions. Portions of the active patterns AP (e.g., portions of the active fins AF) that are disposed under and overlap the gate electrodes G1 and G2 may operate as channel regions.

According to an embodiment, connecting conductive patterns TS may be disposed at both sides of each gate electrode G1 and G2. In the PMOSFET region PR, each of the connecting conductive patterns TS may electrically connect the source/drain regions SD, which are spaced apart from each other in the y-direction with the third device isolation layer ST3 therebetween, to each other. The connecting conductive patterns TS may be in direct contact with the source/drain regions SD. The source/drain regions SD of the NMOSFET region NR may be connected to each other by the same or similar method as a method described herein. In other words, in the NMOSFET region NR, each of the connecting conductive patterns TS may electrically connect the source/drain regions SD, which are spaced apart from each other in the y-direction, to each other.

The connecting conductive patterns TS may include a metal silicide. For example, the connecting conductive patterns TS may include at least one of titanium silicide, tantalum silicide, and tungsten silicide, or related materials. The connecting conductive patterns TS may further include a metal layer. For example, the metal layer may include at least one of titanium, tantalum, and tungsten, or related materials. In some embodiments, each of the connecting conductive patterns TS may include a metal silicide layer and a metal layer disposed on the metal silicide layer.

A first interlayer insulating layer 110 may be provided on the substrate 100 to cover some or all of the gate electrodes G1 and G2 and the connecting conductive patterns TS. According to an embodiment, top surfaces of the connecting conductive patterns TS may be substantially coplanar with a top surface of the first interlayer insulating layer 110. The first interlayer insulating layer 110 may include at least one of a silicon oxide layer and a silicon oxynitride layer.

Referring again to FIGS. 1, 2, 3A, 3B, 3C, and 4, a connecting contact CC may be provided at the jumper region JR. The connecting contact CC may be in contact with a top surface of the first gate electrode G1 and may also be in contact with the connecting conductive patterns TS extending along each side of the first gate electrode G1. The connecting contact CC may be provided in the PMOSFET region PR and/or the NMOSFET region NR at the jumper region JR.

The connecting contact CC may be electrically connected to the source/drain regions SD at both sides of the first gate electrode G1 through the connecting conductive patterns TS. In other words, the connecting contact CC may be connected in common to both the first gate electrode G1 and the connecting conductive patterns TS provided at both sides of the first gate electrode G1. As a result, the first gate electrode G1 and the source/drain regions SD at both sides of the first gate electrode G1 may be in an equipotential state. In other words, the first gate electrode G1 may be a dummy gate electrode that does not form a logic circuit, and the connecting contact CC may function as the jumper that connects the logic circuits provided in the circuit region CR.

According to an embodiment, the connecting contact CC may include first sub-contacts CA1 disposed at each side of the first gate electrode G1 and a second sub-contact CB1 connecting the first sub-contacts CA1 to each other. As shown in FIG. 2, the first sub-contacts CA1 may be parallel to the first gate electrode G1. The first sub-contacts CA1 may be spaced apart from the first gate electrode G1 by a predetermined distance. The second sub-contact CB1 may be in direct or indirect contact with the top surface of the first gate electrode G1. Both ends of the second sub-contact CB1 may overlap with the first sub-contacts CA1, respectively, or at least intersect the first sub-contacts CA1. The connecting contact CC may be connected to the source/drain regions SD at each side of the first gate electrode G1 through the connecting conductive patterns TS disposed at each side of the first gate electrode G1. In some embodiments, top surfaces of the first sub-contacts CA1 may be disposed at a same or similar level as that of the top surface of the second sub-contact CB1. The first sub-contacts CA1 and the second sub-contact CB1 may include the same material and may be connected to each other to form a united body. The first sub-contacts CA1 and the second sub-contact CB1 may include at least one of a doped semiconductor, a metal, and a conductive metal nitride, and/or other related materials known to those of ordinary skill in the art. The connecting conductive patterns TS may include a material that is different from that of the first and second sub-contacts CA1 and CB1. In some embodiments, the first and second sub-contacts CA1 and CB1 may include tungsten, and the connecting conductive patterns TS may include the metal silicide.

In some embodiments, when viewed from a plan view, each of the first sub-contacts CA1 may have a bar shape extending in the y-direction and the second sub-contact CB1 may have a bar shape extending in the x-direction. The second sub-contact CB1 may extend in the x-direction which is orthogonal to the y-direction along which the each of the first sub-contacts CA1 extends. Each of the first sub-contacts CA1 may have a first width W1 in the y-direction, and the second sub-contact CB1 may have a second width W2 in the y-direction. In some embodiments, the first width W1 of the first sub-contacts CA1 is greater than the second width W2 of the second sub-contact CB1.

Referring again to FIGS. 1, 2, 3A, 3B, 3C, and 5, a source/drain contacts CA2 may extend along each side of the second gate electrode G2 at the circuit region CR. The source/drain contacts CA2 may be electrically connected to the source/drain regions SD at both sides of the second gate electrode G2 through the connecting conductive patterns TS. The source/drain contacts CA2 may have various shapes. In some embodiments, some of the source/drain contacts CA2 may have a bar shape extending in the y-direction when viewed from a plan view. Even though not shown in the drawings, the source/drain contacts CA2 may include a contact that extends onto the device isolation layer ST to electrically connect the source/drain region SD of the PMOSFET region PR to the source/drain region SD of the NMOSFET region NR.

Referring to FIGS. 4 and 5, each of the first sub-contacts CA1 may have a third width W3 in the x-direction, and each of the source/drain contacts CA2 may have a fourth width W4 in the x-direction. In some embodiments, the third width W3 and the fourth width W4 may be the same or similar.

Referring again to FIGS. 1, 2, 3A, 3B, 3C, and 5, the source/drain contacts CA2 may include the same material as the first sub-contacts CA1. For example, the source/drain contacts CA2 may include at least one of a doped semiconductor, a metal, and a conductive metal nitride, and/or other related materials known to those of ordinary skill in the art. In some embodiments, top surfaces of the source/drain contacts CA2 may be disposed at a same or similar level as the top surfaces of the first sub-contacts CA1.

A gate contact CB2 may be on the second gate electrode G2. The gate contact CB2 may be electrically connected to the second gate electrode G2. The gate contact CB2 may be in direct or indirect contact with the top surface of the second gate electrode G2. A top surface of the gate contact CB2 may be disposed at a same or similar level as the top surfaces of the source/drain contacts CA2. In addition, the top surface of the gate contact CB2 may be disposed at a same or similar level as the top surfaces of the second sub-contact CB1. In some embodiments, the top surface of the connecting contact CC, the top surfaces of the source/drain contacts CA2, and the top surface of the gate contact CB2 may be disposed at a same or similar level as the substrate 100.

The gate contact CB2 may include the same material as the second sub-contact CB1. For example, the gate contact CB may include at least one of a doped semiconductor, a metal, and a conductive metal nitride, and/or other related materials known to those of ordinary skill in the art. In some embodiments, the connecting contact CC, the source/drain contacts CA2, and the gate contact CB2 may include the same material. The connecting conductive patterns TS may include a material that is different from those of the source/drain contacts CA2 and the gate contact CB2. For example, the source/drain contacts CA2 and the gate contact CB2 may include tungsten, and the connecting conductive pattern TS may include the metal silicide.

Referring again to FIGS. 4 and 5, the gate contact CB2 may have a fifth width W5 in the y-direction when viewed from a plan view. In some embodiments, the second width W2 of the second sub-contact CB1 may be substantially equal to the fifth width W5 of the gate contact CB2.

Referring to FIGS. 1, 2, 3A, 3B, and 3C, a second interlayer insulating layer 120 may be provided on the substrate 100 to cover the connecting contact CC, the source/drain contacts CA2, and the gate contact CB2. The top surfaces of the connecting contact CC, the source/drain contacts CA2, and the gate contact CB2 may be disposed at a same or similar level as a top surface of the second interlayer insulating layer 120.

Even though not shown in the drawings, interconnections may be on the substrate 100 that are electrically connected to the source/drain contacts CA2 and the gate contact CB2. The interconnections are conductive and therefore may permit the transmission of electrical signals, for example, voltages, to the source/drain regions SD and the second gate electrode G2 of the circuit region CR through the source/drain contacts CA2 and the gate contact CB2. In other words, the second gate electrode G2 and the source/drain regions SD at both sides of the second gate electrode G2 may constitute a logic circuit.

FIGS. 6A to 8A are cross-sectional views corresponding to lines I-I' and II-II' of FIG. 2 to illustrate a method of manufacturing a semiconductor device according to an embodiment of the inventive concepts. FIGS. 6B to 8B are cross-sectional views corresponding to lines III-III' and IV-IV' of FIG. 2 to illustrate a method of manufacturing a semiconductor device according to an embodiment of the inventive concepts. FIGS. 6C to 8C are cross-sectional views corresponding to lines V-V' and VI-VI' of FIG. 2 to illustrate a method of manufacturing a semiconductor device according to an embodiment of the inventive concepts.

Referring to FIGS. 2, 6A, 6B, and 6C, a first device isolation layer ST1 and a second device isolation layer ST2 may be formed in or on a substrate 100. The substrate 100 may be, for example, a silicon substrate, a germanium substrate, or a silicon-on-insulator (SOI) substrate. The first device isolation layer ST1 may extend in an x-direction to isolate a PMOSFET region PR and an NMOSFET region NR of a first logic cell C1 from each other. The second device isolation layer ST2 may isolate the first logic cell C1 from neighboring logic cells. Each of the first and second device isolation layers ST1 and ST2 may have a depth that extends in a direction perpendicular to a top surface of the substrate 100. The depth of the second device isolation layer ST2 may be greater than the depth of the first device isolation layer ST1. The first and second device isolation layer ST1 and ST2 may be formed by a shallow trench isolation (STI) technique or the like.

A third device isolation layer ST3 may be formed in or on the substrate 100. The third device isolation layer ST3 may extend in the x-direction to define active patterns AP in the PMOSFET region PR and the NMOSFET region NR, respectively. Each of the active patterns AP may have an upper portion (hereinafter, referred to as 'an active fin AF') exposed by the third device isolation layer ST3. The third device isolation layer ST3 may be formed by a STI technique or the like. The third device isolation layer ST3 may have a depth that extends in the direction perpendicular to the top surface of the substrate 100. The depth of the third device isolation layer ST3 may be smaller than the depths of the first and second device isolation layers ST1 and ST2, respectively. In other embodiments, the first, second, and third device isolation layers ST1, ST2, and ST3 may be formed at the same time or at similar times, so that they have the same depth. The first, second, and third device isolation layers ST1, ST2, and ST3 may each have a silicon oxide layer or the like.

Gate electrodes G1 and G2 may be formed on the substrate 100. The gate electrodes G1 and G2 may extend in the y-direction to intersect the active patterns AP. The gate electrodes G1 and G2 may include a first gate electrode G1 formed in a jumper region JR of the first logic cell C1 and a second gate electrode G2 formed in a circuit region CR of the first logic cell C1. The first and second gate electrodes G1 and G2 may be spaced apart from each other in the x-direction.

A gate dielectric pattern G1 may be formed between the substrate 100 and each of the gate electrodes G1 and G2, and a capping pattern GP may be formed on each of the gate electrodes G1 and G2. These may be formed by a gate dielectric layer, a gate layer, and a capping layer formed on the substrate 100. A patterning process may be performed on the gate dielectric layer, the gate layer, and the capping layer to form the gate electrodes G1 and G2, the gate insulating pattern G1, and the capping pattern GP, respectively. The gate dielectric layer may include at least one of a silicon oxide layer, a silicon oxynitride layer, and a high-k dielectric layer. The dielectric constant has a dielectric constant that is higher than that of a silicon oxide layer. The gate layer may include at least one of a doped semiconductor, a metal, and a conductive metal nitride. The capping layer may include at least one of a silicon oxide layer, a silicon nitride layer, and a silicon oxynitride layer. The gate dielectric layer, the gate layer, and the capping layer may be formed according to a chemical vapor deposition (CVD) method and/or a sputtering method. In addition, gate spacers GS may be formed on both sidewalls of each of the gate electrodes G1 and G2. For example, a spacer layer may be formed to cover the gate electrodes G1 and G2, and anisotropically etched to form the gate spacers GS. The spacer layer may include at least one of a silicon oxide layer, a silicon nitride layer, and a silicon oxynitride layer.

Ion implantation processes may be performed on the substrate 100 at which the gate electrodes G1 and G2 are located to form source/drain regions SD. The source/drain regions SD may be formed in the active patterns AP at both sides of each gate electrode G1 and G2. The source/drain regions SD may not be formed in portions of the active patterns AP disposed under the gate electrodes G1 and G2 and overlap with the gate electrodes G1 and G2. Instead, the active patterns AP coexist with the source/drain regions SD at the substrate 100. The source/drain regions of the PMOSFET region PR may be formed by implanting P-type dopant ions. The source/drain regions of the NMOSFET region NR may be formed by implanting N-type dopant ions.

A first interlayer insulating layer 110 covers the gate electrodes G1 and G2, and may be formed on the substrate 100. The first interlayer insulating layer 110 may include at least one of a silicon oxide layer and a silicon oxynitride layer. Connecting conductive patterns TS may be formed to penetrate the first interlayer insulating layer 110, and may be positioned on, and connected to, the source/drain regions SD. Forming the connecting conductive patterns TS may include forming recess regions R1 that penetrate the first interlayer insulating layer 110 to expose the active patterns AP at both sides of each gate electrode G1 and G2, and further include forming a conductive material that fills the recess regions R1, and planarizing the conductive material until the first interlayer insulating layer 110 is exposed. The connecting conductive patterns TS may include a metal silicide or the like. For example, the connecting conductive patterns TS may include at least one of titanium silicide, tantalum silicide, and tungsten silicide. The connecting conductive patterns TS may further include a metal layer. For example, the metal layer may include at least one of titanium, tantalum, and tungsten. In some embodiments, each of the connecting conductive patterns TS may include the metal silicide layer and the metal layer disposed on the metal silicide layer.

In the PMOSFET region PR of a logic cell, each of the connecting conductive patterns TS may electrically connect the source/drain regions SD, which are spaced apart from each other in the y-direction with the third device isolation layer ST3 therebetween, to each other. The source/drain regions SD of the NMOSFET region NR of the logic cell may be connected to each other by a same or similar method as described above. In other words, in the NMOSFET region NR, each of the connecting conductive patterns TS may electrically connect the source/drain regions SD, which are spaced apart from each other in the y-direction with the third device isolation layer ST3 therebetween, to each other. In some embodiments, top surfaces of the connecting conductive patterns TS may be higher than top surfaces of the gate electrodes G1 and G2.

Referring to FIGS. 2, 7A, 7B, and 7C, a second interlayer insulating layer 120 may be formed on the substrate 100 having the connecting conductive patterns TS. The second interlayer insulating layer 120 may include at least one of a silicon oxide layer and a silicon oxynitride layer.

The second interlayer insulating layer 120 at the jumper region JR may be patterned to form first sub-contact holes H1 that expose the connecting conductive patterns TS at each side of the first gate electrode G1. In addition, the second interlayer insulating layer 120 at the circuit region CR may be patterned to form source/drain contact holes H2 that expose the connecting conductive patterns TS disposed at the both sides of the second gate electrode G2. The first sub-contact holes H1 and the source/drain contact holes H2 may be formed at the same time or at similar times. Each of the first sub-contact holes H1 and the source/drain contact holes H2 may extend along the top surface of the connecting conductive pattern TS disposed thereunder. In some embodiments, each of the first sub-contact holes H1 and the source/drain contact holes H2 may extend in the y-direction. Each of the first sub-contact holes H1 may have a sixth width W6 extending in the x-direction. The sixth width W6 may correspond to a distance between inner sidewalls of the first sub-contact hole H1, which are spaced apart from each other in the x-direction. In some embodiments, the sixth width W6 between sidewalls of the first sub-contact hole H1 is less than a width of the underlying connecting conductive pattern TS, a top surface of which is exposed by the first sub-contact hole H1. Each of the source/drain contact holes H2 may have a seventh width W7 extending in the x-direction. The seventh width W7 may correspond to a distance between inner sidewalls of the source/drain contact hole H2, which are spaced apart from each other in the x-direction. In some embodiments, the seventh width W7 between sidewalls of the source/drain contact hole H2 is less than a width of the underlying connecting conductive pattern TS, a top surface of which is exposed by the source/drain contact hole H2. In some embodiments, the sixth width W6 may be substantially equal to the seventh width W7.

Referring to FIGS. 2, 8A, 8B, and 8C, a mask layer M may be formed on the second interlayer insulating layer 120. The mask layer M may partially or completely fill the first sub-contact holes H1 and the source/drain contact holes H2. The mask layer M may include, for example, a spin-on-hardmask (SOH) material.

A patterning process may be performed on a portion of the mask layer M that is at the jumper region JR to form a second sub-contact hole H3 exposing the top surface of the first gate electrode G1. The patterning process may include a process of etching the mask layer M, the second and first interlayer insulating layers 120 and 110, and the capping pattern GP until the top surface of the first gate electrode G1 is exposed. The second sub-contact hole H3 may extend in the x-direction so as to be connected to the first sub-contact holes H1. When viewed from a plan view, both ends of the second sub-contact hole H3 may overlap with the first sub-contact holes H1, respectively. A patterning process may be performed on a portion of the mask layer M that is at the circuit region CR to form a gate contact hole H4 exposing the top surface of the second gate electrode G2. The second sub-contact hole H3 and the gate contact hole H4 may be formed at the same time or at similar times. In other words, the second sub-contact hole H3 and the gate contact hole H4 may be formed by the same patterning process. The gate contact hole H4 may be spaced apart from the source/drain contact holes H2 by a predetermined distance.

Figure 8A:
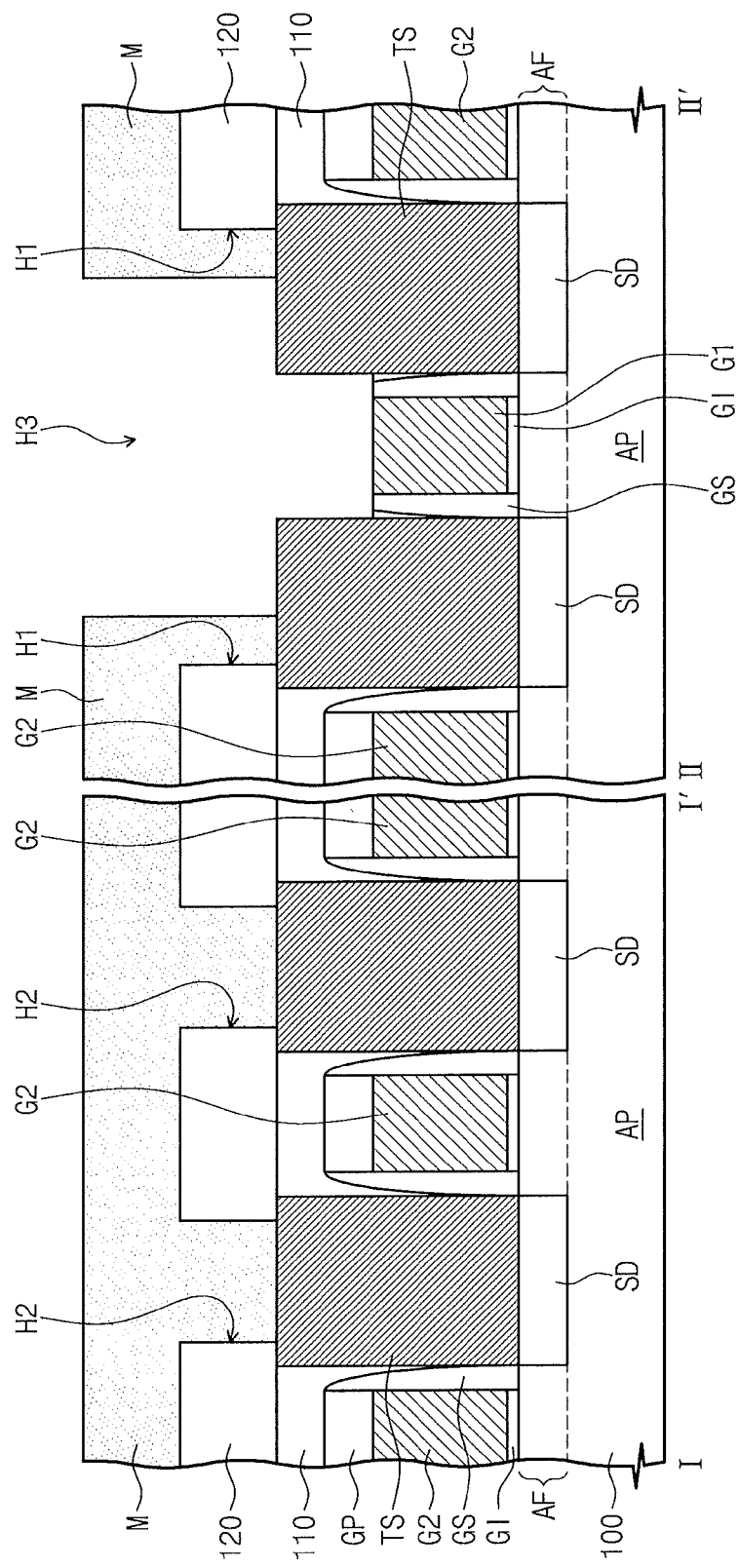
Figure 8B:
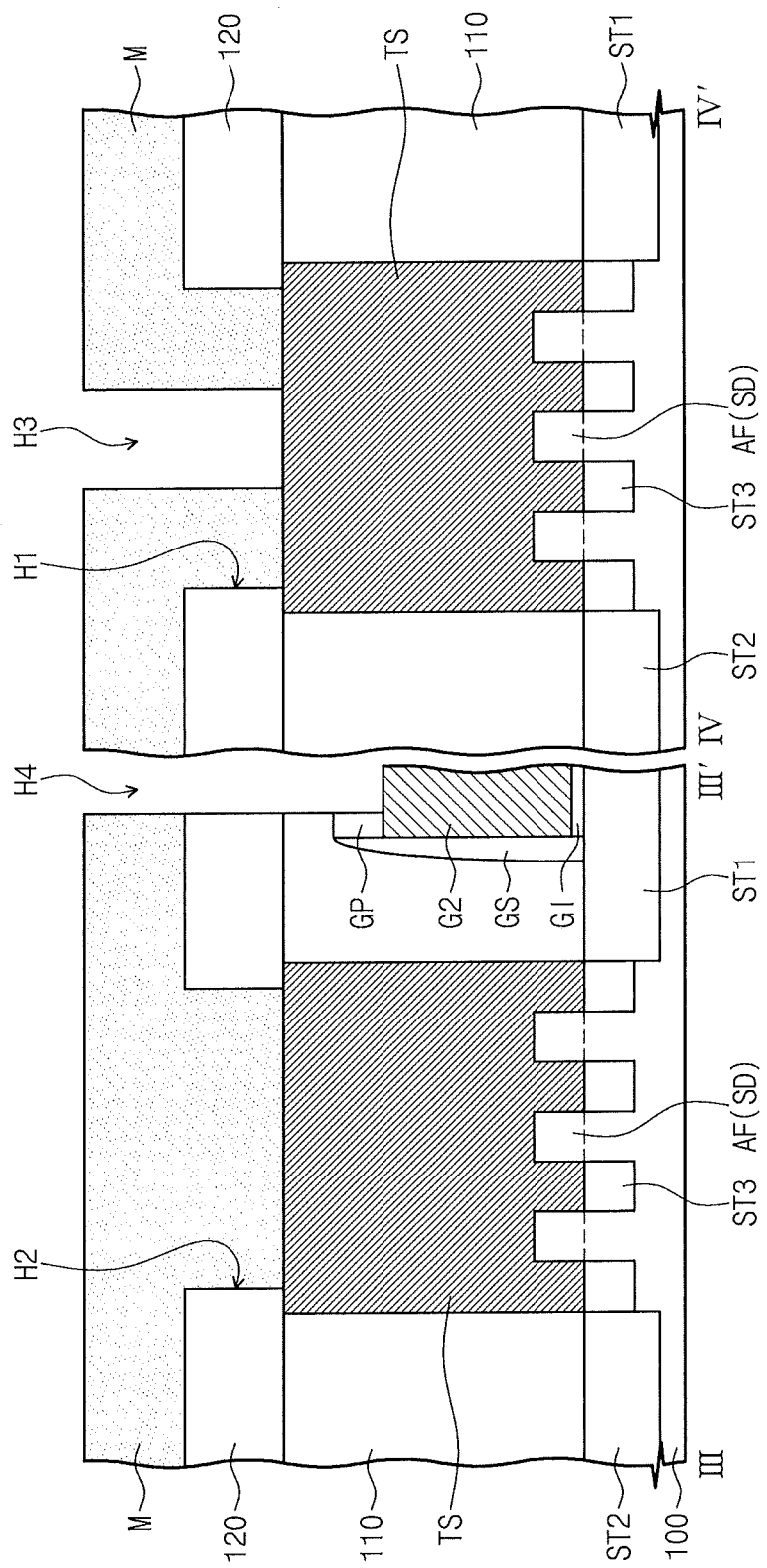
Figure 8C:
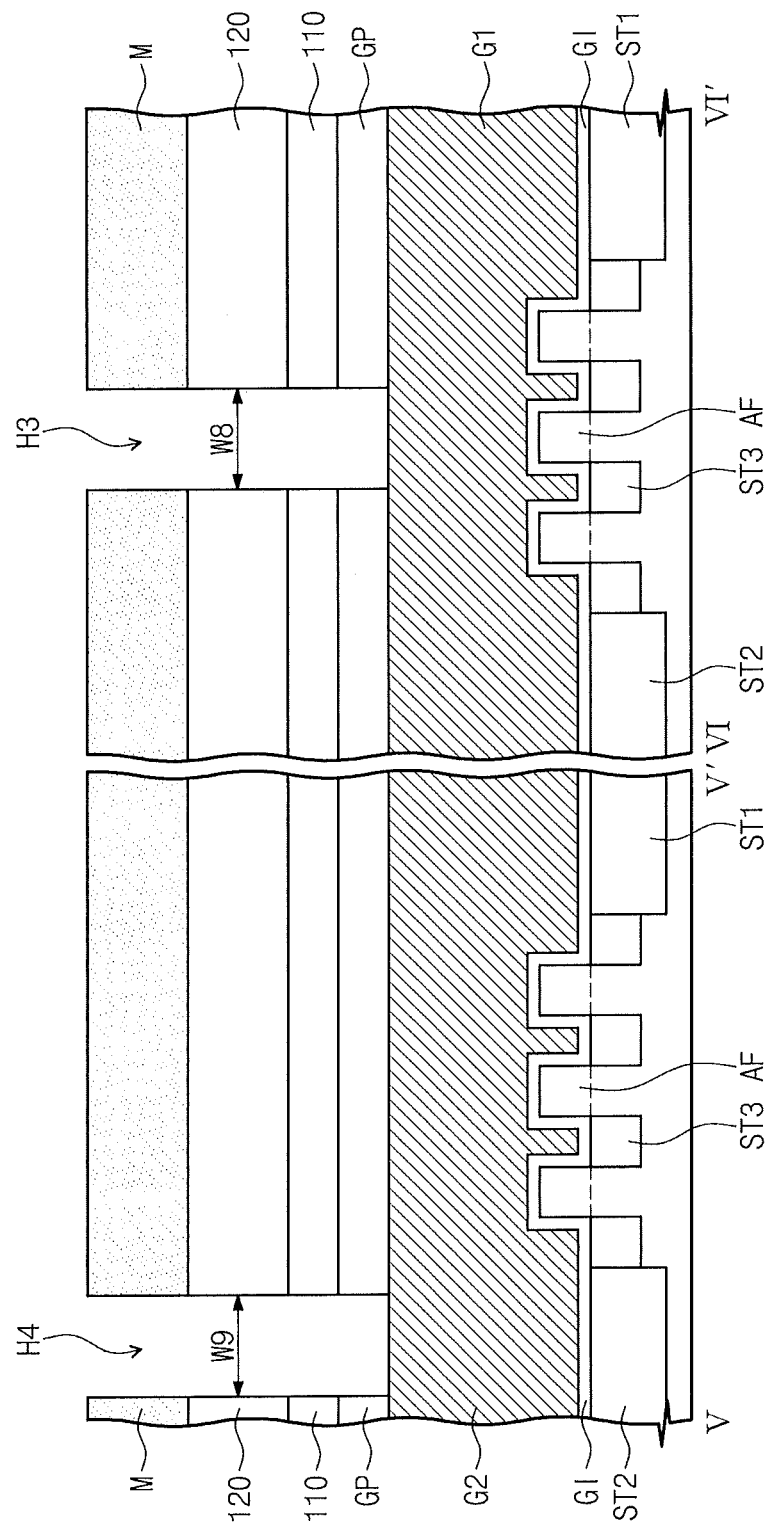

As shown in FIG. 8C, the second sub-contact hole H3 may have an eighth width W8 extending in the y-direction. The eighth width W8 may correspond to a distance between inner sidewalls of the second sub-contact hole H3, which are spaced apart from each other in the y-direction. The gate contact hole H4 may have a ninth width W9 extending in the y-direction. The ninth width W9 may correspond to a distance between inner sidewalls of the gate contact holes H4, which are spaced apart from each other in the y-direction. In some embodiments, the eighth width W8 may be substantially equal to the ninth width W9.

Referring again to FIGS. 2, 3A, 3B, and 3C, the mask layer M may be removed, for example, by applying an ashing process and/or a strip process. Thereafter, a conductive layer filling the holes H1, H2, H3, and H4 may be formed on the second interlayer insulating layer 120. The conductive layer may include at least one of a doped semiconductor, a metal, and a conductive metal nitride. The conductive layer may be planarized until the second interlayer insulating layer 120 is exposed, thereby forming first sub-contacts CA1, a second sub-contact CB1, source/drain contacts CA2, and a gate contact CB2 in the first sub-contact holes H1, the second sub-contact hole H3, the source/drain contact holes H2, and the gate contact hole H4, respectively. The first sub-contacts CA1 may be on both sides of the second sub-contact CB1, and be connected to each other by the second sub-contact CB1. The first and second sub-contacts CA1 and CB1 may be connected to each other to constitute a united body, for example, to form a connecting contact CC.

Even though not shown in the drawings, a third interlayer insulating layer may be formed on the second interlayer insulating layer 120 to cover the contacts CC, CA2, and CB2, and interconnections may be formed. The interconnections may penetrate the third interlayer insulating layer so as to be electrically connected to the source/drain contacts CA2 and the gate contact CB2.

Figure 9A:
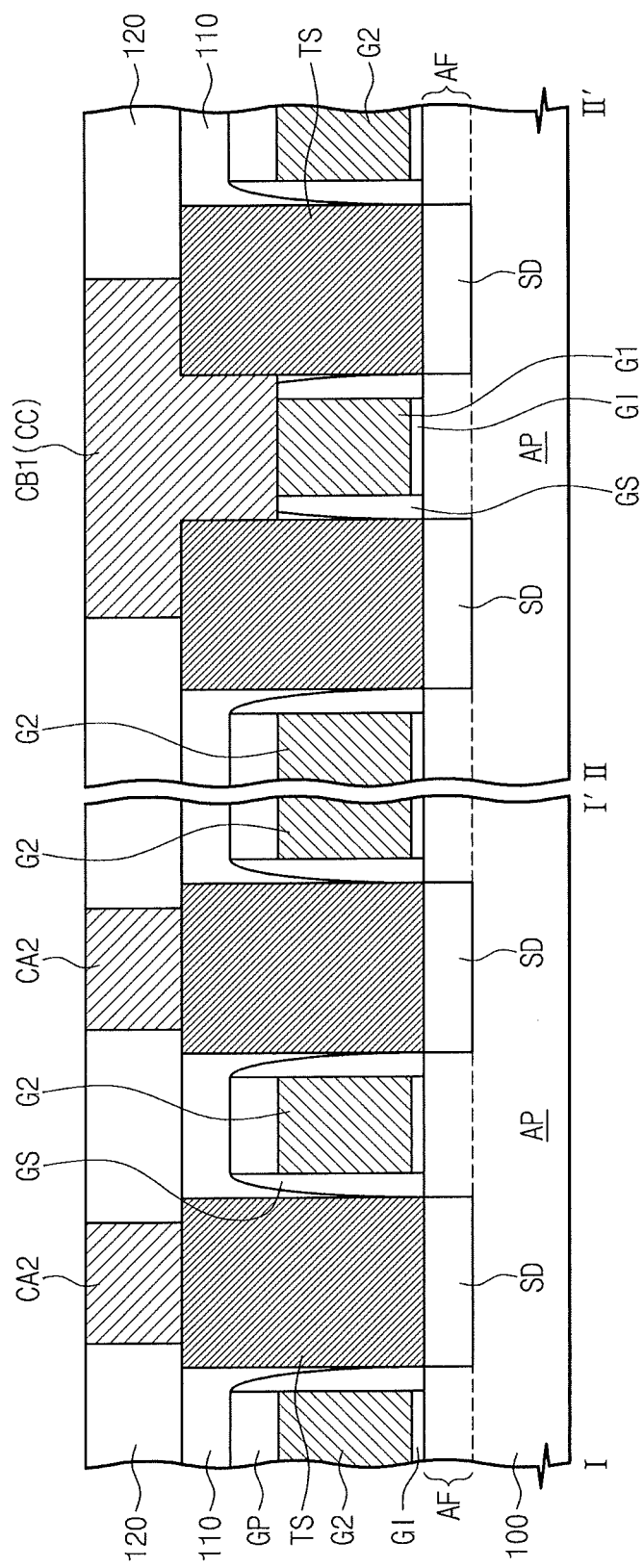
FIG. 9A is a cross-sectional view corresponding to lines I-I' and II-II' of FIG. 2 that illustrates a modified embodiment of a semiconductor device according to an embodiment of the inventive concepts.
Figure 9B:
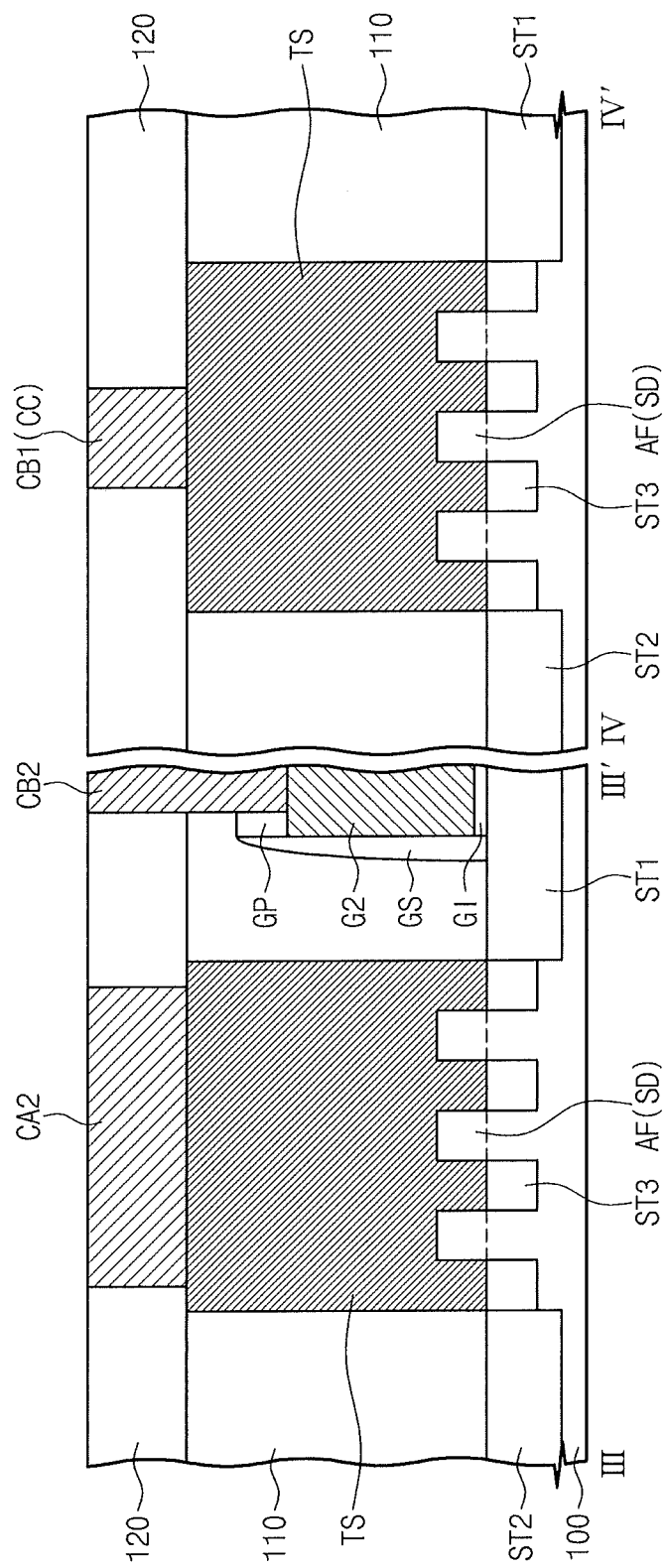
FIG. 9B is a cross-sectional view corresponding to lines III-III' and IV-IV' of FIG. 2 that illustrates a modified embodiment of a semiconductor device according to an embodiment of the inventive concepts.

FIG. 9A is a cross-sectional view corresponding to lines I-I' and II-II' of FIG. 2 to illustrate a modified embodiment of a semiconductor device according to an embodiment of the inventive concepts. FIG. 9B is a cross-sectional view corresponding to lines III-III' and IV-IV' of FIG. 2 to illustrate a modified embodiment of a semiconductor device according to an embodiment of the inventive concepts. A cross-sectional view, corresponding to lines V-V' and VI-VI' of FIG. 2, of a semiconductor device according to the present modified embodiment is the same as that illustrated in FIG. 3C. In the present modified embodiment, the same elements as described in an embodiment of FIGS. 1, 2, 3A to 3C, 4, and 5 are indicated by the same reference numerals or the same reference designators, and the descriptions thereto are omitted or mentioned briefly for the purpose of ease and convenience in explanation.

Referring to FIGS. 1, 2, 9A, 9B, and 3C, active patterns AP may be provided on a substrate 100. The active patterns AP may extend in an x-direction and may be arranged in a y-direction. Gate electrodes G1 and G2 may cross over the active patterns AP and may extend in the y-direction. The gate electrodes G1 and G2 may include a first gate electrode G1 at a jumper region JR and a second gate electrode G2 at a circuit region CR. The first gate electrode G1 and the second gate electrode G2 may be spaced apart from each other in the x-direction. Source/drain regions SD may be provided in the active patterns AP at both sides of each of the gate electrodes G1 and G2.

Connecting conductive patterns TS may be provided at both sides of each of the gate electrodes G1 and G2. Each of the connecting conductive patterns TS may electrically connect the source/drain regions SD, which are spaced apart from each other in the y-direction, to each other.

A first interlayer insulating layer 110 may be provided to cover or at least partially surround the gate electrodes G1 and G2 and to cover sidewalls of the connecting conductive patterns TS. In some embodiments, top surfaces of the connecting conductive patterns TS may be substantially coplanar with a top surface of the first interlayer insulating layer 110.

A connecting contact CC may be provided at the jumper region JR. The connecting contact CC may be in contact with a top surface of the first gate electrode G1 and may be connected via connecting conductive patterns TS to the source/drain regions SD provided at both sides of the first gate electrode G1. More specifically, the connecting contact CC may be electrically connected to the source/drain regions SD through the connecting conductive patterns TS provided at the both sides of the first gate electrode G1. In other words, the connecting contact CC may be connected in common to the first gate electrode G1 and the connecting conductive patterns TS provided at the both sides of the first gate electrode G1. According to the present embodiment, the connecting contact CC may have a bar shape extending in the x-direction when viewed from a plan view. In other words, in distinguishing the present embodiment from other embodiments described herein, the connecting contact CC according to the present embodiment may not include the first sub-contacts CA1, which are otherwise provided at both sides of the first gate electrode G1 and have the bar shape extending in the y-direction.

Source/drain contacts CA2 may be provided at both sides of the second gate electrode G2 in the circuit region CR. The source/drain contacts CA2 may be electrically connected to the source/drain regions SD at the both sides of the second gate electrode G2 through the connecting conductive patterns TS. A gate contact CB2 may be provided on the second gate electrode G2. The gate contact CB2 may be electrically connected to the second gate electrode G2. A top surface of the connecting contact CC, top surfaces of the source/drain contacts CA2, and a top surface of the gate contact CB2 may be disposed at a same or similar level from the substrate 100 so as to be coplanar with each other.

Referring again to FIGS. 4 and 5, the connecting contact CC may have the second width W2 extending in the y-direction, and the gate contact CB2 may have the fifth width W5 extending in the y-direction. In some embodiments, the second width W2 may be substantially equal to the fifth width W5.

Figure 7B:
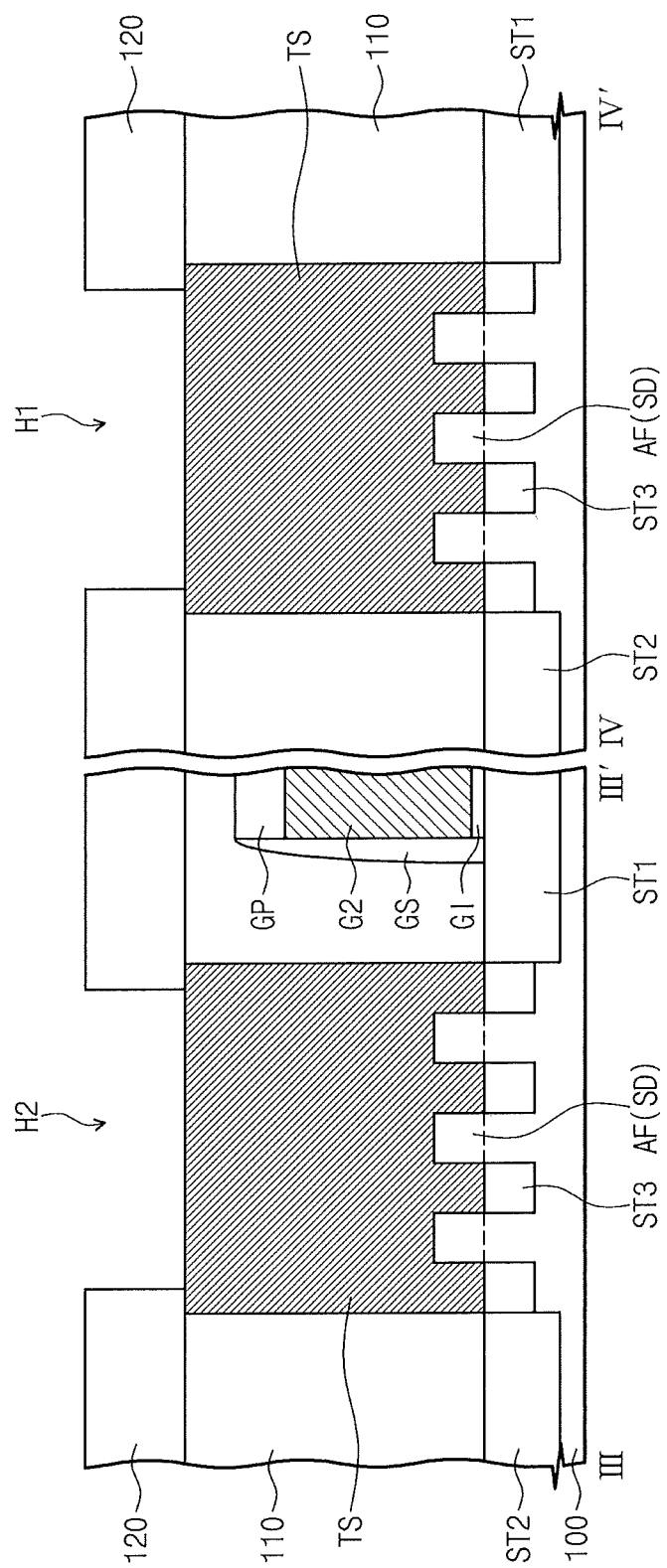
Figure 10A:
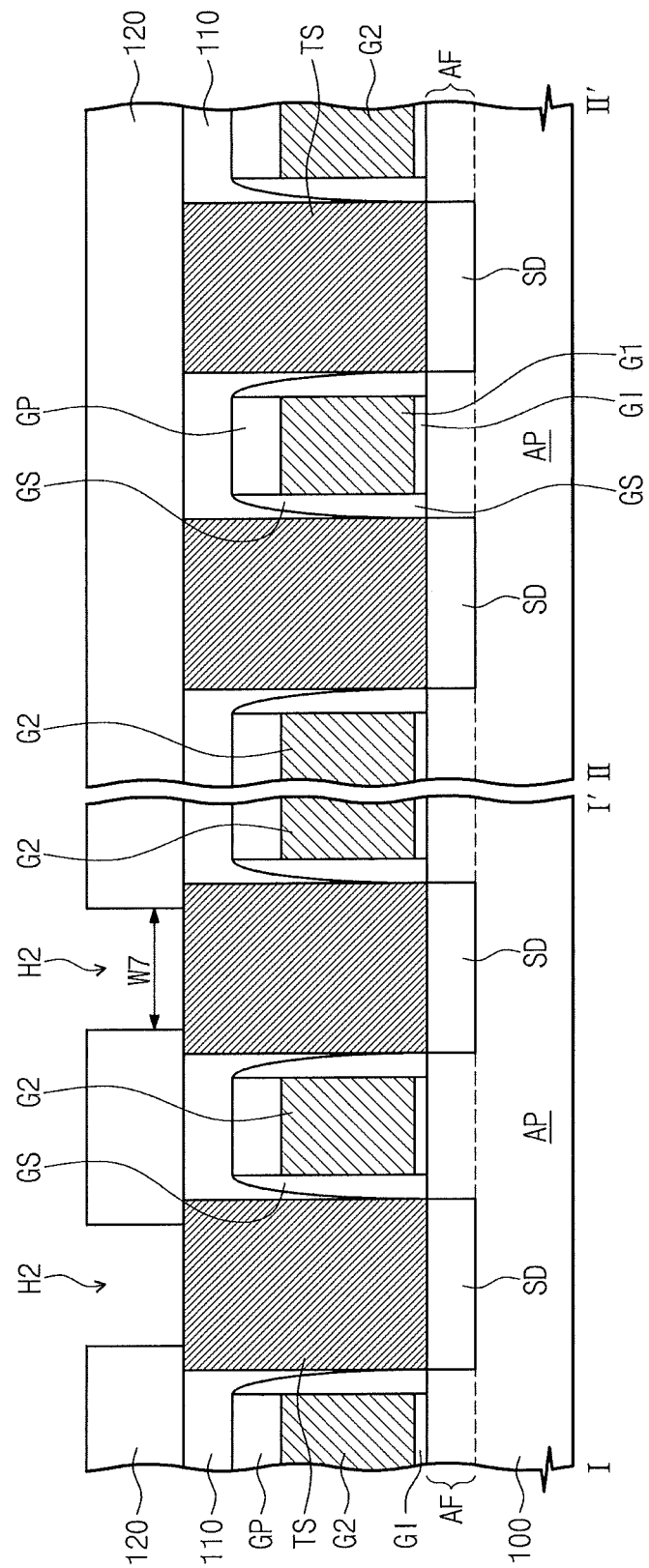
FIGS. 10A and 11A are cross-sectional views corresponding to lines I-I' and II-II' of FIG. 2 that illustrate a method of manufacturing the semiconductor device of FIGS. 9A and 9B.
Figure 10B:
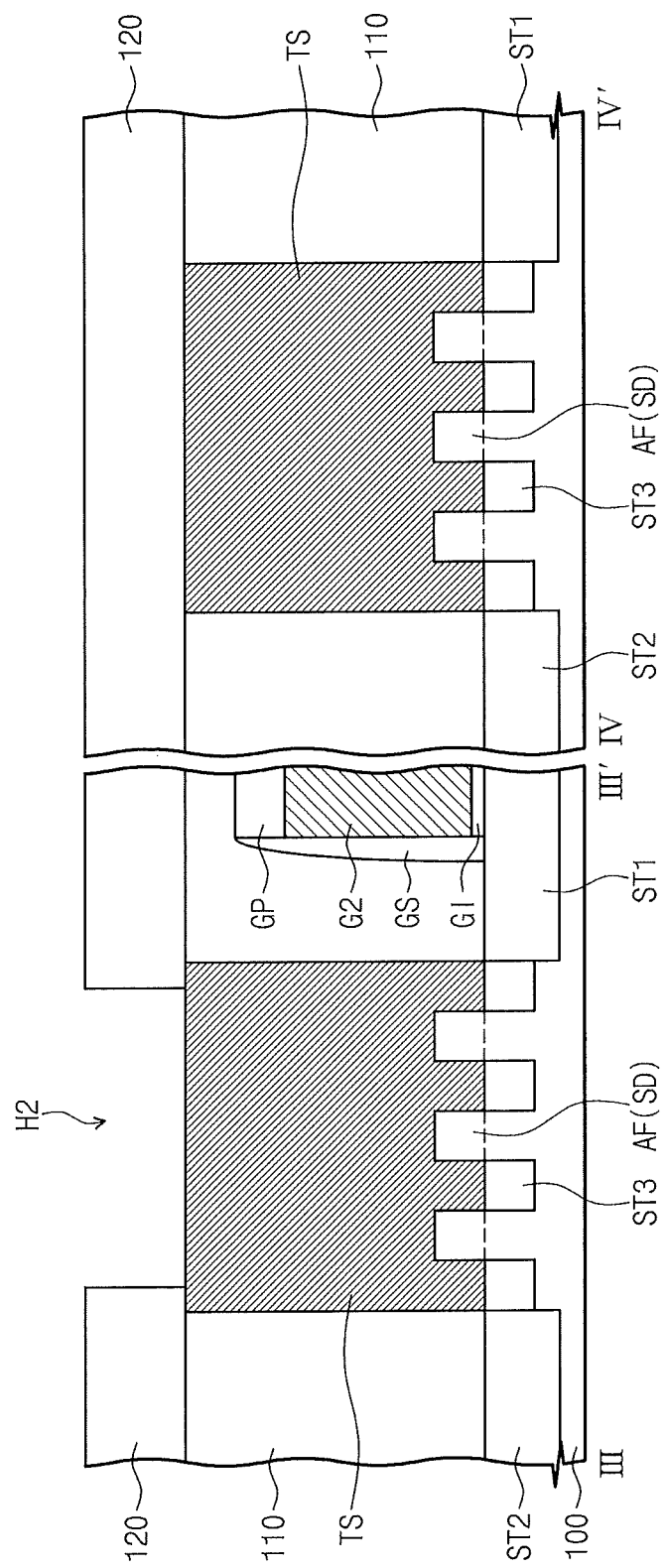
FIGS. 10B and 11B are cross-sectional views corresponding to lines III-III' and IV-IV' of FIG. 2 that illustrate a method of manufacturing the semiconductor device of FIGS. 9A and 9B.
Figure 10C:
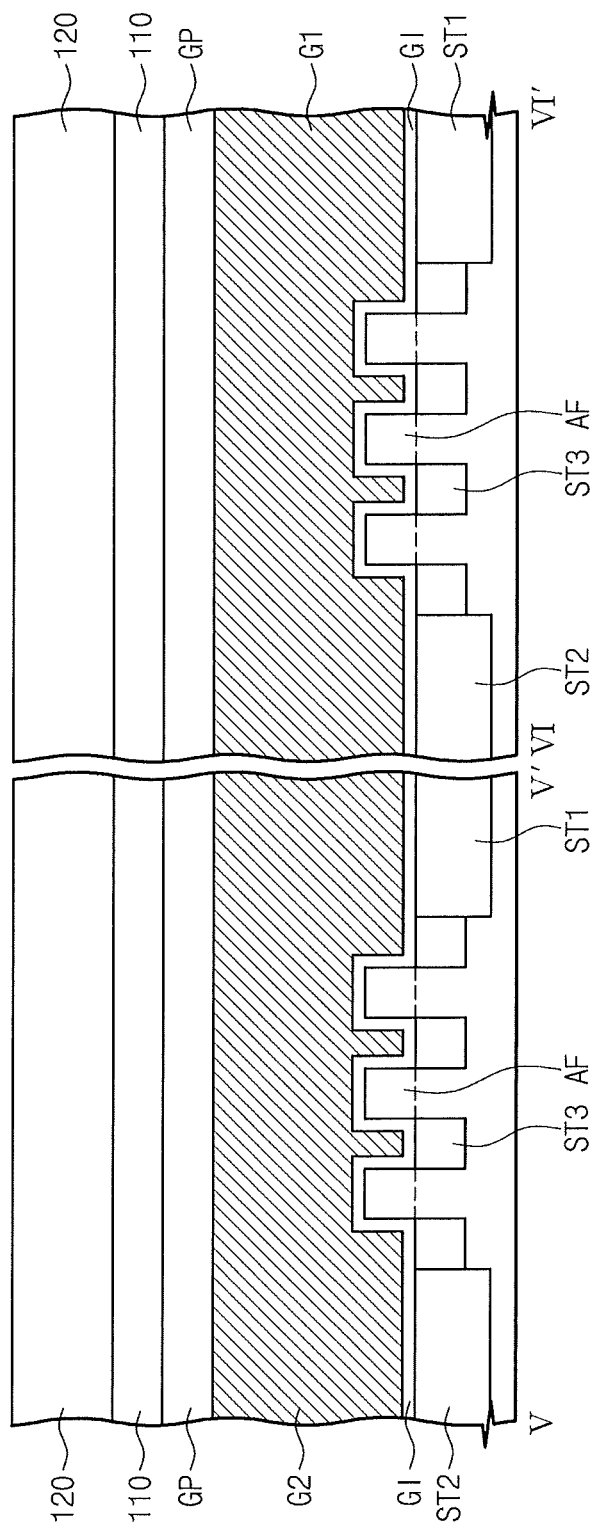
FIGS. 10C and 11C are cross-sectional views corresponding to lines V-V" and VI-VI' of FIG. 2 that illustrate a method of manufacturing the semiconductor device of FIGS. 9A and 9B.
Figure 11A:
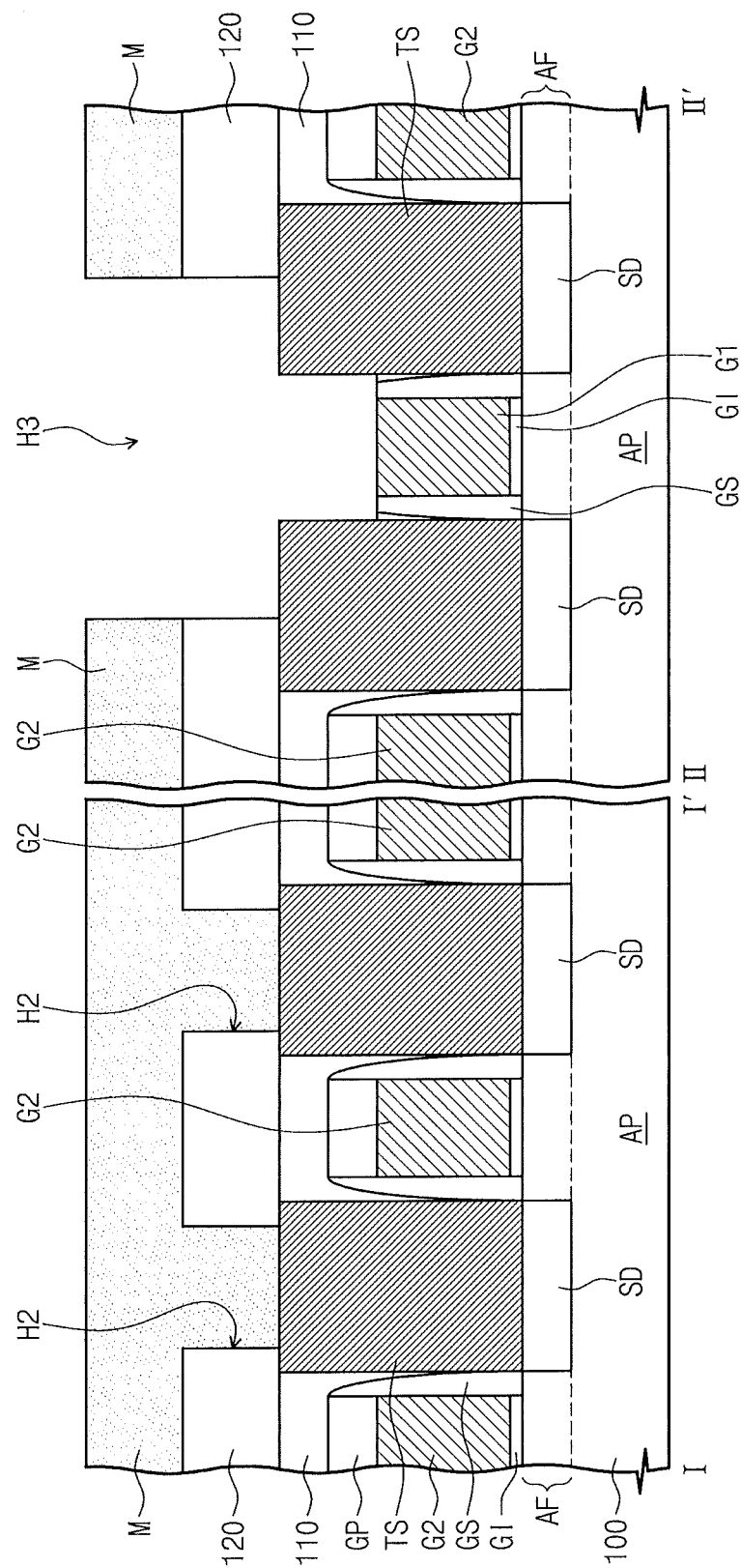
Figure 11B:
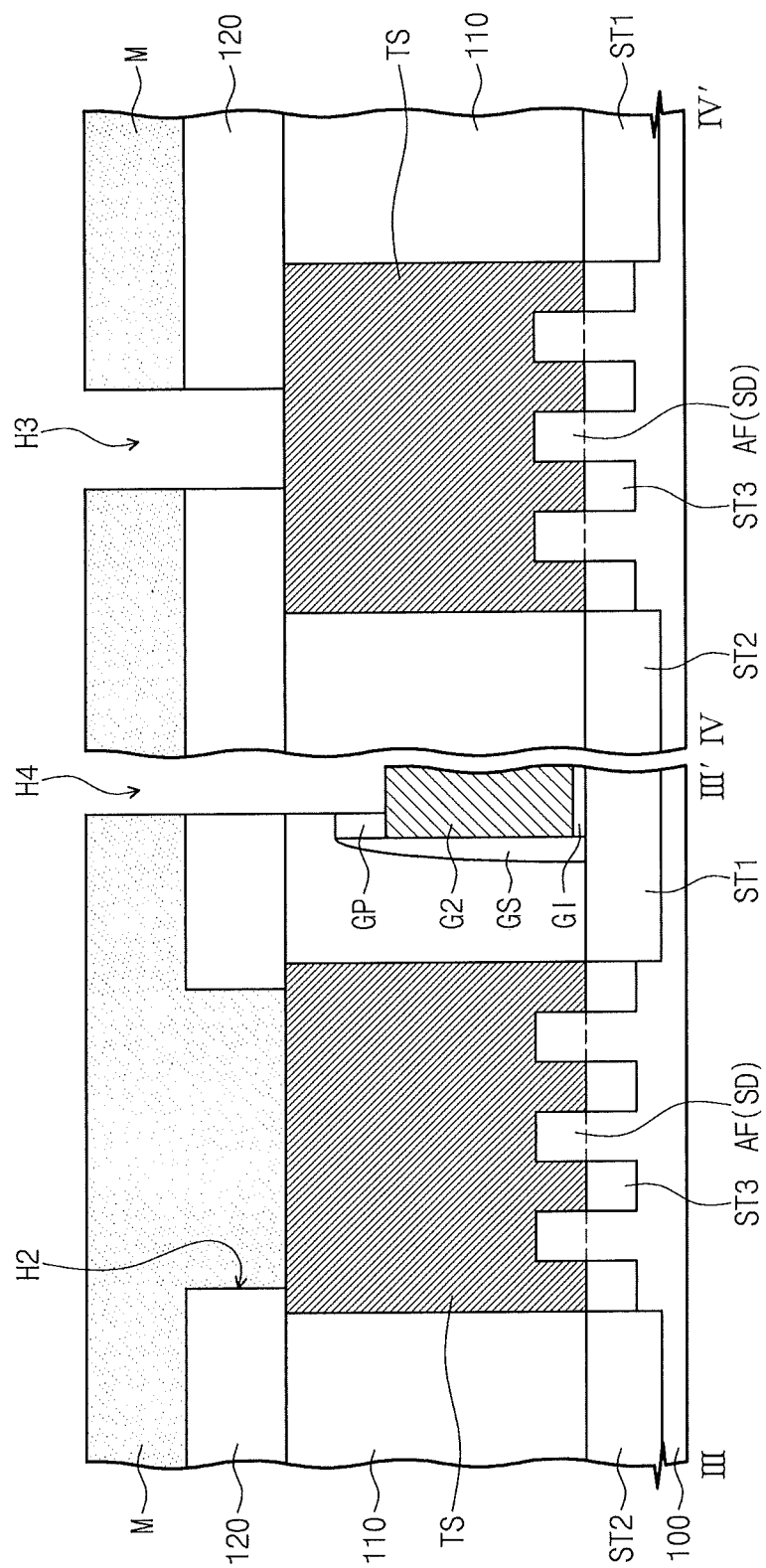
Figure 11C:
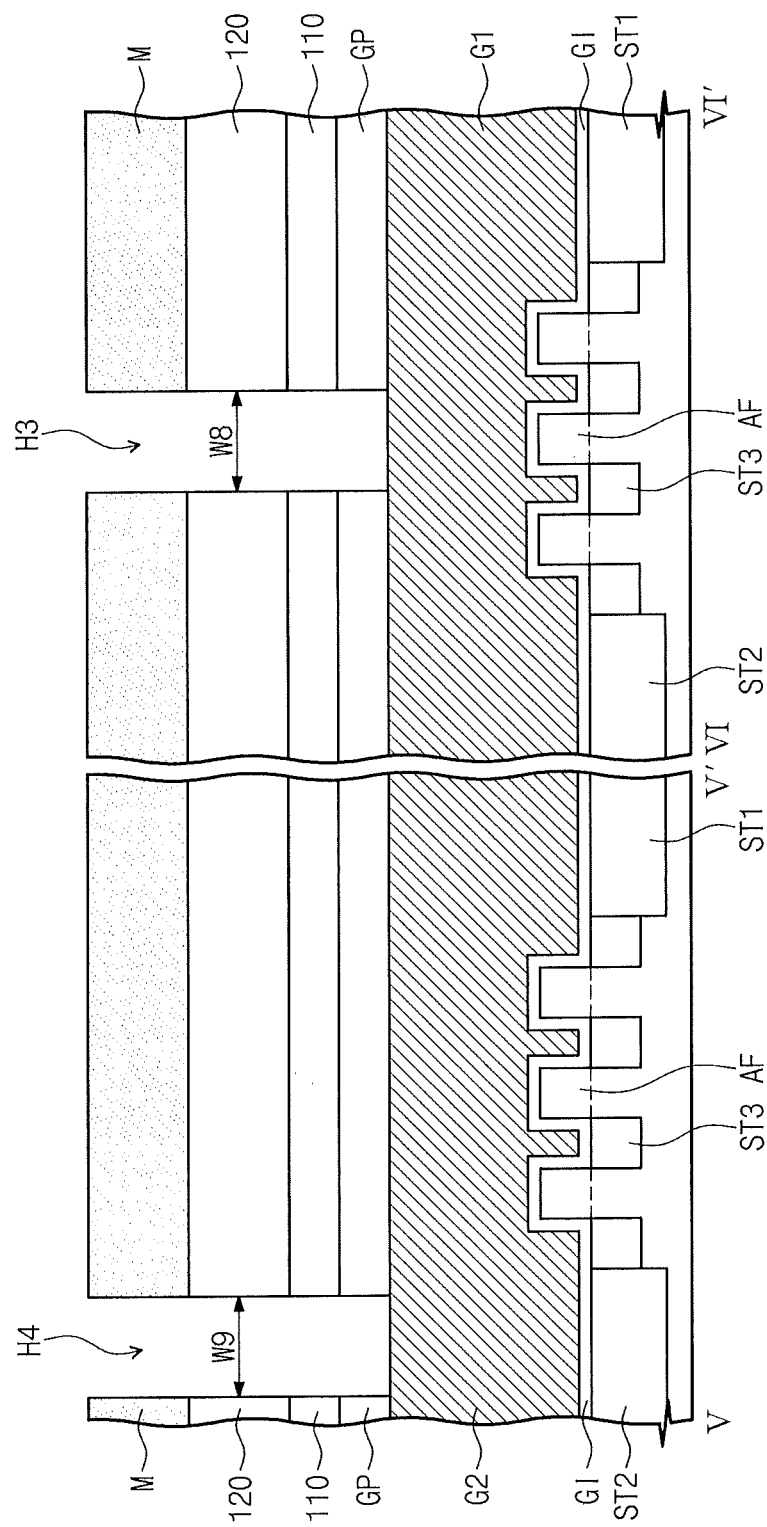

FIGS. 10A and 11A are cross-sectional views corresponding to lines I-I' and II-II' of FIG. 2 that illustrate a method of manufacturing the semiconductor device of FIGS. 9A and 9B. FIGS. 10B and 11B are cross-sectional views corresponding to lines III-III' and IV-IV' of FIG. 2 that illustrate a method of manufacturing the semiconductor device of FIGS. 9A and 9B. In the manufacturing method according to the present modified embodiment, cross-sectional views corresponding to lines V-V' and VI-VI' of FIG. 2 are the same as illustrated in FIGS. 7C and 8C. In the present modified embodiment, the same elements as described with reference to FIGS. 6A to 6C, 7A to 7C, and 8A to 8C are indicated by the same reference numerals or the same reference designators, and the descriptions thereto are omitted or mentioned briefly for the purpose of ease and convenience in explanation.

Referring again to FIGS. 6A, 6B, and 6C, first to third device isolation layers ST1, ST2, and ST3 may be formed in the substrate 100. The first device isolation layer ST1 may isolate the PMOSFET region PR and the NMOSFET region NR from each other. The second device isolation layer ST2 may isolate the first logic cell C1 from neighboring logic cells. The third device isolation layer ST3 may define the active patterns AP extending in the x-direction. The gate electrodes G1 and G2 may cross over the active patterns AP. The gate electrodes G1 and G2 may extend in the y-direction. The gate electrodes G1 and G2 may include the first gate electrode G1 at the jumper region JR of the first logic cell C1 and the second gate electrode G2 disposed at the second gate electrode G2 may be spaced apart from each other in the x-direction. The source/drain regions SD may be formed in the active patterns AP at both sides of each of the gate electrodes G1 and G2. The first interlayer insulating layer 110 may be formed on the substrate 100 for covering the gate electrodes G1 and G2. The connecting conductive patterns TS may be formed to penetrate the first interlayer insulating layer 110. The connecting conductive patterns TS may be directly or indirectly connected to the source/drain regions SD.

Referring to FIGS. 2, 10A-10C, and 7C, a second interlayer insulating layer 120 may be formed on the substrate 100 on which the connecting conductive patterns TS are positioned. The second interlayer insulating layer 120 of the circuit region CR may be patterned to form source/drain contact holes H2 which each expose a connecting conductive pattern TS adjacent the second gate electrode G2.

According to the present embodiment, unlike the embodiment described with reference to FIGS. 7A to 7C, the formation of the first sub-contact holes H1 at the jumper region JR may be omitted.

Referring to FIGS. 2, 11A-11C, and 8C, a mask layer M filling the source/drain contact holes H2 may be formed on the second interlayer insulating layer 120. A patterning process may be performed on the mask layer M at the jumper region JR to form a contact hole H3 that exposes the top surface of the first gate electrode G1. The contact hole H3 may extend in the x-direction to also expose the top surfaces of the connecting conductive patterns TS disposed at both sides of the first gate electrode G1. In other words, both edges of the contact holes H3 may overlap with the connecting conductive patterns TS, respectively. In addition, a patterning process may be performed on the mask layer M of the circuit region CR to form a gate contact hole H4 that exposes the top surface of the second gate electrode G2. The contact hole H3 and the gate contact hole H4 may be formed at the same time or at similar times. The contact hole H3 may have the eighth width W8 extending in the y-direction, and the gate contact hole H4 may have the ninth width W9 extending in the y-direction. In some embodiments, the eighth width W8 may be substantially equal to the ninth width W9.

Subsequent processes may be the same or similar as corresponding processes of the manufacturing method according to an embodiment described with reference to FIGS. 2, 3A, 3B, and 3C.

Figure 12A:
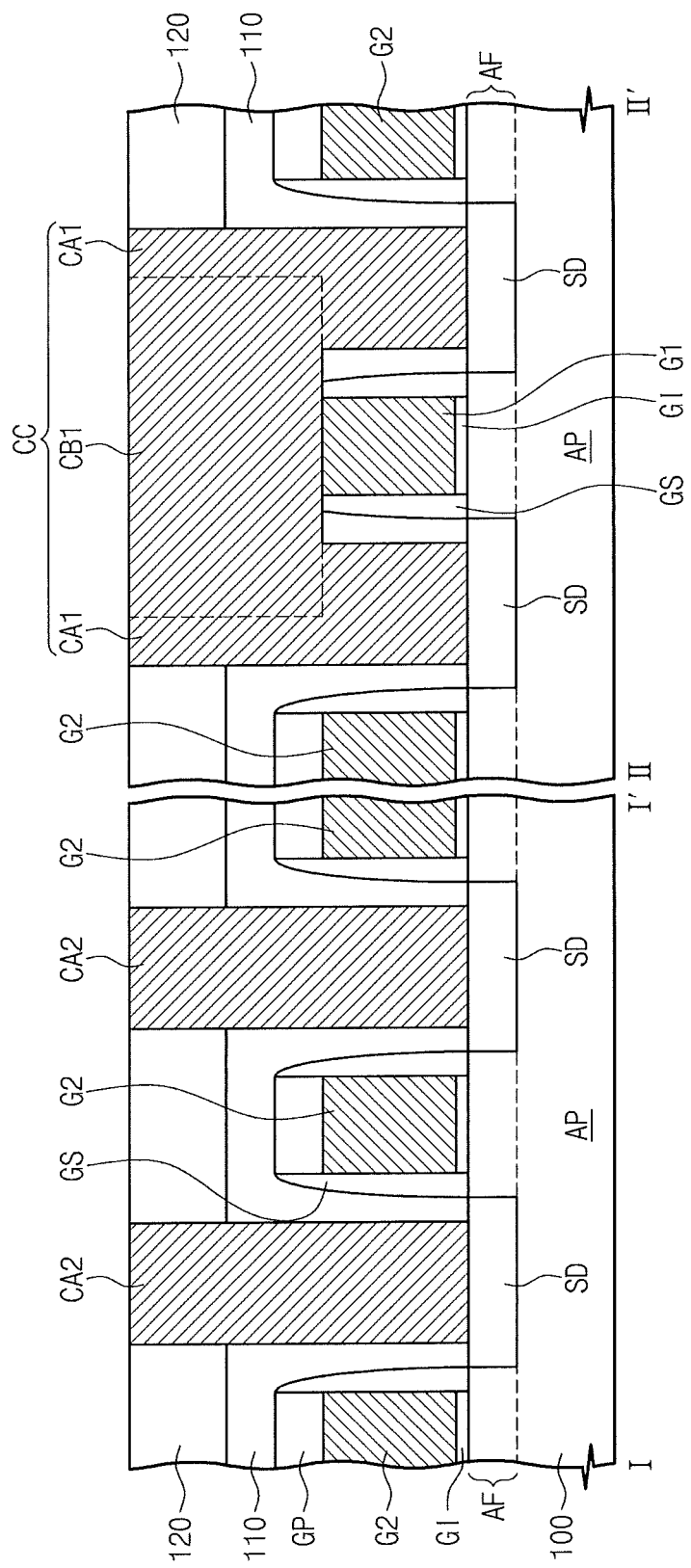
FIG. 12A is a cross-sectional view corresponding to lines I-I' and II-II' of FIG. 2 that illustrates another modified embodiment of a semiconductor device according to an embodiment of the inventive concepts.
Figure 12B:
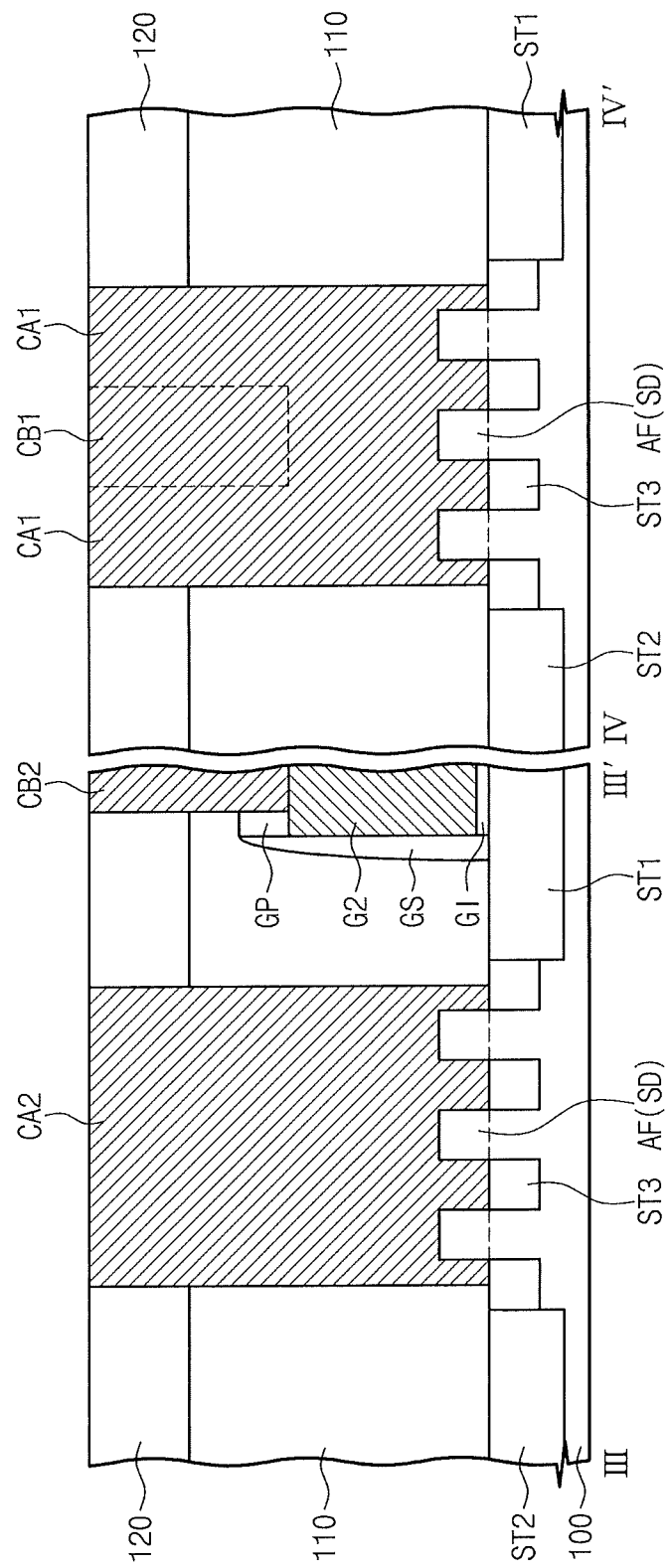
FIG. 12B is a cross-sectional view corresponding to lines III-III' and IV-IV' of FIG. 2 that illustrates another modified embodiment of a semiconductor device according to an embodiment of the inventive concepts.

FIG. 12A is a cross-sectional view corresponding to lines I-I' and II-II' of FIG. 2 that illustrate another modified embodiment of a semiconductor device according to an embodiment of the inventive concepts. FIG. 12B is a cross-sectional view corresponding to lines III-III' and IV-IV' of FIG. 2 that illustrate another modified embodiment of a semiconductor device according to an embodiment of the inventive concepts. A cross-sectional view, corresponding to lines V-V' and VI-VI' of FIG. 2, of a semiconductor device according to the present modified embodiment is the same as that illustrated in FIG. 3C. In the present modified embodiment, the same elements as described in the embodiment of FIGS. 1, 2, 3A to 3C, 4, and 5 are indicated by the same reference numerals or the same reference designators, and the descriptions thereto are omitted or mentioned briefly for the purpose of ease and convenience in explanation.

Referring to FIGS. 1, 2, 12A, 12B, and 3C, active patterns AP extend in an x-direction and are arranged in a y-direction on a substrate 100. Gate electrodes G1 and G2 may cross over the active patterns AP and to extend in the y-direction. The gate electrodes G1 and G2 may include a first gate electrode G1 at a jumper region JR and a second gate electrode G2 at a circuit region CR. The first and second gate electrodes G1 and G2 may be spaced apart from each other in the x-direction. Source/drain regions SD may be provided in the active patterns AP at both sides of each of the gate electrodes G1 and G2. Interlayer insulating layers 110 and 120 may be provided on the substrate 100 to cover the gate electrodes G1 and G2.

A connecting contact CC may be provided at the jumper region JR. The connecting contact CC may be in contact with a top surface of the first gate electrode G1 and may be connected to the source/drain regions SD provided at both sides of the first gate electrode G1. The connecting contact CC may include first sub-contacts CA1 respectively disposed at both sides of the first gate electrode G1 and a second sub-contact CB1 connecting the first sub-contacts CA1 to each other. Each of the first sub-contacts CA1 may be spaced apart from the first gate electrode G1 by a predetermined distance. The second sub-contact CB1 may be in contact with the top surface of the first gate electrode G1. Both ends (or both edges) of the second sub-contact CB1 may overlap with the first sub-contacts CA1, respectively. According to the present modified embodiment, the connecting contact CC may be in direct contact with the source/drain regions SD at both sides of the first gate electrode G1. In particular, unlike embodiments described above, the connecting conductive patterns TS provided at both sides of the first gate electrode G1 may be omitted in the present modified embodiment.

Source/drain contacts CA2 may be provided at both sides of the second gate electrode G2 in the circuit region CR. Each of the source/drain contacts CA2 may be in direct contact with the source/drain regions SD provided at each side of the second gate electrode G2. In particular, unlike embodiments described above, the connecting conductive patterns TS provided at both sides of the second gate electrode G2 may be omitted in the present modified embodiment.

According to the present modified embodiment, since the connecting conductive patterns provided at both sides each of the gate electrodes G1 and G2 are omitted, the connecting contact CC may be in direct contact with the source/drain regions SD at both sides of the first gate electrode G1, and the source/drain contacts CA2 may be in direct contact with the source/drain regions SD at both sides of the second gate electrode G2.

Figure 13A:
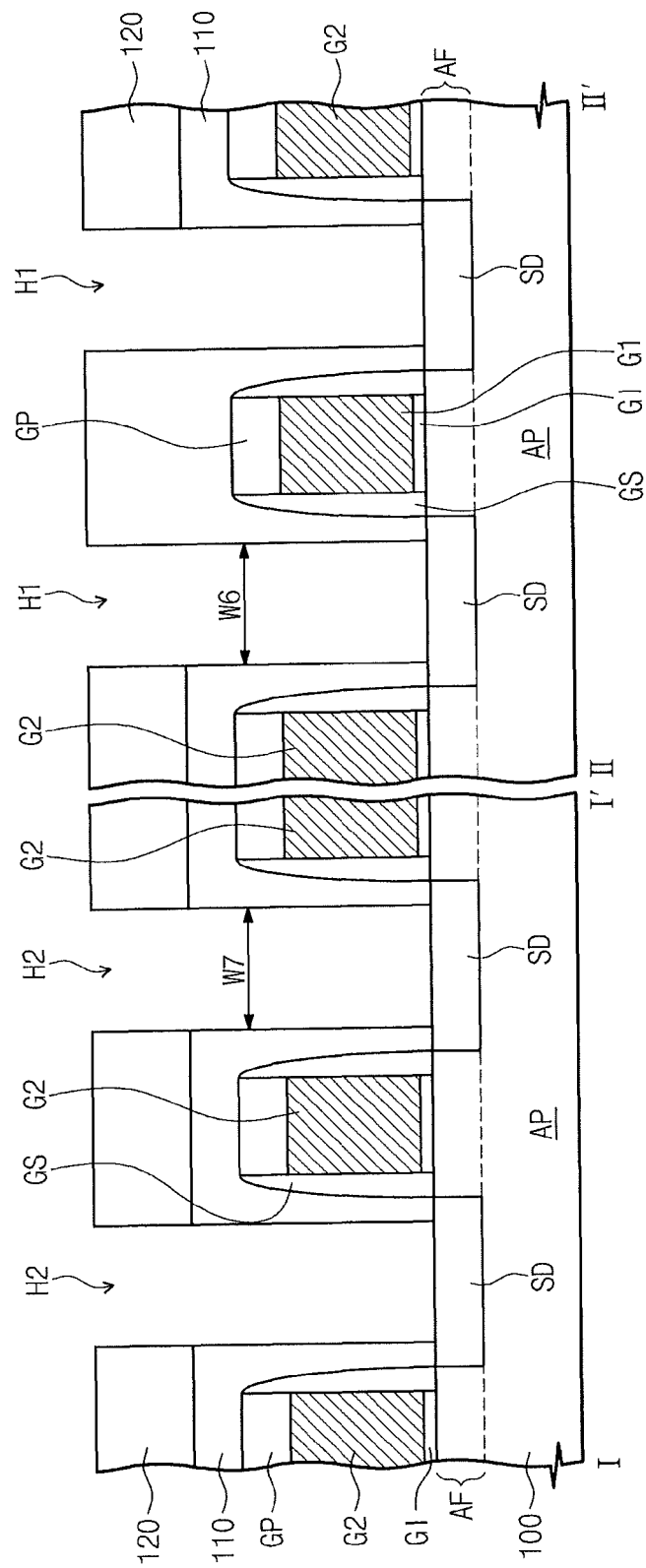
FIGS. 13A and 14A are cross-sectional views corresponding to lines I-I' and II-II' of FIG. 2 that illustrate a method of manufacturing the semiconductor device of FIGS. 12A and 12B.
Figure 13B:
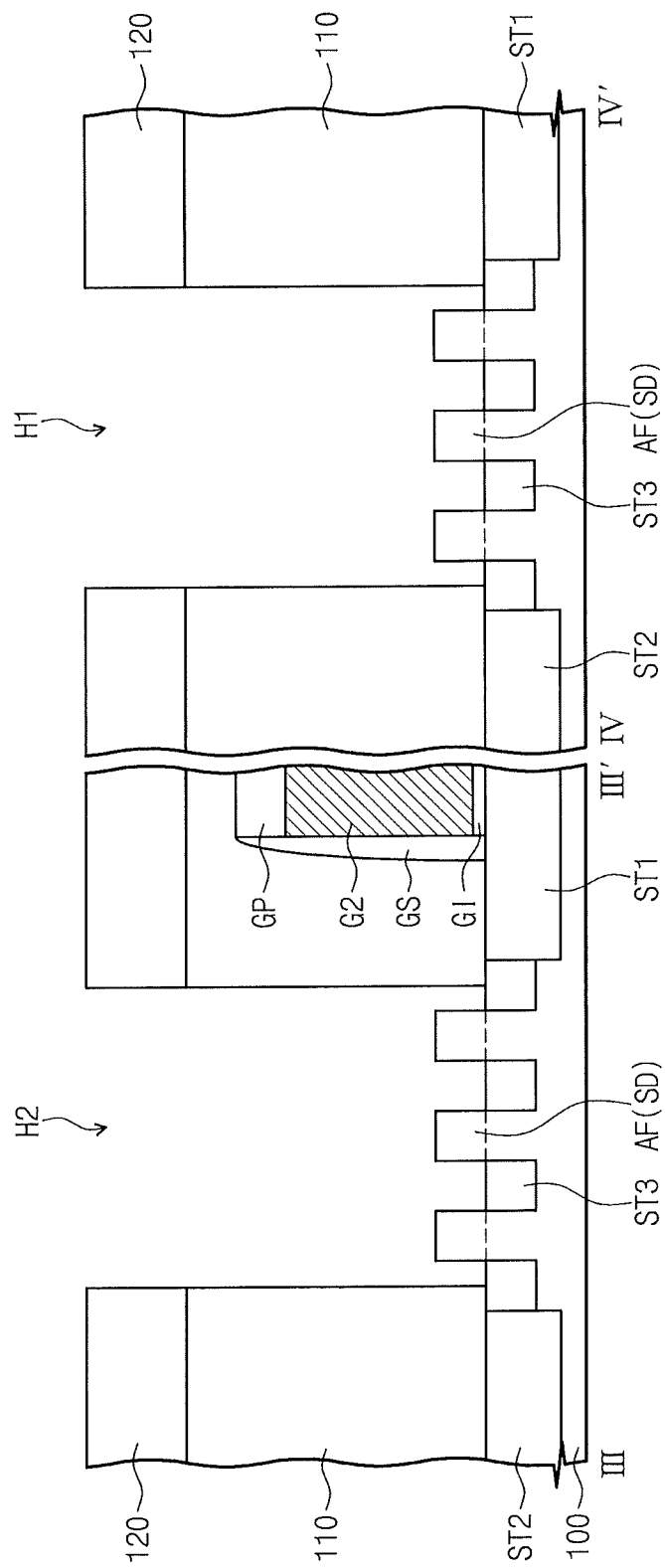
FIGS. 13B and 14B are cross-sectional views corresponding to lines III-III' and IV-IV' of FIG. 2 that illustrate a method of manufacturing the semiconductor device of FIGS. 12A and 12B.
Figure 13C:
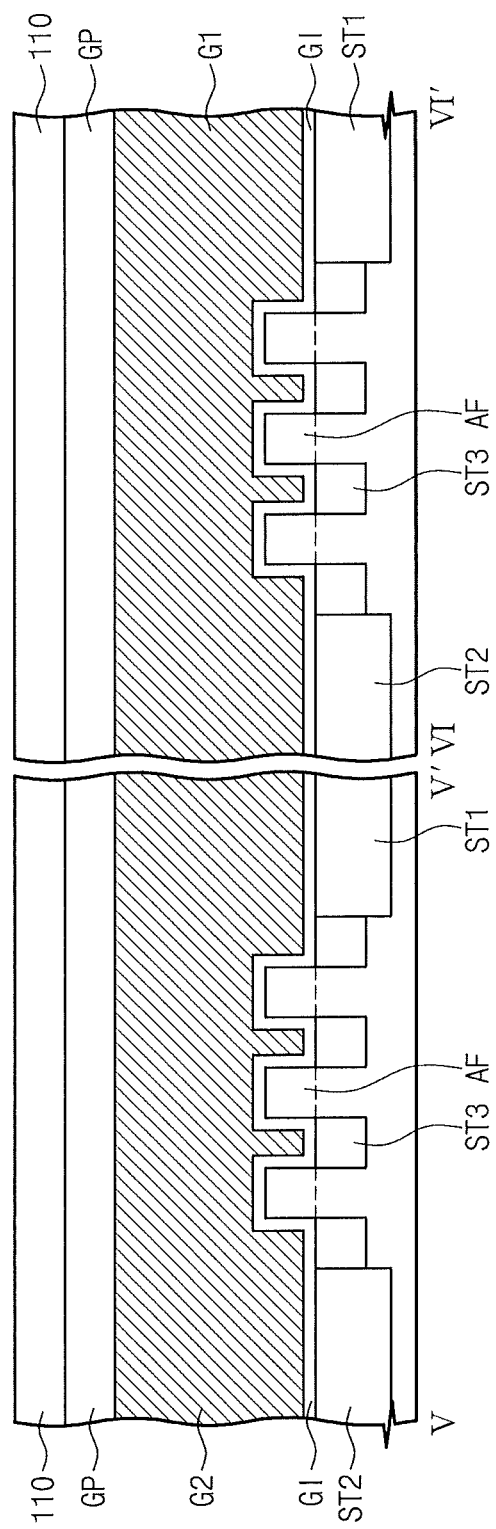
FIGS. 13C and 14C are cross-sectional views corresponding to lines V-V' and VI-VI' of FIG. 2 that illustrate a method of manufacturing the semiconductor device of FIGS. 12A and 12B.
Figure 14A:
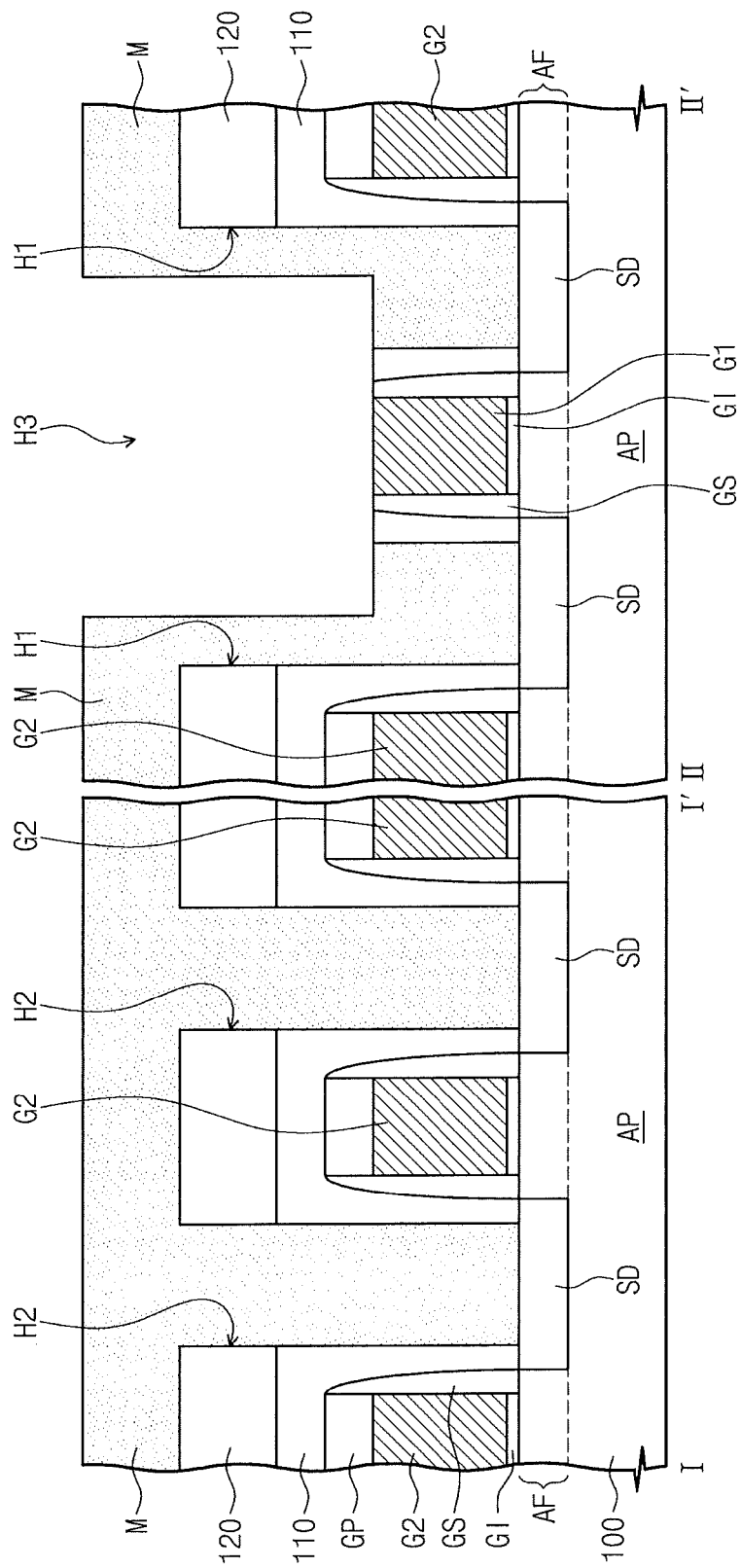
Figure 14B:
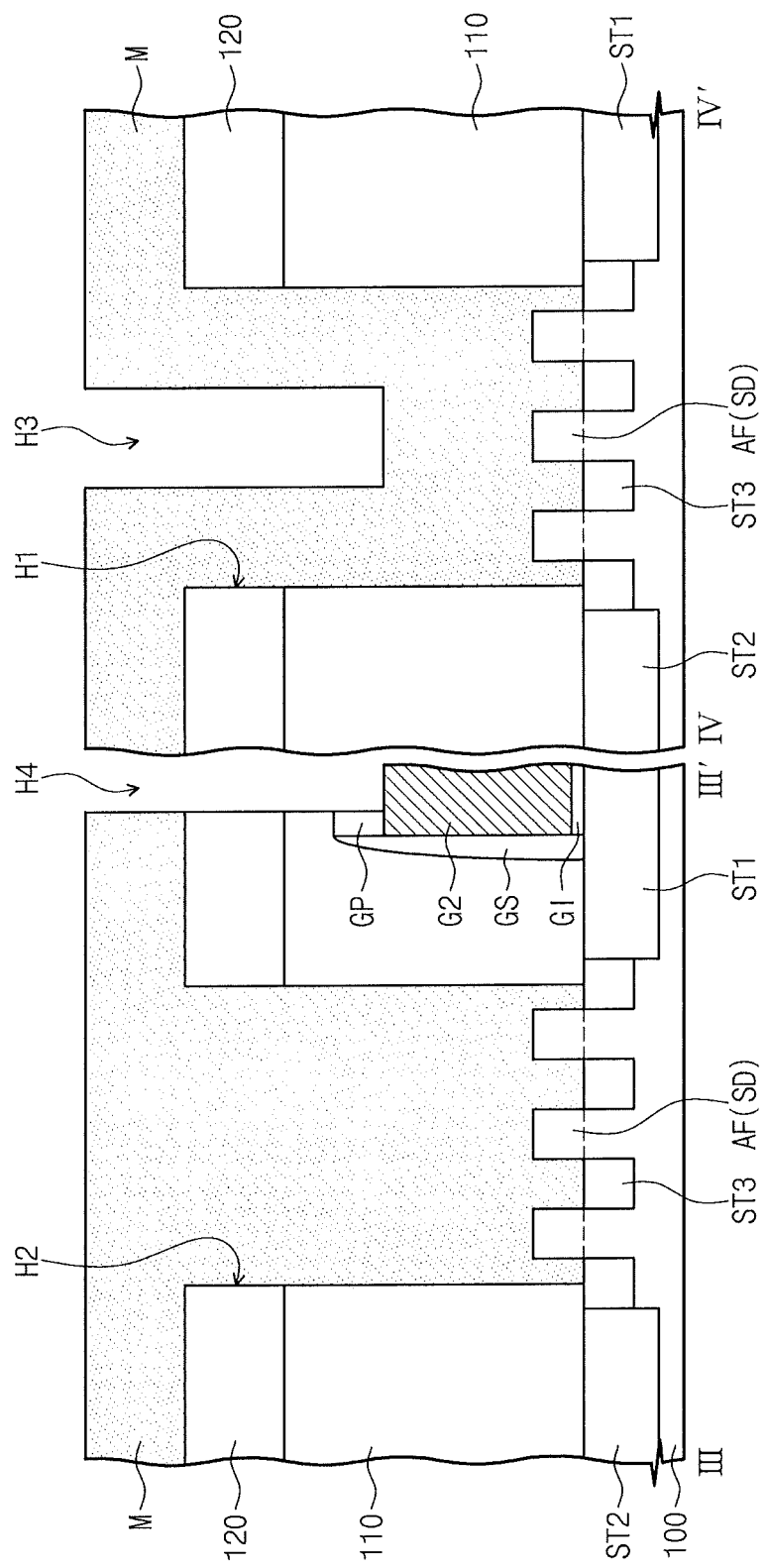
Figure 14C:
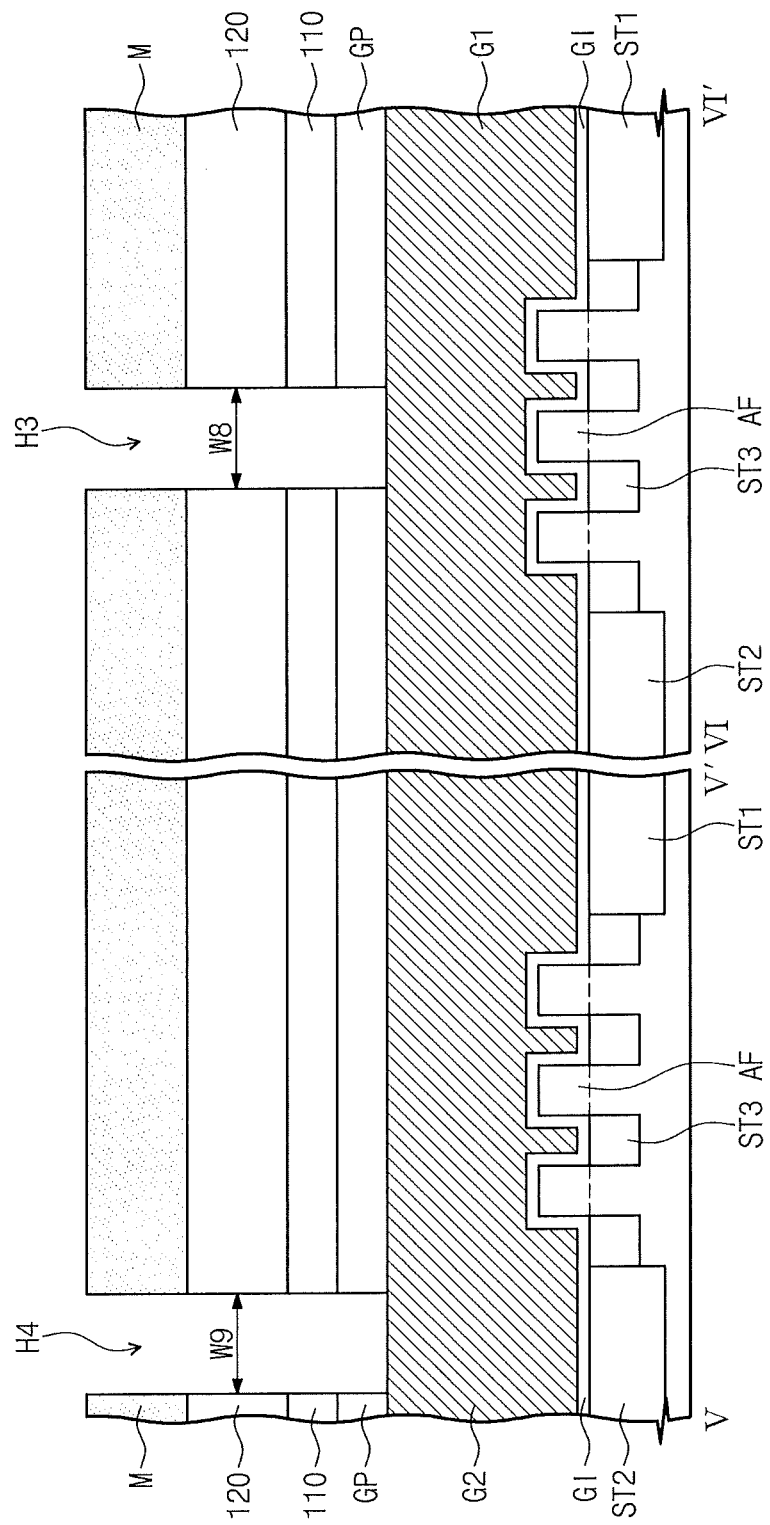

FIGS. 13A and 14A are cross-sectional views corresponding to lines I-I' and II-II' of FIG. 2 that illustrate a method of manufacturing the semiconductor device of FIGS. 12A and 12B. FIGS. 13B and 14B are cross-sectional views corresponding to lines III-III' and IV-IV' of FIG. 2 that illustrate a method of manufacturing the semiconductor device of FIGS. 12A and 12B. In the manufacturing method according to the present modified embodiment, cross-sectional views corresponding to lines V-V' and VI-VI' of FIG. 2 are the same as illustrated in FIGS. 7C and 8C. In the present modified embodiment, the same elements as described with reference to FIGS. 6A to 6C, 7A to 7C, and 8A to 8C are indicated by the same reference numerals or the same reference designators, and the descriptions thereto are omitted or mentioned briefly for the purpose of ease and convenience in explanation.

Referring to FIGS. 2, 13A-13C, and 7C, first to third device isolation layers ST1, ST2, and ST3 may be formed in the substrate 100. The first device isolation layer ST1 may isolate the PMOSFET region PR and the NMOSFET region NR from each other. The second device isolation layer ST2 may isolate the first logic cell C1 from neighboring logic cells. The third device isolation layer ST3 may define the active patterns AP extending in the x-direction. Gate electrodes G1 and G2 extend in the y-direction and may cross over the active patterns AP. The gate electrodes G1 and G2 may include the first gate electrode G1 formed at the jumper region JR of the first logic cell C1 and the second gate electrode G2 formed at the circuit region CR of the first logic cell C1. The first and second gate electrodes G1 and G2 may be spaced apart from each other in the x-direction. The source/drain regions SD may be formed in the active patterns AP at both sides of each of the gate electrodes G1 and G2. First and second interlayer insulating layers 110 and 120 may be formed on the substrate 100 for covering the gate electrodes G1 and G2.

The second and first interlayer insulating layers 120 and 110 at the jumper region JR may be patterned to form first sub-contact holes H1 which expose the source/drain regions SD at both sides of the first gate electrode G1. The second and first interlayer insulating layers 120 and 110 of the circuit region CR may be patterned to form source/drain contact holes H2, which expose the source/drain regions SD at both sides of the second gate electrode G2. The first sub-contact hoes H1 and the source/drain contact holes H2 may be formed at the same time or at similar times. According to the present modified embodiment, the first sub-contact hoes H1 and the source/drain contact holes H2 may be formed to expose top surfaces of the source/drain regions SD.

Each of the first sub-contact holes H1 and the source/drain contact holes H2 may extend in the y-direction. Each of the first sub-contact hoes H1 may have a sixth width W6 extending in the x-direction. The sixth width W6 may correspond to a distance between inner sidewalls of the first sub-contact hole H1, which are spaced apart from each other in the x-direction. Each of the source/drain contact holes H2 may have a seventh width W7 extending in the x-direction. The seventh width W7 may correspond to a distance between inner sidewalls of the source/drain contact hole H2, which are spaced apart from each other in the x-direction. In some embodiments, the sixth width W6 may be substantially equal to the seventh width W7.

Referring to FIGS. 2, 14A-14C, and 8C, a mask layer M may partially or completely fill the first sub-contact holes H1 and the source/drain contact holes H2 and may be formed on the second interlayer insulating layer 120. The mask layer M may include, for example, a SOH material.

The mask layer M at the jumper region JR may be patterned to form a second sub-contact hole H3 exposing the top surface of the first gate electrode G1. The second sub-contact hole H3 may extend in the x-direction so as to be connected to the first sub-contact holes H1. When viewed from a plan view, both ends of the second sub-contact hole H3 may overlap with the first sub-contact holes H1, respectively. The mask layer M of the circuit region CR may be patterned to form a gate contact hole H4 that exposes the top surface of the second gate electrode G2. The gate contact hole H4 may be spaced apart from the source/drain contact holes H2. The second sub-contact hole H3 and the gate contact hole H4 may be formed at the same time or at similar times.

The second sub-contact hole H3 may have an eighth width W8 extending in the y-direction. The eighth width W8 may correspond to a distance between inner sidewalls of the second sub-contact hole H3, which are spaced apart from each other in the y-direction. The gate contact hole H4 may have a ninth width W9 extending in the y-direction. The ninth width W9 may correspond to a distance between inner sidewalls of the gate contact holes H4, which are spaced apart from each other in the y-direction. In some embodiments, the eighth width W8 may be substantially equal to the ninth width W9.

Subsequent processes may be the same or similar as corresponding processes of the manufacturing method according to the embodiment described with reference to FIGS. 2, 3A, 3B, and 3C.

Figure 15:
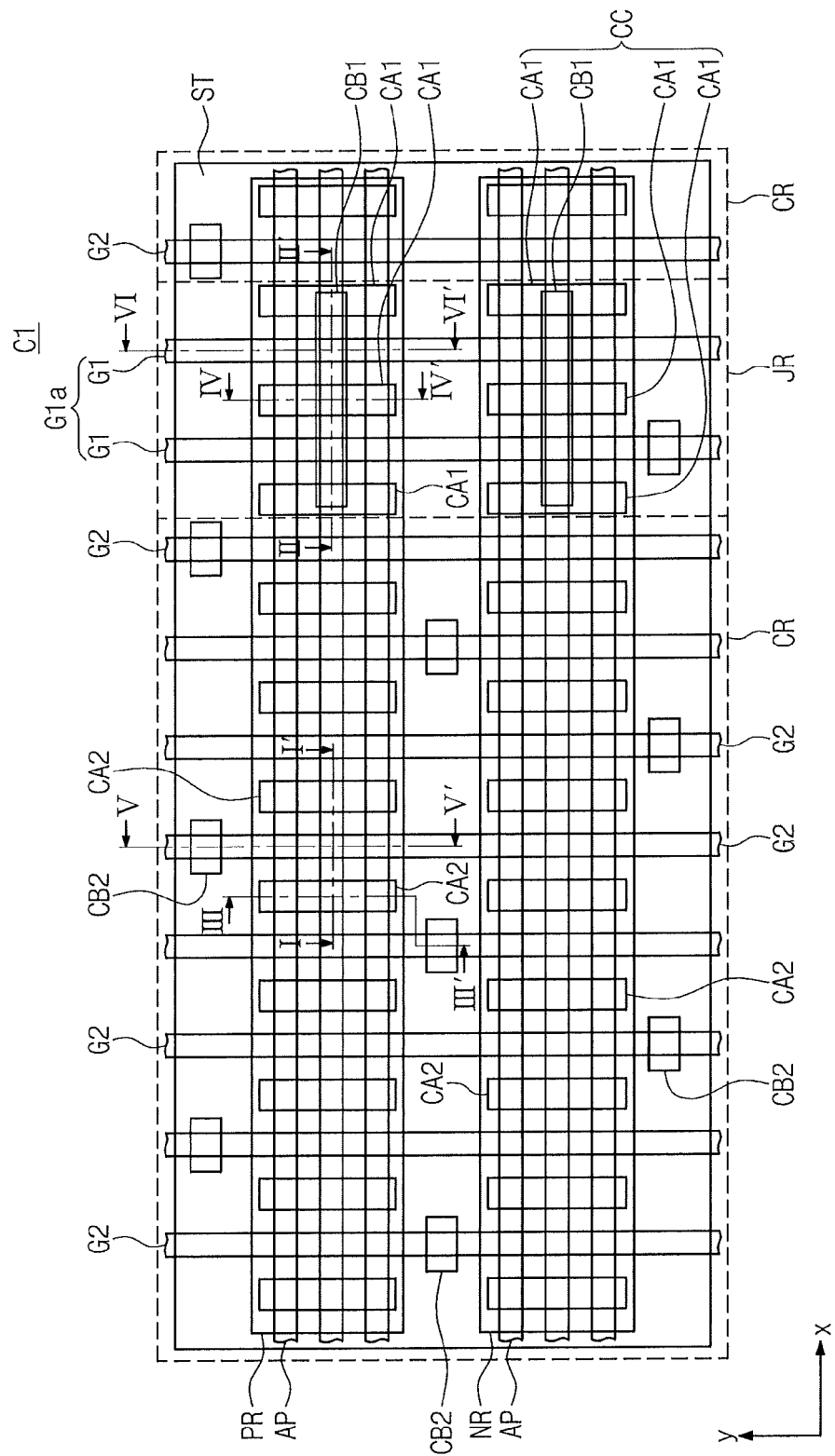
FIG. 15 is a plan view of a first logic cell of FIG. 1 that illustrates a semiconductor device according to an embodiment of the inventive concepts.
Figure 16:
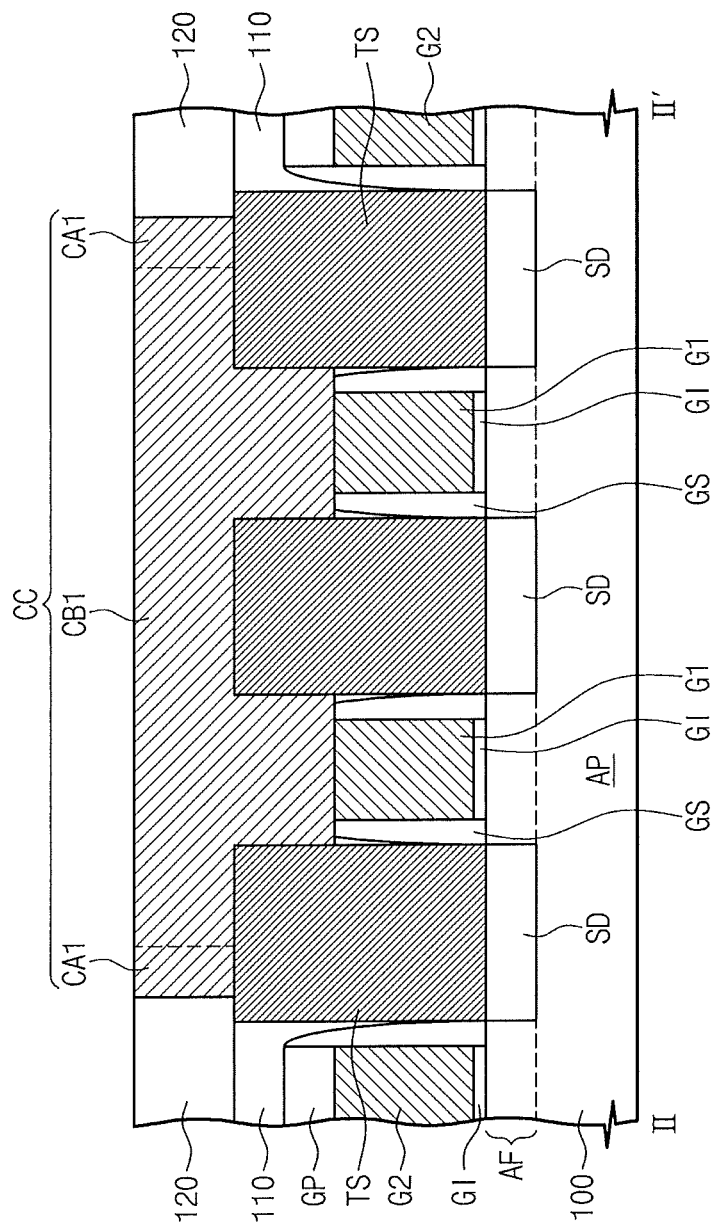
FIG. 16 is a cross-sectional view taken along a line II-II of FIG. 15.

FIG. 15 is a plan view of a first logic cell of FIG. 1 that illustrates a semiconductor device according to an embodiment of the inventive concepts. FIG. 16 is a cross-sectional view taken along a line II-II of FIG. 15. Cross-sectional views taken along lines I-I', III-III', IV-IV', V-V', and VI-VI' of FIG. 15 are the same or similar as those illustrated in FIGS. 3A, 3B, and 3C. In the present embodiment, the same elements as described in the embodiment of FIGS. 1, 2, 3A to 3C, 4, and 5 are indicated by the same reference numerals or the same reference designators, and the descriptions thereto are omitted or mentioned briefly for the purpose of ease and convenience in explanation.

Referring to FIGS. 15, 3A to 3C, and 16, active patterns AP extending in an x-direction and arranged in a y-direction may be provided on a substrate 100. One or more gate electrodes G1 and G2 may cross over the active patterns AP and extend in the y-direction. The gate electrodes G1 and G2 may include a first gate electrode G1 in a jumper region JR and a second gate electrode G2 in a circuit region CR. Although two first gate electrodes G1 is illustrated in FIGS. 15 and 16, the inventive concepts are not limited thereto. The first gate electrodes G1 and the second gate electrode G2 may be spaced apart from each other in the x-direction. Source/drain regions SD may be provided in the active patterns AP at both sides each of the gate electrodes G1 and G2.

Connecting conductive patterns TS may be provided at both sides of each of the gate electrodes G1 and G2, respectively. Each of the connecting conductive patterns TS may electrically connect the source/drain regions SD, which are spaced apart from each other in the y-direction, to each other. A first interlayer insulating layer 110 may be provided on the substrate 100. The first interlayer insulating layer 110 may cover the gate electrodes G1 and G2 and the connecting conductive patterns TS.

The first gate electrodes G1 may be defined as a first gate electrode group G1a. A connecting contact CC may be provided at the jumper region JR. The connecting contact CC may be in contact with top surfaces of the first gate electrodes G1 and may be connected to the source/drain regions SD provided at both sides of the first gate electrode group G1a. The connecting contact CC may also be connected to the source/drain regions SD provided between the first gate electrodes G1. The connecting contact CC may be electrically connected to the source/drain regions SD through the connecting conductive patterns TS at both sides of the first gate electrode group G1a and the connecting conductive pattern TS between the first gate electrodes G1. In other words, the plurality of first gate electrodes G1, the source/drain regions SD at the both sides of the first gate electrode group G1a, and the source/drain regions SD between the first gate electrodes G1 may be in an equipotential state by the connecting contact CC. Thus, the plurality of first gate electrodes G1 may include dummy gate electrodes which do not form a logic circuit. The connecting contact CC may function as a jumper which connects logic circuits. The first gate electrode G1 corresponding to a dummy gate electrode may be provided at the jumper region JR. The first gate electrodes G1 and the source/drain regions SD between the first gate electrodes G1 may be connected to by the connecting contact CC.

The connecting contact CC may include first sub-contacts CA1 at both sides of the first gate electrode group G1a and between the first gate electrodes G1. In addition, the connecting contact CC may further include a second sub-contact CB1 that electrically connects the first sub-contacts CA1 to each other. The first sub-contacts CA1 may be spaced apart from the first gate electrodes G1. The second sub-contact CB1 may be in contact with the top surfaces of the first gate electrodes G1 and may overlap with the first sub-contacts CA1. The first sub-contacts CA1 and the second sub-contact CB1 may include the same material and may be connected to each other to form a united body.

When viewed from a plan view, each of the first sub-contacts CA1 may have a bar shape extending in the y-direction. The second sub-contact CB1 may have a bar shape extending in the x-direction.

Figure 17:
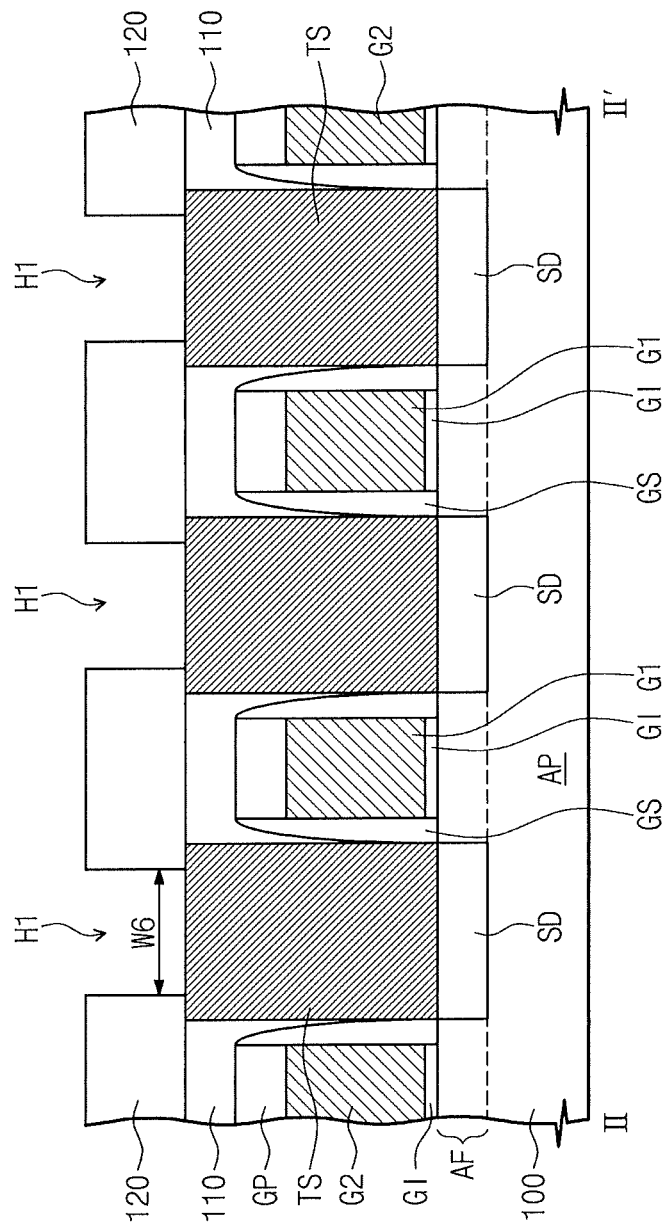
FIGS. 17 and 18 are cross-sectional views corresponding to a line II-II of FIG. 15 that illustrate a method of manufacturing a semiconductor device according to an embodiment of the inventive concepts.
Figure 18:
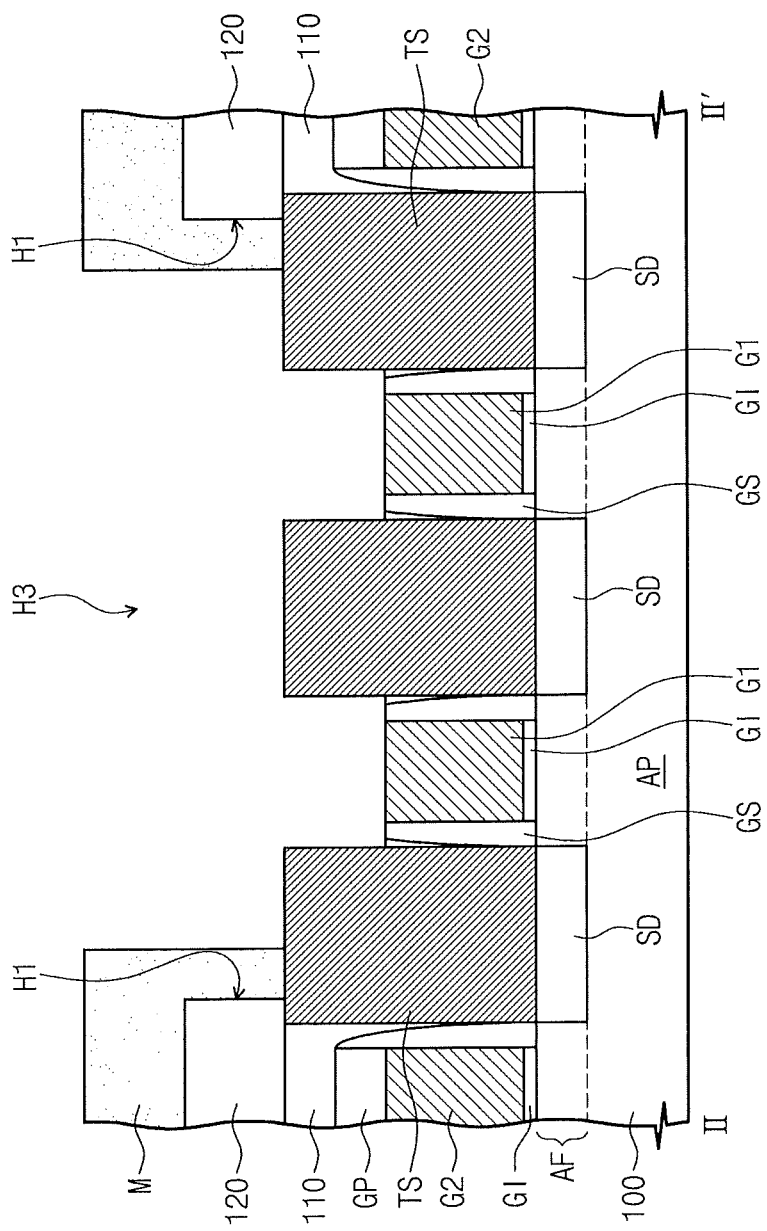

FIGS. 17 and 18 are cross-sectional views corresponding to a line II-II of FIG. 15 that illustrate a method of manufacturing a semiconductor device according to an embodiment of the inventive concepts. In the manufacturing method according to the present embodiment, other cross-sectional views corresponding to lines I-I', III-III', IV-IV', V-V', and VI-VI' of FIG. 15 are the same or similar as those illustrated in FIGS. 7A to 7C and 8A to 8C. In the present embodiment, the same elements as described in the embodiment of FIGS. 6A to 6C, 7A to 7C, and 8A to 8C are indicated by the same reference numerals or the same reference designators, and the descriptions thereto are omitted or mentioned briefly for the purpose of ease and convenience in explanation.

Referring to FIGS. 15, 7A, 7B, 7C, and 17, gate electrodes G1 and G2 may be formed on the substrate 100 to cross over the active patterns AP and to extend in the y-direction. The gate electrodes G1 and G2 may include a first gate electrode G1 at a jumper region JR of a first logic cell C1 and a second gate electrode G2 at a circuit region CR of the first logic cell C1. According to the present embodiment, a plurality of first gate electrodes G1 may be provided at the jumper region JR. The plurality of first gate electrodes G1 and the second gate electrode G2 may be spaced apart from each other in the x-direction. Source/drain regions SD may be formed in the active regions AP at both sides of each of the gate electrodes G1 and G2. A first interlayer insulating layer 110 may be formed on the substrate 100 so as to partially or completely cover the gate electrodes G1 and G2. Connecting conductive patterns TS may penetrate the first interlayer insulating layer 110. The connecting conductive patterns TS may be directly or indirectly connected to the source/drain regions SD. A second interlayer insulating layer 120 may be formed on the substrate 100 having the connecting conductive patterns TS.

The plurality of first gate electrodes G1 may be defined as a first gate electrode group G1a. The second interlayer insulating layer 120 at the jumper region JR may be patterned to form one or more first sub-contact holes H1 which expose the connecting conductive patterns TS disposed at both sides of the first gate electrode group G1a and the connecting conductive pattern TS disposed between the first gate electrodes G1, respectively. Also, the second interlayer insulating layer 120 at the circuit region CR may be patterned to form one or more source/drain contact holes H2 which expose the connecting conductive patterns TS disposed at both sides of the second gate electrode G2. The first sub-contact hoes H1 and the source/drain contact holes H2 may be formed at the same time or at similar times. Each of the first sub-contact hoes H1 may have a sixth width W6 corresponding to a distance between inner sidewalls, which are spaced apart from each other in the x-direction, of each of the first sub-contact holes H1. Each of the source/drain contact holes H2 may have a seventh width W7 corresponding to a distance between inner sidewalls, which are spaced apart from each other in the x-direction, of each of the source/drain contact holes H2. In some embodiments, the sixth width W6 may be substantially equal to the seventh width W7.

Referring to FIGS. 15, 8A to 8C, and 18, a mask layer M may partially or completely fill the first sub-contact holes H1 and the source/drain contact holes H2, and may be formed on the second interlayer insulating layer 120. The mask layer M at the jumper region JR may be patterned to form a second sub-contact hole H3 that exposes the top surfaces of the first gate electrodes G1. When viewed from a plan view, the second sub-contact hole H3 may extend in the x-direction so as to be connected to the first sub-contact holes H1. In addition, the mask layer M at the circuit region CR may be patterned to form a gate contact hole H4 that exposes the top surface of the second gate electrode G2. The gate contact hole H4 may be spaced apart from the source/drain contact holes H2. The second sub-contact hole H3 and the gate contact hole H4 may be formed at the same time or at similar times.

The second sub-contact hole H3 may have an eighth width W8 corresponding to a distance between inner sidewalls, which are spaced apart from each other in the y-direction, of the second sub-contact hole H3. The gate contact hole H4 may have a ninth width W9 corresponding to a distance between inner sidewalls, which are spaced apart from each other in the y-direction, of the gate contact hole H4. In some embodiments, the eighth width W8 may be substantially equal to the ninth width W9.

Subsequent processes may be the same as corresponding processes of the manufacturing method according to the embodiment described with reference to FIGS. 2, 3A, 3B, and 3C.

Figure 19:
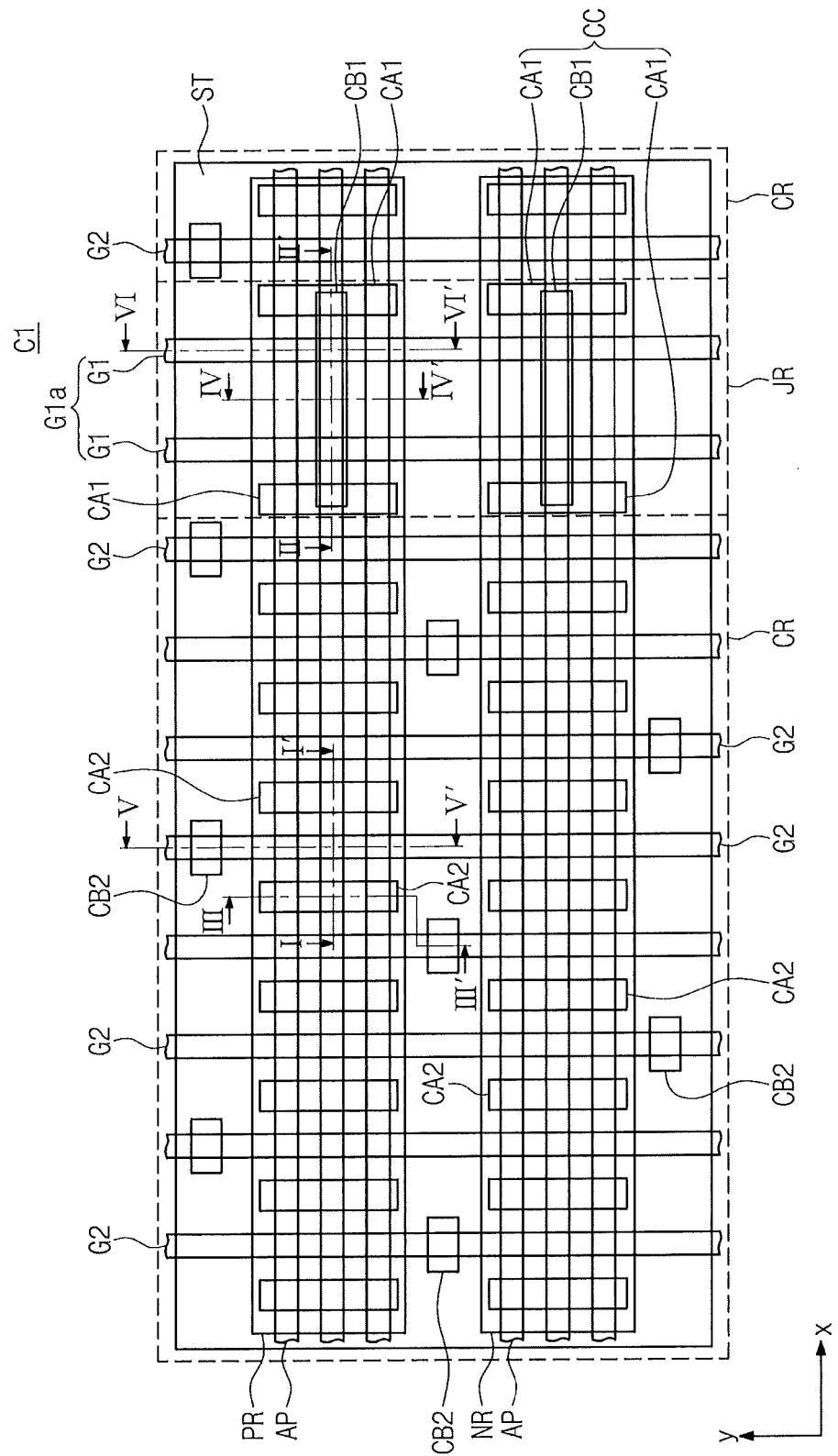
FIG. 19 is a plan view of a first logic cell of FIG. 1 that illustrates a semiconductor device according to another embodiment of the inventive concepts.
Figure 20:
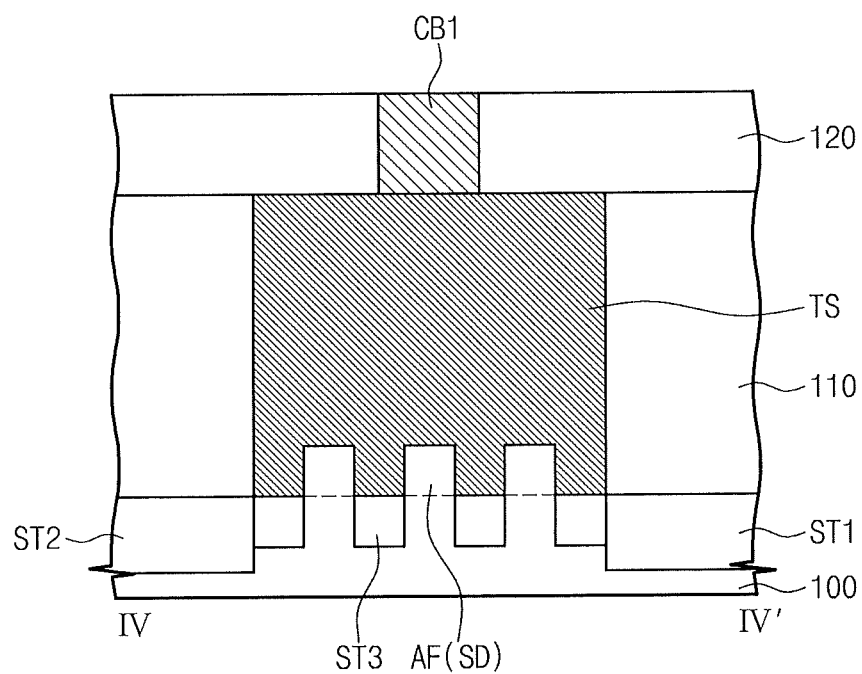
FIG. 20 is a cross-sectional view taken along a line IV-IV of FIG. 19.

FIG. 19 is a plan view of a first logic cell of FIG. 1 that illustrates a semiconductor device according to another embodiment of the inventive concepts. FIG. 20 is a cross-sectional view taken along a line IV-IV of FIG. 19. Cross-sectional views taken along lines I-I', III-III', V-V', and VI-VI' of FIG. 19 are the same or similar as those illustrated in FIGS. 3A, 3B, and 3C. A cross-sectional view taken along a line II-II' of FIG. 19 is the same as that illustrated in FIG. 16. In the present embodiment, the same elements as described in the embodiment of FIGS. 1, 2, 3A to 3C, 4, and 5 are indicated by the same reference numerals or the same reference designators, and the descriptions thereto are omitted or mentioned briefly for the purpose of ease and convenience in explanation.

Referring to FIGS. 19, 3A to 3C, 16, and 20, active patterns AP extend in an x-direction and are arranged in a y-direction, and may be provided on a substrate 100. Gate electrodes G1 and G2 cross over the active patterns AP and extend in the y-direction. The gate electrodes G1 and G2 may include a first gate electrode G1 at a jumper region JR and a second gate electrode G2 at a circuit region CR. According to the present embodiment, a plurality of first gate electrodes G1 may be at the jumper region JR. The plurality of first gate electrodes G1 and the second gate electrode G2 may be spaced apart from each other in the x-direction. Source/drain regions SD may be provided in the active patterns AP at both sides each of the gate electrodes G1 and G2.

Connecting conductive patterns TS may be provided at both sides of each of the gate electrodes G1 and G2. Each of the connecting conductive patterns TS may electrically connect the source/drain regions SD to each other. The source/drain regions SD are spaced apart from each other in the y-direction. A first interlayer insulating layer 110 may be provided on the substrate 100. The first interlayer insulating layer 110 may partially or completely cover the gate electrodes G1 and G2 and the connecting conductive patterns TS.

The plurality of first gate electrodes G1 may be defined as a first gate electrode group G1a. A connecting contact CC may be provided at the jumper region JR. The connecting contact CC may be in contact with top surfaces of the first gate electrodes G1 and may be connected to the source/drain regions SD provided at both sides of the first gate electrode group G1a. The connecting contact CC may also be connected to the source/drain regions SD provided between the first gate electrodes G1. The connecting contact CC may be electrically connected to the source/drain regions SD through the connecting conductive patterns TS provided at the both sides of the first gate electrode group G1a and the connecting conductive pattern TS provided between the first gate electrodes G1.

According to the present embodiment, the connecting contact CC may include first sub-contacts CA1 disposed at both sides of the first gate electrode group G1a and a second sub-contact CB1 connecting the first sub-contacts CA1 to each other. Accordingly, a first sub-contact CA1 may not be disposed between first gate electrodes G1.

The first sub-contacts CA1 may be spaced apart from the first gate electrodes G1. The second sub-contact CB1 may be in contact with the top surfaces of the first gate electrodes G1, and both ends of the second sub-contact CB1 may overlap with the first sub-contacts CA1, respectively. The first sub-contacts CA1 and the second sub-contact CB1 may include the same material and may be connected to each other to form a united body. When viewed from a plan view, each of the first sub-contacts CA1 may have a bar shape extending in the y-direction. The second sub-contact CB1 may have a bar shape extending in the x-direction.

Figure 21A:
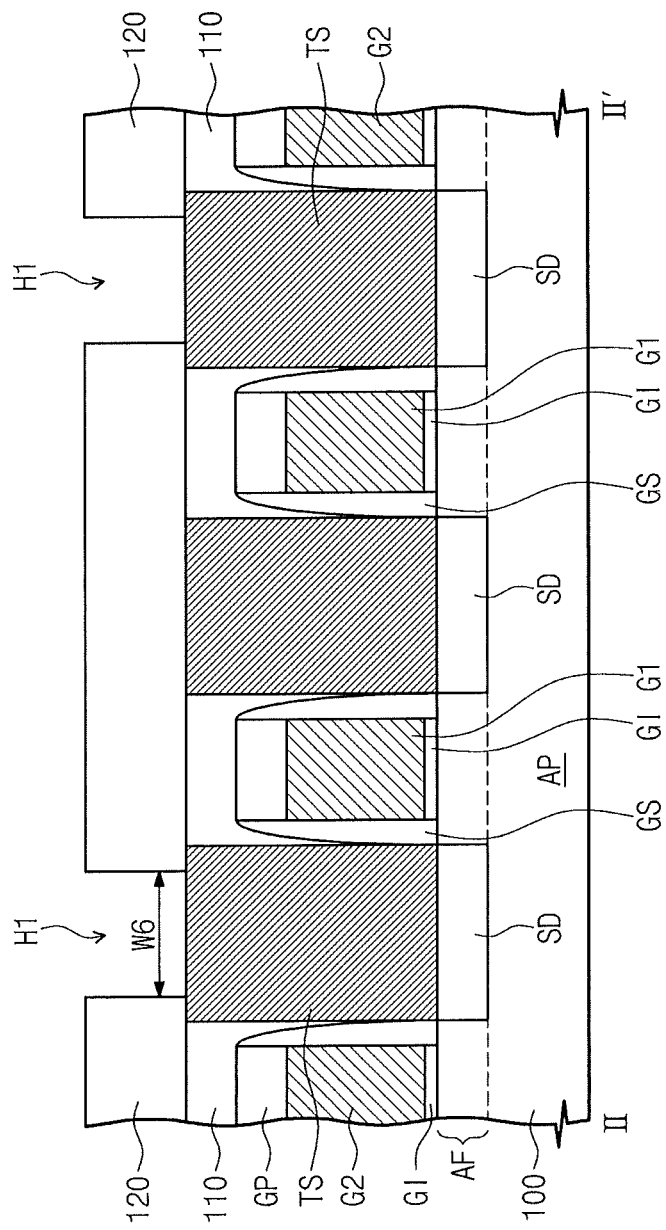
FIGS. 21A, 21B, and 22 are cross-sectional views corresponding to lines II-II' and IV-IV' of FIG. 19 that illustrate a method of manufacturing a semiconductor device according to another embodiment of the inventive concepts.
Figure 21B:
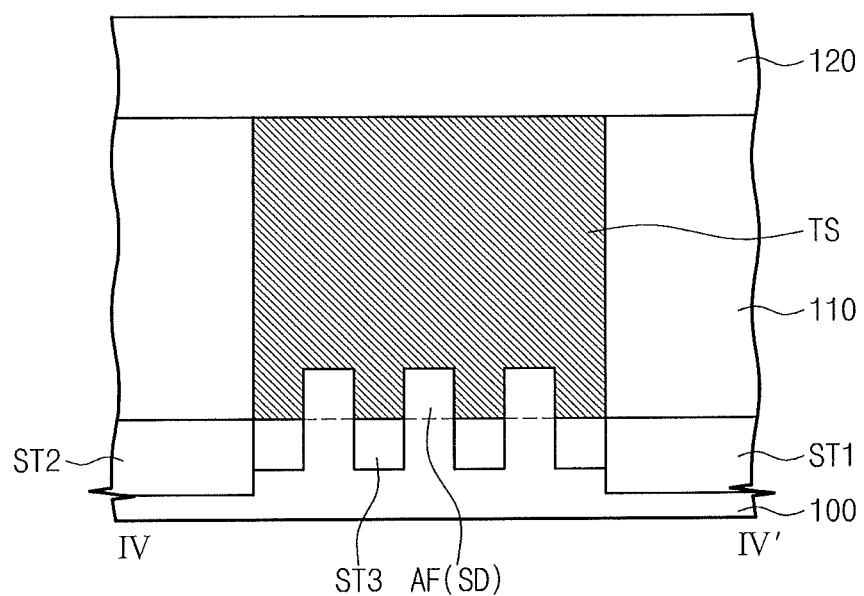
Figure 22:
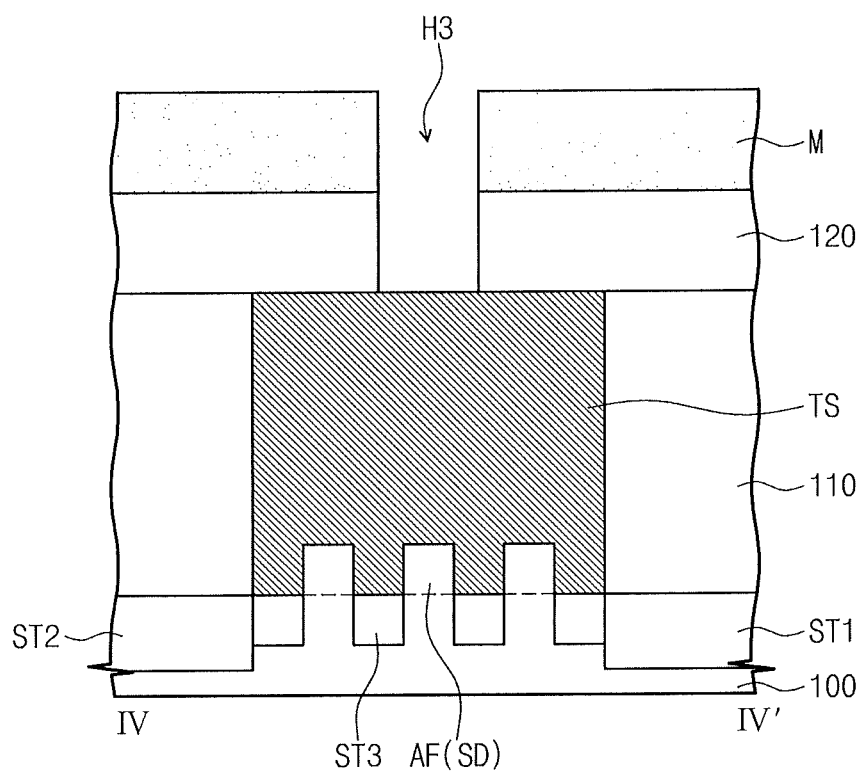

FIGS. 21A, 21B, and 22 are cross-sectional views corresponding to lines II-II' and IV-IV' of FIG. 19 that illustrate a method of manufacturing a semiconductor device according to another embodiment of the inventive concepts. In the manufacturing method according to the present embodiment, cross-sectional views corresponding to the lines I-I', III-III', V-V', and VI-VI' of FIG. 19 are the same or similar as those illustrated in FIGS. 7A to 7C and 8A to 8C. A cross-sectional view corresponding to the line II-II' of FIG. 19 is the same as that illustrated in FIG. 18. In the present embodiment, the same elements as described in the embodiment of FIGS. 6A to 6C, 7A to 7C, and 8A to 8C are indicated by the same reference numerals or the same reference designators, and the descriptions thereto are omitted or mentioned briefly for the purpose of ease and convenience in explanation.

Referring to FIGS. 19, 7A to 7C, 21A, and 21B, gate electrodes G1 and G2 may be formed on the substrate 100 to cross over the active patterns AP and to extend in the y-direction. The gate electrodes G1 and G2 may include a first gate electrode G1 disposed in a jumper region JR of a first logic cell C1 and a second gate electrode G2 at a circuit region CR of the first logic cell C1. According to the present embodiment, a plurality of first gate electrodes G1 may be provided at the jumper region JR. The plurality of first gate electrodes G1 and the second gate electrode G2 may be spaced apart from each other in the x-direction by a predetermined distance. Source/drain regions SD may be formed in the active regions AP at both sides of each of the gate electrodes G1 and G2. A first interlayer insulating layer 110 may be formed on the substrate 100 so as to partially or completely cover the gate electrodes G1 and G2. Connecting conductive patterns TS may be formed to penetrate the first interlayer insulating layer 110. A connecting conductive pattern TS may be directly or indirectly connected to each source/drain regions SD, respectively. A second interlayer insulating layer 120 may be formed on the substrate 100 having the connecting conductive patterns TS.

The plurality of first gate electrodes G1 may be collectively defined as a first gate electrode group G1a. The second interlayer insulating layer 120 at the jumper region JR may be patterned to form first sub-contact holes H1 which expose the connecting conductive patterns TS at both sides of the first gate electrode group G1a. In the present embodiment, the first sub-contact hole H1 may not be formed between the first gate electrodes G1, as illustrated in FIG. 21A.

The second interlayer insulating layer 120 of the circuit region CR may be patterned to form source/drain contact holes H2 which expose the connecting conductive patterns TS at both sides of the second gate electrode G2. The first sub-contact hoes H1 and the source/drain contact holes H2 may be formed at the same time or at similar times. Each of the first sub-contact hoes H1 may have a sixth width W6 corresponding to a distance between its inner sidewalls which are spaced apart from each other in the x-direction by a predetermined distance. Each of the source/drain contact holes H2 may have a seventh width W7 corresponding to a distance between its inner sidewalls which are spaced apart from each other in the x-direction by a predetermined distance. In some embodiments, the sixth width W6 may be substantially equal to the seventh width W7.

Referring to FIGS. 19, 8A to 8C, 18, and 22, a mask layer M may partially or completely fill the first sub-contact holes H1. The source/drain contact holes H2 may be formed on the second interlayer insulating layer 120. The mask layer M at the jumper region JR may be patterned to form a second sub-contact hole H3 thereby exposing the top surfaces of the first gate electrodes G1. When viewed from a plan view, the second sub-contact hole H3 may extend in the x-direction so as to be connected to the first sub-contact holes H1. Both ends of the second sub-contact hole H3 may overlap with the first sub-contact holes H1, respectively. The mask layer M of the circuit region CR may be patterned to form a gate contact hole H4 thereby exposing the top surface of the second gate electrode G2. The gate contact hole H4 may be spaced apart from the source/drain contact holes H2. The second sub-contact hole H3 and the gate contact hole H4 may be formed at the same time or at similar times.

The second sub-contact hole H3 may have an eighth width W8 corresponding to a distance between its inner sidewalls which are spaced apart from each other in the y-direction by a predetermined distance. The gate contact hole H4 may have a ninth width W9 that corresponds to a distance between its inner sidewalls which are spaced apart from each other in the y-direction by a predetermined distance. In some embodiments, the eighth width W8 may be substantially equal to the ninth width W9.

Subsequent processes may be the same as corresponding processes of the manufacturing method according to the embodiment described with reference to FIGS. 2, 3A, 3B, and 3C.

Figure 23:
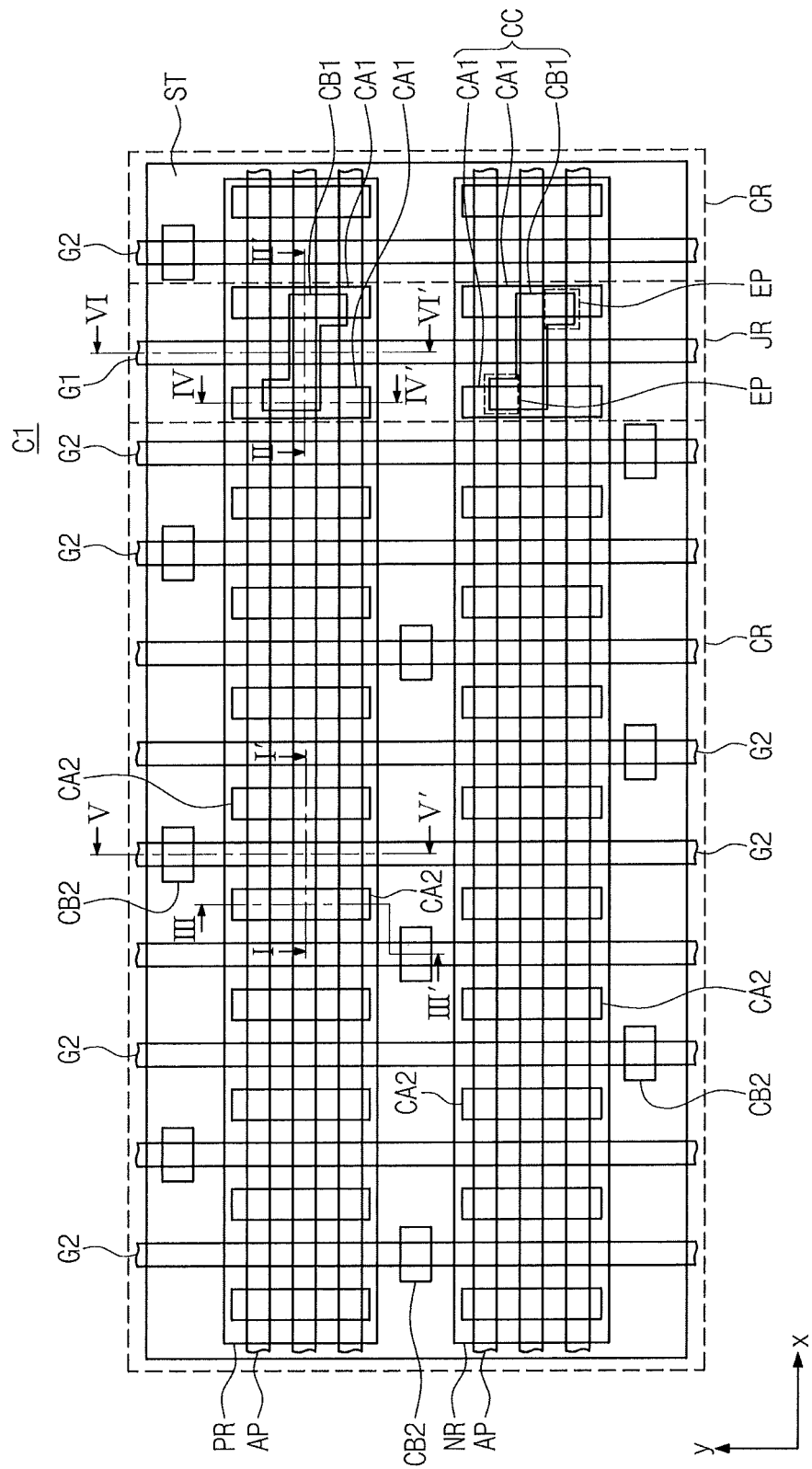
FIG. 23 is a plan view of a first logic cell of FIG. 1 that illustrates a semiconductor device according to another embodiment of the inventive concepts.
Figure 24:
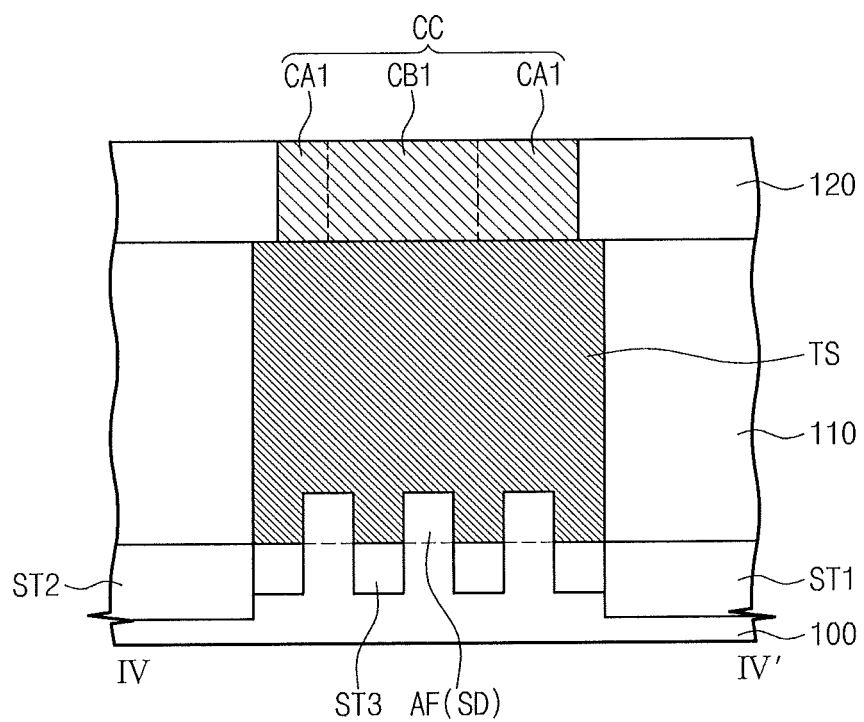
FIG. 24 is a cross-sectional view taken along a line IV-IV of FIG. 23.

FIG. 23 is a plan view of a first logic cell of FIG. 1 that illustrates a semiconductor device according to a fourth embodiment of the inventive concepts. FIG. 24 is a cross-sectional view taken along a line IV-IV of FIG. 23. Cross-sectional views taken along lines I-I', II-II', III-III', V-V', and VI-VI' of FIG. 23 are the same or similar as those illustrated in FIGS. 3A, 3B. In the present embodiment, the same elements as described in the embodiment of FIGS. 1, 2, 3A to 3C, 4, and 5 are indicated by the same reference numerals or the same reference designators, and the descriptions thereto are omitted or mentioned briefly for the purpose of ease and convenience in explanation.

Referring to FIGS. 23, 3A to 3C, and 24, active patterns AP extending in an x-direction and are arranged in a y-direction, and may be provided on a substrate 100. Gate electrodes G1 and G2 may cross over the active patterns AP and extend in the y-direction. The gate electrodes G1 and G2 may include a first gate electrode G1 at a jumper region JR and a second gate electrode G2 at a circuit region CR. The first gate electrode G1 and the second gate electrode G2 may be spaced apart from each other in the x-direction by a predetermined distance. Source/drain regions SD may be provided in the active patterns AP disposed at both sides each of the gate electrodes G1 and G2.

Connecting conductive patterns TS may be provided at both sides of each of the gate electrodes G1 and G2. Each of the connecting conductive patterns TS may electrically connect the source/drain regions SD, which are spaced apart from each other in the y-direction, to each other. A first interlayer insulating layer 110 may be provided on the substrate 100 to cover the gate electrodes G1 and G2 and the connecting conductive patterns TS.

A connecting contact CC may be provided at the jumper region JR. The connecting contact CC may be in direct or indirect contact with a top surface of the first gate electrode G1 and may be connected to the source/drain regions SD provided at both sides of the first gate electrode G1. The connecting contact CC may be electrically connected to the source/drain regions SD through the connecting conductive patterns TS provided at the both sides of the first gate electrode G1.

The connecting contact CC may include first sub-contacts CA1 at both sides of the first gate electrode G1 and a second sub-contact CB1 connecting the first sub-contacts CA1 to each other. When viewed from a plan view, the second sub-contact CB1 may extend in the x-direction to electrically connect the first sub-contacts CA1 to each other. The first sub-contacts CA1 may be connected to both ends of the second sub-contact CB1, respectively. According to the present embodiment, the second sub-contact CB1 may include extensions EP that extend from the both ends of the second sub-contact CB1 in the y-direction, respectively. The extensions EP may overlap with the first sub-contacts CA1 when viewed from a plan view. As described with reference to FIG. 4, the second sub-contact CB1 may have the second width W2 in the y-direction. According to the present embodiment, the second sub-contact CB1 having the extensions EP may permit a portion of the second sub-contact CB1 between the extensions EP to have the second width W2. Each end of the second sub-contact CB1 may have a width greater than the second width W2 in the y-direction. In other words, the width in the y-direction of the extension EP may be greater than the second width W2. As a result, the extensions EP permit contact areas of the second sub-contact CB1 and the first sub-contacts CA1 to increase. The connecting contact CC can therefore be easily formed.

Figure 25:
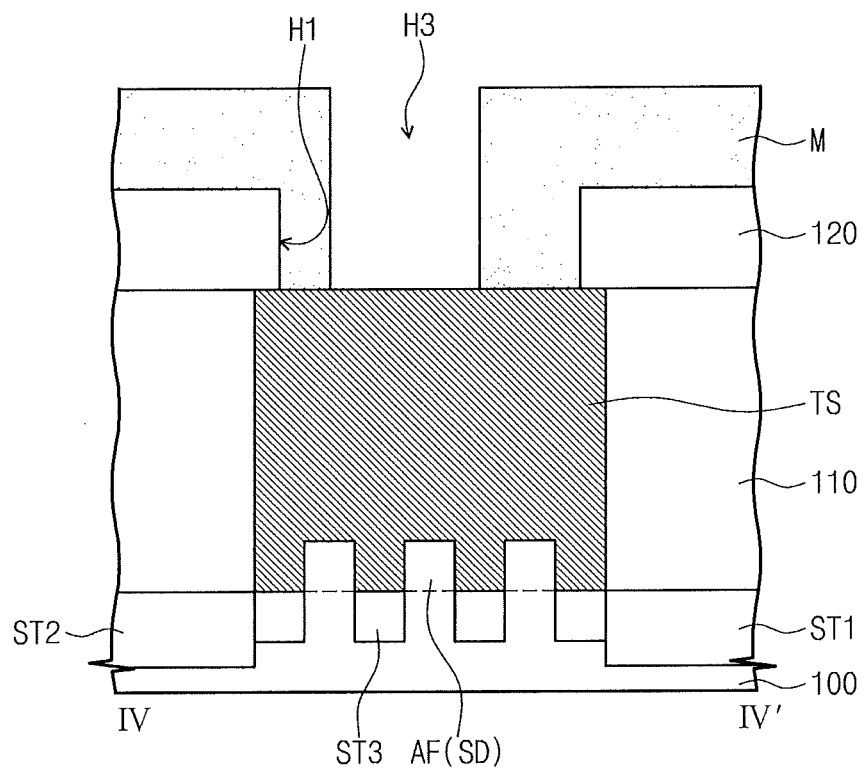
FIG. 25 is a cross-sectional view corresponding to a line IV-IV' of FIG. 23 that illustrates a method of manufacturing a semiconductor device according to anther embodiment of the inventive concepts.

FIG. 25 is a cross-sectional view corresponding to a line IV-IV' of FIG. 23 that illustrate a method of manufacturing a semiconductor device according to another embodiment of the inventive concepts. In the manufacturing method according to the present embodiment, cross-sectional views corresponding to the lines I-I', II-II', III-III', V-V', and VI-VI' of FIG. 23 are the same or similar as those illustrated in FIGS. 8A to 8C. In the present embodiment, the same elements as described in the embodiment of FIGS. 6A to 6C, 7A to 7C, and 8A to 8C are indicated by the same reference numerals or the same reference designators, and the descriptions thereto are omitted or mentioned briefly for the purpose of ease and convenience in explanation.

First, as described with reference to FIGS. 6A to 6C and 7A to 7C, the gate electrodes G1 and G2 may be formed on the substrate 100 to cross over the active patterns AP and to extend in the y-direction. The gate electrodes G1 and G2 may include the first gate electrode G1 at the jumper region JR of the first logic cell C1 and the second gate electrode G2 at the circuit region CR of the first logic cell C1. The source/drain regions SD may be formed in the active regions AP at both sides of each of the gate electrodes G1 and G2. The first interlayer insulating layer 110 may be formed on the substrate 100 to cover the gate electrodes G1 and G2. The connecting conductive patterns TS may penetrate the first interlayer insulating layer 110. The connecting conductive patterns TS may be directly or indirectly connected to the source/drain regions SD. The second interlayer insulating layer 120 may be formed on a portion of the substrate 100 at which the connecting conductive patterns TS are located.

The second interlayer insulating layer 120 at the jumper region JR may be patterned to form first sub-contact holes H1 which expose the connecting conductive patterns TS at both sides of the first gate electrode G1. The second interlayer insulating layer 120 at the circuit region CR may be patterned to form source/drain contact holes H2 which expose the connecting conductive patterns TS at both sides of the second gate electrode G2. The first sub-contact hoes H1 and the source/drain contact holes H2 may be formed at the same time or at similar times.

Referring to FIGS. 23, 8A to 8C, and 25, a mask layer M may partially or completely fill the first sub-contact holes H1. The source/drain contact holes H2 may be formed on the second interlayer insulating layer 120. A patterning process may be performed on the mask layer M at the jumper region JR to form a second sub-contact hole H3 exposing the top surfaces of the first gate electrodes G1. When viewed from a plan view, the second sub-contact hole H3 may extend in the x-direction so as to be connected to the first sub-contact holes H1. The first sub-contact holes H1 may be connected to both ends of the second sub-contact hole H2, respectively. According to the present embodiment, the both ends of the second sub-contact hole H3 may extend in the y-direction along the top surfaces of the connecting conductive patterns TS when viewed from a plan view.

A patterning process may be performed on the mask layer M to form a gate contact hole H4 exposing the top surface of the second gate electrode G2. The gate contact hole H4 may be spaced apart from the source/drain contact holes H2. The second sub-contact hole H3 and the gate contact hole H4 may be formed at the same time or at similar times.

Subsequent processes may be the same as corresponding processes of the manufacturing method according to the embodiment described with reference to FIGS. 2, 3A, 3B, and 3C.

The connecting contact CC, which functions as a jumper that connects adjacent logic circuits, can be formed to connect the first gate electrode G1 to the source/drain regions SD at both sides of the first gate electrode G1 at the jumper region JR. In this case, it is generally profitable that a size of the connecting contact CC is greater than those of the gate contact CB2 and the source/drain contacts CA2 provided at the circuit region CR. In addition, to optimize manufacturing processes of a semiconductor device, the connecting contact CC may be formed simultaneously with the source/drain contacts CA2 having a size or other dimension that is different from that of the connecting contact CC. In this case, a process margin of a patterning process for forming the connecting contact CC and the source/drain contacts CA2 having different sizes, dimensions, or the like may be reduced to cause a not-open phenomenon of the connecting contact CC.

According to embodiments of the inventive concepts, the connecting contact CC may include first sub-contacts CA1 provided at both sides of the first gate electrode G1 and the second sub-contact CB1, respectively. The second sub-contact CB1 may be in contact with the top surface of the first gate electrode G1 and may electrically connect the first sub-contacts CA1 to each other. The first sub-contacts CA1 may have a width (e.g., the width in the x-direction) which is substantially equal to that of the source/drain contacts CA2. The second sub-contact CB1 may have the width (e.g., the width in the y-direction) which is substantially equal to that of the gate contact CB2. Thus, it is possible to increase a process margin of the patterning process of forming the first sub-contacts CA1 and the source/drain contacts CA2 at the same time or at similar times and a process margin of the patterning process of the forming the second sub-contact CB1 and the gate contact CB2 at the same time or at similar times. This means that a not-open problem of the connecting contact CC may be minimized or prevented. As a result, the semiconductor device with excellent reliability may be easily manufactured.

Figure 26:
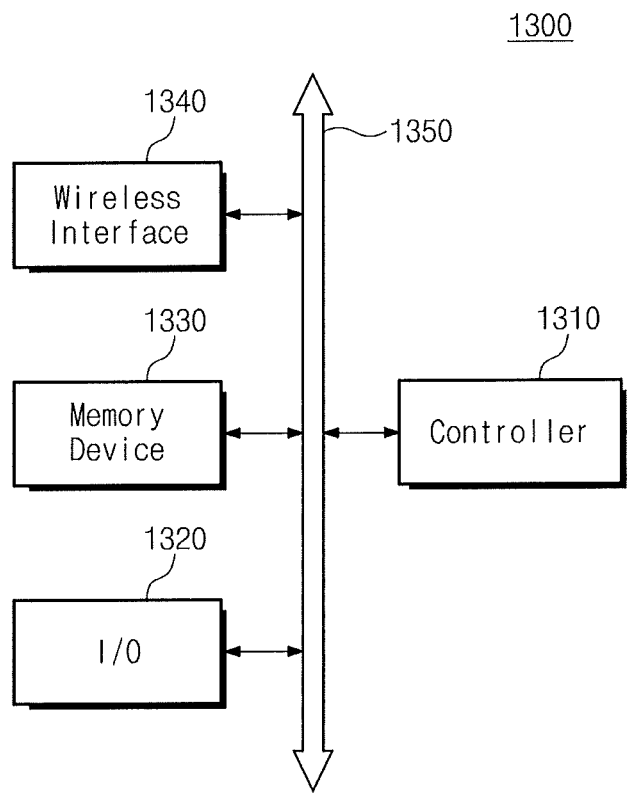
FIGS. 26 and 27 are schematic block diagrams illustrating electronic devices including semiconductor devices according to embodiments of the inventive concepts.
Figure 27:
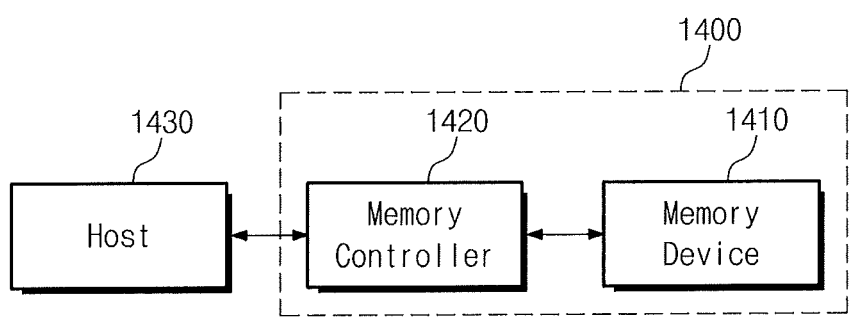

FIGS. 26 and 27 are schematic block diagrams illustrating electronic devices including semiconductor devices according to embodiments of the inventive concepts.

Referring to FIG. 26, an electronic device 1300 may include a semiconductor device according to the embodiments of the inventive concepts, and may include one of a personal digital assistant (PDA), a laptop computer, a portable computer, a web tablet, a wireless phone, a mobile phone, a digital music player, a cable/wireless electronic device, or any composite electronic device including at least two thereof. The electronic device 1300 may include a controller 1310, an input/output (I/O) unit 1320 (e.g., a keypad, a keyboard, or a display), a memory device 1330, and a wireless interface unit 1340 which are coupled to each other by a data bus 1350 or related transport device of electrical signals. The controller 1310 may include at least one of a microprocessor, a digital signal processor, a microcontroller, or another logic device having a similar function to any one thereof. The memory device 1330 may store, for example, commands to be executed by the controller 1310. Additionally, the memory device 1330 may store user data. The memory device 1330 may include at least one of the semiconductor devices in the aforementioned embodiments of the inventive concepts. The electronic device 1300 may transmit data to a wireless communication network using a radio frequency (RF) signal or receive data from the network by the wireless interface unit 1340. For example, the wireless interface unit 1340 may include antenna or a wireless transceiver. The electronic device 1300 may be used to realize a communication interface protocol of a communication system such as, but not limited to, CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 27, the semiconductor devices according to the embodiments of the inventive concepts may be used to realize a memory system. A memory system 1400 may include a memory device 1410 and a memory controller 1420 that are used for storing massive data. The memory controller 1420 may control the memory device 1410 to read/write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the semiconductor devices according to the above embodiments of the inventive concepts.

The semiconductor devices described in the aforementioned embodiments may be encapsulated using various packaging techniques. For example, the semiconductor devices according to the aforementioned embodiments may be encapsulated using any one or more of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor device according to one of the above embodiments is mounted may further include at least one semiconductor device (e.g., a controller and/or a logic device) that controls the semiconductor device.

In the semiconductor device according to embodiments of the inventive concepts, the connecting contact provided at the jumper region of the logic cell may include the first sub-contacts provided at both sides of the first gate electrode and the second sub-contact. The second sub-contact may be in contact with the top surface of the first gate electrode and may electrically connect the first sub-contacts to each other. The width in the x-direction of the first sub-contacts may be substantially equal to the width in the x-direction of the source/drain contacts provided in the circuit region of the logic cell, and the width in the y-direction of the second sub-contact may be substantially equal to the width in the y-direction of the gate contact provided in the circuit region. Thus, it is possible to increase a process margin of the patterning process that includes forming the first sub-contacts and the source/drain contacts at the same time or at similar times and the process margin of the patterning process of the forming the second sub-contact and the gate contact at the same time or at similar times. This means that the not-open problem of the connecting contact may be minimized or prevented. As a result, the semiconductor device with excellent reliability may be easily manufactured.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A semiconductor device comprising:
a substrate;
a gate electrode on the substrate, the gate electrode extending in a first direction;
source/drain regions at both sides of the gate electrode; and a connecting contact that electrically connects the gate electrode and the source/drain regions to each other, wherein the connecting contact comprises:

first sub-contacts at both sides of the gate electrode, the first sub-contacts connected to the source/drain regions; and a second sub-contact extending in a second direction, the second direction intersecting the first direction when viewed from a plan view, the second sub-contact connected to the first sub-contacts, the second sub-contact in contact with a top surface of the gate electrode, wherein each of the first sub-contacts has a first width in the first direction, wherein the second sub-contact has a second width in the first direction, and wherein the second width is smaller than the first width.

2. The semiconductor device of claim 1, wherein top surfaces of the first sub-contacts are at a same level as that of a top surface of the second sub-contact from the substrate.

3. The semiconductor device of claim 1, wherein bottom surfaces of the first sub-contacts are at a level lower than that of the top surface of the gate electrode from the substrate.

4. The semiconductor device of claim 1, further comprising gate spacers at both sides of the gate electrode, the gate spacers disposed between the gate electrode and the first sub-contacts.

5. The semiconductor device of claim 1, wherein the first sub-contacts and the second sub-contact include a same material and are connected to each other to form a united body.

6. The semiconductor device of claim 1, wherein each of the first sub-contacts has a bar shape that extends in the first direction, and wherein the second sub-contact has a bar shape that extends in the second direction.

7. A semiconductor device comprising:

a substrate;

a gate electrode on the substrate, the gate electrode extending in a first direction;

source/drain regions at both sides of the gate electrode; and a connecting contact that connects the gate electrode and the source/drain regions to each other, wherein the connecting contact comprises:

first sub-contacts at both sides of the gate electrode, the first sub-contacts connected directly to the source/drain regions; and a second sub-contact extending in a second direction, the second sub-contact crossing the gate electrode when viewed from a plan view, the second sub-contact connected to the first sub-contacts, the second sub-contact in contact with a top surface of the gate electrode, wherein each of the first sub-contacts has a first width in the first direction, wherein the second sub-contact has a second width in the first direction, and wherein the second width is smaller than the first width.

8. The semiconductor device of claim 7, wherein each of the first sub-contacts has a bar shape that extends in the first direction, and wherein the second sub-contact has a bar shape that extends in the second direction.

9. The semiconductor device of claim 8, wherein the first sub-contacts and the second sub-contact are connected to each other to form a united body.

10. The semiconductor device of claim 8, wherein a bottom surface of the second sub-contact is in contact with the top surface of the gate electrode, and bottom surfaces of the first sub-contacts are at a level lower than that of the top surface of the gate electrode from the substrate.

11. The semiconductor device of claim 8, wherein top surfaces of the first sub-contacts are at a same level as that of a top surface of the second sub-contact from the substrate.

12. The semiconductor device of claim 7, further comprising gate spacers at both sides of the gate electrode, each of the gate spacers disposed between the gate electrode and a corresponding one of the first sub-contacts.

13. A semiconductor device comprising:

a substrate;

an active pattern protruding upwardly from the substrate;

a gate electrode crossing the active pattern on the substrate, the gate electrode extending in a first direction and covering upper sidewalls of the active pattern;

source/drain regions at both sides of the gate electrode; and a connecting contact that electrically connects the gate electrode and the source/drain regions to each other, wherein the connecting contact comprises:

first sub-contacts at both sides of the gate electrode, the first sub-contacts connected to the source/drain regions, respectively; and a second sub-contact extending in a second direction, the second sub-contact crossing the gate electrode when viewed from a plan view, the second sub-contact connected to the first sub-contacts, the second sub-contact in contact with a top surface of the gate electrode, wherein each of the first sub-contacts has a first width in the first direction, wherein the second sub-contact has a second width in the first direction, and wherein the second width is smaller than the first width.

14. The semiconductor device of claim 13, further comprising device isolation layers at both sides of the active pattern on the substrate, the device isolation layers and the active pattern extending in the second direction, the device isolation layers exposing the upper sidewalls of the active pattern.

15. The semiconductor device of claim 14, wherein top surfaces of the device isolation layers is at a level lower than that of a top surface of the active pattern from the substrate.

16. The semiconductor device of claim 15, wherein the gate electrode extends in the first direction to cover the top surface and the upper sidewalls of the active pattern and the top surfaces of the device isolation layers.

17. The semiconductor device of claim 13, wherein each of the first sub-contacts has a bar shape that extends in the first direction.

18. The semiconductor device of claim 17, wherein the first sub-contacts and the second sub-contact are connected to each other to form a united body.

19. The semiconductor device of claim 17, wherein top surfaces of the first sub-contacts are at a same level as that of a top surface of the second sub-contact from the substrate, and wherein bottom surfaces of the first sub-contacts are at a level lower than that of the top surface of the gate electrode from the substrate.

20. The semiconductor device of claim 17, further comprising gate spacers at both sides of the gate electrode and extending in the first direction, each of the gate spacers disposed between the gate electrode and a corresponding one of the first sub-contacts.

* * * * *